US007850779B2

(12) United States Patent
Ma et al.

(10) Patent No.: US 7,850,779 B2
(45) Date of Patent: *Dec. 14, 2010

(54) APPARATUS AND PROCESS FOR PLASMA-ENHANCED ATOMIC LAYER DEPOSITION

(75) Inventors: Paul Ma, Sunnyvale, CA (US); Kavita Shah, Sunnyvale, CA (US); Dien-Yeh Wu, San Jose, CA (US); Seshadri Ganguli, Sunnyvale, CA (US); Christophe Marcadal, Santa Clara, CA (US); Frederick C. Wu, Cupertino, CA (US); Schubert S. Chu, San Francisco, CA (US)

(73) Assignee: Applied Materisals, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/556,758

(22) Filed: Nov. 6, 2006

(65) Prior Publication Data
US 2007/0128863 A1 Jun. 7, 2007

Related U.S. Application Data

(60) Provisional application No. 60/733,870, filed on Nov. 4, 2005, provisional application No. 60/733,655, filed on Nov. 4, 2005, provisional application No. 60/733,654, filed on Nov. 4, 2005, provisional application No. 60/733,574, filed on Nov. 4, 2005, provisional application No. 60/733,869, filed on Nov. 4, 2005.

(51) Int. Cl.
C23C 16/452 (2006.01)
H01L 21/306 (2006.01)

(52) U.S. Cl. .............. 118/715; 156/345.33; 156/345.34

(58) Field of Classification Search ................. 118/715; 156/345.33, 345.34
See application file for complete search history.

(56) References Cited

U.S. PATENT DOCUMENTS 4,058,430 A  11/1977  Suntola et al.

(Continued)

FOREIGN PATENT DOCUMENTS

EP  0 497 267  1/1992

(Continued)

OTHER PUBLICATIONS

Office Action dated Dec. 24, 2009 and Search Report for Taiwan Patent Application No. 95141036.

(Continued)

*Primary Examiner*—Ram N Kackar
*Assistant Examiner*—Satish Chandra
(74) *Attorney, Agent, or Firm*—Patterson & Sheridan, LLP

(57) ABSTRACT

Embodiments of the invention provide an apparatus configured to form a material during an atomic layer deposition (ALD) process, such as a plasma-enhanced ALD (PE-ALD) process. In one embodiment, a lid assembly for conducting a vapor deposition process within a process chamber is provided which includes an insulation cap and a plasma screen. In one example, the insulation cap has a centralized channel configured to flow a first process gas from an upper surface to an expanded channel and an outer channel configured to flow a second process gas from an upper surface to a groove which is encircling the expanded channel. In one example, the plasma screen has an upper surface containing an inner area with a plurality of holes and an outer area with a plurality of slots. The insulation cap may be positioned on top of the plasma screen to form a centralized gas region with the expanded channel and a circular gas region with the groove.

6 Claims, 29 Drawing Sheets

U.S. PATENT DOCUMENTS

| | | | |
|---|---|---|---|
| 4,389,973 A | 6/1983 | Suntola et al. | |
| 4,413,022 A | 11/1983 | Suntola et al. | |
| 4,415,275 A | 11/1983 | Dietrich | |
| 4,486,487 A | 12/1984 | Skarp | |
| 4,761,269 A | 8/1988 | Conger et al. | |
| 4,834,831 A | 5/1989 | Nishizawa et al. | |
| 4,892,751 A | 1/1990 | Miyake et al. | |
| 4,975,252 A | 12/1990 | Nishizawa et al. | |
| 4,993,357 A | 2/1991 | Scholz | |
| 5,027,746 A | 7/1991 | Frijlink | |
| 5,028,565 A | 7/1991 | Chang et al. | |
| 5,173,327 A | 12/1992 | Sandhu et al. | |
| 5,178,681 A | 1/1993 | Moore et al. | |
| 5,225,366 A | 7/1993 | Yoder | |
| 5,261,959 A | 11/1993 | Gasworth | |
| 5,281,274 A | 1/1994 | Yoder | |
| 5,294,286 A | 3/1994 | Nishizawa et al. | |
| 5,306,666 A | 4/1994 | Izumi | |
| 5,338,362 A | 8/1994 | Imahashi | |
| 5,372,849 A | 12/1994 | McCormick et al. | |
| 5,374,570 A | 12/1994 | Nasu et al. | |
| 5,441,703 A | 8/1995 | Jurgensen | |
| 5,443,647 A | 8/1995 | Aucoin et al. | |
| 5,480,818 A | 1/1996 | Matsumoto et al. | |
| 5,483,919 A | 1/1996 | Yokoyama et al. | |
| 5,503,875 A | 4/1996 | Imai et al. | |
| 5,558,717 A | 9/1996 | Zhao et al. | |
| 5,589,002 A * | 12/1996 | Su | 118/723 E |
| 5,660,744 A | 8/1997 | Sekine et al. | |
| 5,674,786 A | 10/1997 | Turner et al. | |
| 5,711,811 A | 1/1998 | Suntola et al. | |
| 5,730,802 A | 3/1998 | Ishizumi et al. | |
| 5,796,116 A | 8/1998 | Nakata et al. | |
| 5,804,488 A | 9/1998 | Shih et al. | |
| 5,807,792 A | 9/1998 | Ilg et al. | |
| 5,834,372 A | 11/1998 | Lee | |
| 5,835,677 A | 11/1998 | Li et al. | |
| 5,846,332 A | 12/1998 | Zhao et al. | |
| 5,855,680 A | 1/1999 | Soininen et al. | |
| 5,879,459 A | 3/1999 | Gadgil et al. | |
| 5,882,411 A | 3/1999 | Zhao et al. | |
| 5,906,683 A | 5/1999 | Chen et al. | |
| 5,916,365 A | 6/1999 | Sherman | |
| 5,923,056 A | 7/1999 | Lee et al. | |
| 5,962,716 A | 10/1999 | Uhlenbrock et al. | |
| 5,972,430 A | 10/1999 | DiMeo, Jr. et al. | |
| 6,001,420 A | 12/1999 | Mosely et al. | |
| 6,015,590 A | 1/2000 | Suntola et al. | |
| 6,015,917 A | 1/2000 | Bhandari et al. | |
| 6,042,652 A | 3/2000 | Hyun et al. | |
| 6,059,885 A * | 5/2000 | Ohashi et al. | 118/730 |
| 6,063,705 A | 5/2000 | Vaartstra | |
| 6,071,572 A | 6/2000 | Mosely et al. | |
| 6,074,945 A | 6/2000 | Vaartstra et al. | |
| 6,079,356 A | 6/2000 | Umotoy et al. | |
| 6,084,302 A | 7/2000 | Sandhu | |
| 6,099,904 A | 8/2000 | Mak et al. | |
| 6,114,557 A | 9/2000 | Uhlenbrock et al. | |
| 6,124,158 A | 9/2000 | Dautartas et al. | |
| 6,139,700 A | 10/2000 | Kang et al. | |
| 6,140,215 A * | 10/2000 | Foster et al. | 438/580 |
| 6,143,082 A | 11/2000 | McInerney et al. | |
| 6,144,060 A | 11/2000 | Park et al. | |
| 6,156,382 A | 12/2000 | Rajagopalan et al. | |
| 6,162,715 A | 12/2000 | Mak et al. | |
| 6,174,377 B1 | 1/2001 | Doering et al. | |
| 6,174,809 B1 | 1/2001 | Kang et al. | |
| 6,183,563 B1 | 2/2001 | Choi et al. | |
| 6,197,683 B1 | 3/2001 | Kang et al. | |
| 6,200,893 B1 | 3/2001 | Sneh | |
| 6,203,613 B1 | 3/2001 | Gates et al. | |
| 6,206,967 B1 | 3/2001 | Mak et al. | |
| 6,207,302 B1 | 3/2001 | Sugiura et al. | |
| 6,207,487 B1 | 3/2001 | Kim et al. | |
| 6,218,298 B1 | 4/2001 | Hoinkis | |
| 6,231,672 B1 | 5/2001 | Choi et al. | |
| 6,245,192 B1 | 6/2001 | Dhindsa et al. | |
| 6,251,190 B1 | 6/2001 | Mak et al. | |
| 6,270,572 B1 | 8/2001 | Kim et al. | |
| 6,274,484 B1 | 8/2001 | Tsai et al. | |
| 6,284,646 B1 | 9/2001 | Leem | |
| 6,287,965 B1 | 9/2001 | Kang et al. | |
| 6,302,965 B1 * | 10/2001 | Umotoy et al. | 118/715 |
| 6,305,314 B1 | 10/2001 | Sneh et al. | |
| 6,306,216 B1 | 10/2001 | Kim et al. | |
| 6,309,713 B1 | 10/2001 | Mak et al. | |
| 6,326,297 B1 | 12/2001 | Vijayendran | |
| 6,333,260 B1 | 12/2001 | Kwon et al. | |
| 6,335,280 B1 | 1/2002 | van der Jeugd | |
| 6,338,991 B1 | 1/2002 | Zhang et al. | |
| 6,342,277 B1 | 1/2002 | Sherman | |
| 6,346,477 B1 | 2/2002 | Kaloyeros et al. | |
| 6,348,376 B2 | 2/2002 | Lim et al. | |
| 6,355,561 B1 | 3/2002 | Sandhu et al. | |
| 6,358,829 B2 | 3/2002 | Yoon et al. | |
| 6,365,502 B1 | 4/2002 | Paranjpe et al. | |
| 6,368,954 B1 | 4/2002 | Lopatin et al. | |
| 6,369,430 B1 | 4/2002 | Adetutu et al. | |
| 6,372,598 B2 | 4/2002 | Kang et al. | |
| 6,379,748 B1 | 4/2002 | Bhandari et al. | |
| 6,391,785 B1 | 5/2002 | Satta et al. | |
| 6,399,491 B2 | 6/2002 | Jeon et al. | |
| 6,416,577 B1 | 7/2002 | Suntola et al. | |
| 6,416,822 B1 | 7/2002 | Chiang et al. | |
| 6,420,189 B1 | 7/2002 | Lopatin | |
| 6,423,619 B1 | 7/2002 | Grant et al. | |
| 6,428,859 B1 | 8/2002 | Chiang et al. | |
| 6,432,259 B1 | 8/2002 | Noorbakhsh et al. | |
| 6,432,831 B2 | 8/2002 | Dhindsa et al. | |
| 6,433,314 B1 | 8/2002 | Mandrekar et al. | |
| 6,440,495 B1 | 8/2002 | Wade et al. | |
| 6,447,607 B2 | 9/2002 | Soininen et al. | |
| 6,447,933 B1 | 9/2002 | Wang et al. | |
| 6,451,119 B2 | 9/2002 | Sneh et al. | |
| 6,451,695 B2 | 9/2002 | Sneh | |
| 6,454,860 B2 | 9/2002 | Metzner et al. | |
| 6,458,701 B1 | 10/2002 | Chae et al. | |
| 6,462,367 B2 | 10/2002 | Marsh et al. | |
| 6,468,924 B2 | 10/2002 | Lee et al. | |
| 6,475,276 B1 | 11/2002 | Elers et al. | |
| 6,475,910 B1 | 11/2002 | Sneh | |
| 6,478,872 B1 | 11/2002 | Chae et al. | |
| 6,479,100 B2 | 11/2002 | Jin et al. | |
| 6,481,945 B1 | 11/2002 | Hasper et al. | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,495,233 B1 | 12/2002 | Shmurun et al. | |
| 6,498,091 B1 | 12/2002 | Chen et al. | |
| 6,511,539 B1 | 1/2003 | Raaijmakers | |
| 6,517,616 B2 | 2/2003 | Marsh et al. | |
| 6,524,952 B1 | 2/2003 | Srinivas et al. | |
| 6,527,855 B2 | 3/2003 | De la Rosa et al. | |
| 6,534,395 B2 | 3/2003 | Werkhoven et al. | |
| 6,534,404 B1 | 3/2003 | Danek et al. | |
| 6,541,067 B1 | 4/2003 | Marsh et al. | |
| 6,548,112 B1 | 4/2003 | Hillman et al. | |
| 6,548,424 B2 | 4/2003 | Putkonen | |
| 6,551,406 B2 | 4/2003 | Kilpi | |
| 6,551,929 B1 | 4/2003 | Kori et al. | |
| 6,558,509 B2 | 5/2003 | Kraus et al. | |
| 6,561,498 B2 | 5/2003 | Tompkins et al. | |
| 6,569,501 B2 | 5/2003 | Chiang et al. | |
| 6,572,705 B1 | 6/2003 | Suntola et al. | |

| | | |
|---|---|---|
| 6,576,778 B1 | 6/2003 | Uhlenbrock et al. |
| 6,578,287 B2 | 6/2003 | Aswad |
| 6,579,372 B2 | 6/2003 | Park |
| 6,580,111 B2 | 6/2003 | Kim et al. |
| 6,585,823 B1 | 7/2003 | Van Wijck |
| 6,593,484 B2 | 7/2003 | Yasuhara et al. |
| 6,596,602 B2 | 7/2003 | Iizuka et al. |
| 6,596,643 B2 | 7/2003 | Chen et al. |
| 6,599,572 B2 | 7/2003 | Saanila et al. |
| 6,605,735 B2 | 8/2003 | Kawano et al. |
| 6,607,976 B2 | 8/2003 | Chen et al. |
| 6,610,568 B2 | 8/2003 | Marsh et al. |
| 6,617,634 B2 | 9/2003 | Marsh et al. |
| 6,620,723 B1 | 9/2003 | Byun et al. |
| 6,627,995 B2 | 9/2003 | Paranjpe et al. |
| 6,630,030 B1 | 10/2003 | Suntola et al. |
| 6,630,201 B2 | 10/2003 | Chiang et al. |
| 6,632,279 B1 | 10/2003 | Ritala et al. |
| 6,635,965 B1 | 10/2003 | Lee et al. |
| 6,645,303 B2 * | 11/2003 | Frankel et al. ............ 118/725 |
| 6,660,126 B2 | 12/2003 | Nguyen et al. |
| 6,660,622 B2 | 12/2003 | Chen et al. |
| 6,686,271 B2 | 2/2004 | Raaijmakers et al. |
| 6,713,373 B1 | 3/2004 | Omstead |
| 6,716,287 B1 | 4/2004 | Santiago et al. |
| 6,718,126 B2 | 4/2004 | Lei |
| 6,720,027 B2 | 4/2004 | Yang et al. |
| 6,734,020 B2 | 5/2004 | Lu et al. |
| 6,737,317 B2 | 5/2004 | Marsh et al. |
| 6,740,585 B2 | 5/2004 | Yoon et al. |
| 6,743,739 B2 | 6/2004 | Shimamoto et al. |
| 6,772,072 B2 | 8/2004 | Ganguli et al. |
| 6,773,507 B2 | 8/2004 | Jallepally et al. |
| 6,774,138 B2 | 8/2004 | Cosford et al. |
| 6,777,352 B2 | 8/2004 | Tepman et al. |
| 6,778,762 B1 | 8/2004 | Shareef et al. |
| 6,780,758 B1 | 8/2004 | Derderian et al. |
| 6,784,096 B2 | 8/2004 | Chen et al. |
| 6,790,773 B1 | 9/2004 | Drewery et al. |
| 6,793,733 B2 * | 9/2004 | Janakiraman et al. ....... 118/715 |
| 6,797,108 B2 | 9/2004 | Wendling |
| 6,797,340 B2 | 9/2004 | Fang et al. |
| 6,800,173 B2 | 10/2004 | Chiang et al. |
| 6,800,542 B2 | 10/2004 | Kim |
| 6,800,937 B2 | 10/2004 | Marsh et al. |
| 6,803,272 B1 | 10/2004 | Halliyal et al. |
| 6,809,026 B2 | 10/2004 | Yoon et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,827,815 B2 | 12/2004 | Hytros et al. |
| 6,827,978 B2 | 12/2004 | Yoon et al. |
| 6,831,004 B2 | 12/2004 | Byun et al. |
| 6,833,161 B2 | 12/2004 | Wang et al. |
| 6,838,125 B2 | 1/2005 | Chung et al. |
| 6,841,200 B2 | 1/2005 | Kraus et al. |
| 6,846,516 B2 | 1/2005 | Yang et al. |
| 6,849,545 B2 | 2/2005 | Mak et al. |
| 6,855,368 B1 | 2/2005 | Kori et al. |
| 6,866,746 B2 | 3/2005 | Lei et al. |
| 6,868,859 B2 | 3/2005 | Yudovsky |
| 6,872,258 B2 | 3/2005 | Park et al. |
| 6,875,271 B2 | 4/2005 | Glenn et al. |
| 6,878,206 B2 | 4/2005 | Tzu et al. |
| 6,881,437 B2 | 4/2005 | Ivanov et al. |
| 6,887,795 B2 | 5/2005 | Soininen et al. |
| 6,893,915 B2 | 5/2005 | Park et al. |
| 6,902,624 B2 | 6/2005 | Seidel et al. |
| 6,905,541 B2 | 6/2005 | Chen et al. |
| 6,905,737 B2 | 6/2005 | Verplancken et al. |
| 6,911,093 B2 | 6/2005 | Stacey et al. |
| 6,911,391 B2 | 6/2005 | Yang et al. |
| 6,915,592 B2 | 7/2005 | Guenther |
| 6,916,398 B2 | 7/2005 | Chen et al. |
| 6,921,062 B2 | 7/2005 | Gregg et al. |
| 6,932,871 B2 | 8/2005 | Chang et al. |
| 6,936,538 B2 | 8/2005 | Byun |
| 6,936,906 B2 | 8/2005 | Chung et al. |
| 6,939,801 B2 | 9/2005 | Chung et al. |
| 6,939,804 B2 | 9/2005 | Lai et al. |
| 6,946,033 B2 | 9/2005 | Tsuei et al. |
| 6,951,804 B2 | 10/2005 | Seutter et al. |
| 6,953,742 B2 | 10/2005 | Chen et al. |
| 6,955,211 B2 | 10/2005 | Ku et al. |
| 6,958,174 B1 | 10/2005 | Klaus et al. |
| 6,958,296 B2 | 10/2005 | Chen et al. |
| 6,972,267 B2 | 12/2005 | Cao et al. |
| 6,974,771 B2 | 12/2005 | Chen et al. |
| 6,983,892 B2 | 1/2006 | Noorbakhsh et al. |
| 6,994,319 B2 | 2/2006 | Yudovsky |
| 6,998,014 B2 | 2/2006 | Chen et al. |
| 7,005,372 B2 | 2/2006 | Levy et al. |
| 7,026,238 B2 | 4/2006 | Xi et al. |
| 7,033,922 B2 | 4/2006 | Kori et al. |
| 7,041,335 B2 | 5/2006 | Chung |
| 7,049,226 B2 | 5/2006 | Chung et al. |
| 7,066,194 B2 | 6/2006 | Ku et al. |
| 7,081,271 B2 | 7/2006 | Chung et al. |
| 7,085,616 B2 | 8/2006 | Chin et al. |
| 7,094,680 B2 | 8/2006 | Seutter et al. |
| 7,094,685 B2 | 8/2006 | Yang et al. |
| 7,101,795 B1 | 9/2006 | Xi et al. |
| 7,115,494 B2 | 10/2006 | Sinha et al. |
| 7,115,499 B2 | 10/2006 | Wang et al. |
| 7,141,494 B2 | 11/2006 | Lee et al. |
| 7,175,713 B2 | 2/2007 | Thakur et al. |
| 7,186,385 B2 | 3/2007 | Ganguli et al. |
| 7,201,803 B2 | 4/2007 | Lu et al. |
| 7,204,886 B2 | 4/2007 | Chen et al. |
| 7,208,413 B2 | 4/2007 | Byun et al. |
| 7,211,144 B2 | 5/2007 | Lu et al. |
| 7,211,508 B2 | 5/2007 | Chung et al. |
| 7,220,673 B2 | 5/2007 | Xi et al. |
| 7,222,636 B2 | 5/2007 | Nguyen et al. |
| 7,228,873 B2 | 6/2007 | Ku et al. |
| 2001/0000866 A1 | 5/2001 | Sneh et al. |
| 2001/0002280 A1 | 5/2001 | Sneh |
| 2001/0006838 A1 | 7/2001 | Won et al. |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0029094 A1 | 10/2001 | Mee-Young et al. |
| 2001/0034123 A1 | 10/2001 | Jeon et al. |
| 2001/0041250 A1 | 11/2001 | Werkhoven |
| 2001/0042523 A1 | 11/2001 | Kesala |
| 2001/0042799 A1 | 11/2001 | Kim et al. |
| 2001/0050039 A1 | 12/2001 | Park |
| 2001/0054377 A1 | 12/2001 | Lindfors et al. |
| 2001/0054730 A1 | 12/2001 | Kim et al. |
| 2001/0054769 A1 | 12/2001 | Raaijmakers et al. |
| 2002/0000196 A1 | 1/2002 | Park |
| 2002/0000598 A1 | 1/2002 | Kang et al. |
| 2002/0004293 A1 | 1/2002 | Soininen et al. |
| 2002/0005168 A1 | 1/2002 | Kraus et al. |
| 2002/0007790 A1 | 1/2002 | Park |
| 2002/0009544 A1 | 1/2002 | McFeely et al. |
| 2002/0009896 A1 | 1/2002 | Sandhu et al. |
| 2002/0017242 A1 | 2/2002 | Hamaguchi et al. |
| 2002/0019121 A1 | 2/2002 | Pyo |
| 2002/0020869 A1 | 2/2002 | Park et al. |
| 2002/0021544 A1 | 2/2002 | Cho et al. |

| | | | | | | |
|---|---|---|---|---|---|---|
| 2002/0025627 A1 | 2/2002 | Marsh et al. | 2003/0038369 A1 | 2/2003 | Layadi et al. | |
| 2002/0028556 A1 | 3/2002 | Marsh et al. | 2003/0042630 A1 | 3/2003 | Babcoke et al. | |
| 2002/0031618 A1 | 3/2002 | Sherman | 2003/0049931 A1 | 3/2003 | Byun et al. | |
| 2002/0037630 A1 | 3/2002 | Agarwal et al. | 2003/0049942 A1 | 3/2003 | Haukka et al. | |
| 2002/0041931 A1 | 4/2002 | Suntola et al. | 2003/0053799 A1 | 3/2003 | Lei | |
| 2002/0048635 A1 | 4/2002 | Kim et al. | 2003/0054631 A1 | 3/2003 | Raaijmakers et al. | |
| 2002/0048880 A1 | 4/2002 | Lee | 2003/0057526 A1 | 3/2003 | Chung et al. | |
| 2002/0052097 A1 | 5/2002 | Park | 2003/0057527 A1 | 3/2003 | Chung et al. | |
| 2002/0055235 A1 | 5/2002 | Agarwal et al. | 2003/0059538 A1 | 3/2003 | Chung et al. | |
| 2002/0060363 A1 | 5/2002 | Xi et al. | 2003/0072884 A1 | 4/2003 | Zhang et al. | |
| 2002/0061612 A1 | 5/2002 | Sandhu et al. | 2003/0072913 A1 | 4/2003 | Chou et al. | |
| 2002/0066411 A1 | 6/2002 | Chiang et al. | 2003/0072975 A1 | 4/2003 | Shero et al. | |
| 2002/0068458 A1 | 6/2002 | Chiang et al. | 2003/0075273 A1 | 4/2003 | Kilpela et al. | |
| 2002/0073924 A1 | 6/2002 | Chiang et al. | 2003/0075925 A1 | 4/2003 | Lindfors et al. | |
| 2002/0074577 A1 | 6/2002 | Marsh et al. | 2003/0079686 A1 | 5/2003 | Chen et al. | |
| 2002/0074588 A1 | 6/2002 | Lee et al. | 2003/0082296 A1 | 5/2003 | Elers et al. | |
| 2002/0076481 A1 | 6/2002 | Chiang et al. | 2003/0082300 A1 | 5/2003 | Todd et al. | |
| 2002/0076507 A1 | 6/2002 | Chiang et al. | 2003/0082301 A1 | 5/2003 | Chen et al. | |
| 2002/0076508 A1 | 6/2002 | Chiang et al. | 2003/0082307 A1 | 5/2003 | Chung et al. | |
| 2002/0076837 A1 | 6/2002 | Hujanen et al. | 2003/0087520 A1 | 5/2003 | Chen et al. | |
| 2002/0076881 A1 | 6/2002 | Marsh et al. | 2003/0089308 A1 | 5/2003 | Raajimakers | |
| 2002/0081381 A1 | 6/2002 | De la Rosa et al. | 2003/0096468 A1 | 5/2003 | Soininen et al. | |
| 2002/0081844 A1 | 6/2002 | Jeon et al. | 2003/0101927 A1 | 6/2003 | Raaijmakers | |
| 2002/0086106 A1 | 7/2002 | Park et al. | 2003/0101938 A1 | 6/2003 | Ronsse et al. | |
| 2002/0086111 A1 | 7/2002 | Byun et al. | 2003/0104126 A1 | 6/2003 | Fang et al. | |
| 2002/0086507 A1 | 7/2002 | Park et al. | 2003/0106490 A1 | 6/2003 | Jallepally et al. | |
| 2002/0090829 A1 | 7/2002 | Sandhu et al. | 2003/0106643 A1* | 6/2003 | Tabuchi et al. | 156/345.35 |
| 2002/0092471 A1 | 7/2002 | Kang et al. | 2003/0108674 A1 | 6/2003 | Chung et al. | |
| 2002/0094689 A1 | 7/2002 | Park | 2003/0113187 A1 | 6/2003 | Lei et al. | |
| 2002/0098627 A1 | 7/2002 | Pomarede et al. | 2003/0116087 A1 | 6/2003 | Nguyen et al. | |
| 2002/0102810 A1 | 8/2002 | Iizuka et al. | 2003/0121469 A1 | 7/2003 | Lindfors et al. | |
| 2002/0104481 A1 | 8/2002 | Chiang et al. | 2003/0121608 A1 | 7/2003 | Chen et al. | |
| 2002/0105088 A1 | 8/2002 | Yang et al. | 2003/0123216 A1 | 7/2003 | Yoon et al. | |
| 2002/0106536 A1 | 8/2002 | Lee et al. | 2003/0124262 A1 | 7/2003 | Chen et al. | |
| 2002/0106846 A1 | 8/2002 | Seutter et al. | 2003/0127043 A1 | 7/2003 | Lu et al. | |
| 2002/0108570 A1 | 8/2002 | Lindfors | 2003/0129826 A1 | 7/2003 | Werkhoven et al. | |
| 2002/0109168 A1 | 8/2002 | Kim et al. | 2003/0134508 A1 | 7/2003 | Raaijmakers et al. | |
| 2002/0110991 A1 | 8/2002 | Li | 2003/0140854 A1 | 7/2003 | Kilpi | |
| 2002/0115886 A1 | 8/2002 | Yasuhara et al. | 2003/0143328 A1 | 7/2003 | Chen et al. | |
| 2002/0117399 A1 | 8/2002 | Chen et al. | 2003/0143747 A1 | 7/2003 | Bondestam et al. | |
| 2002/0121241 A1 | 9/2002 | Nguyen et al. | 2003/0143839 A1 | 7/2003 | Raaijmakers et al. | |
| 2002/0121342 A1 | 9/2002 | Nguyen et al. | 2003/0143841 A1 | 7/2003 | Yang et al. | |
| 2002/0121697 A1 | 9/2002 | Marsh | 2003/0153177 A1 | 8/2003 | Tepman et al. | |
| 2002/0125516 A1 | 9/2002 | Marsh et al. | 2003/0153181 A1 | 8/2003 | Yoon et al. | |
| 2002/0127745 A1 | 9/2002 | Lu et al. | 2003/0157760 A1 | 8/2003 | Xi et al. | |
| 2002/0134307 A1 | 9/2002 | Choi | 2003/0161952 A1 | 8/2003 | Wang et al. | |
| 2002/0135071 A1 | 9/2002 | Kang et al. | 2003/0165615 A1 | 9/2003 | Aaltonen et al. | |
| 2002/0144655 A1 | 10/2002 | Chiang et al. | 2003/0167612 A1 | 9/2003 | Kraus et al. | |
| 2002/0144657 A1 | 10/2002 | Chiang et al. | 2003/0168750 A1 | 9/2003 | Basceri et al. | |
| 2002/0145210 A1 | 10/2002 | Tompkins et al. | 2003/0172872 A1 | 9/2003 | Thakur et al. | |
| 2002/0146511 A1 | 10/2002 | Chiang et al. | 2003/0173586 A1 | 9/2003 | Moriwaki et al. | |
| 2002/0155722 A1 | 10/2002 | Satta et al. | 2003/0181035 A1 | 9/2003 | Yoon | |
| 2002/0162506 A1 | 11/2002 | Sneh et al. | 2003/0186495 A1 | 10/2003 | Saanila et al. | |
| 2002/0164421 A1 | 11/2002 | Chiang et al. | 2003/0190423 A1 | 10/2003 | Yang et al. | |
| 2002/0164423 A1 | 11/2002 | Chiang et al. | 2003/0190497 A1 | 10/2003 | Yang et al. | |
| 2002/0173054 A1 | 11/2002 | Kim | 2003/0190804 A1 | 10/2003 | Glenn et al. | |
| 2002/0177282 A1 | 11/2002 | Song et al. | 2003/0194493 A1 | 10/2003 | Chang et al. | |
| 2002/0182320 A1 | 12/2002 | Leskela et al. | 2003/0194825 A1 | 10/2003 | Law et al. | |
| 2002/0187256 A1 | 12/2002 | Elers et al. | 2003/0198740 A1 | 10/2003 | Wendling | |
| 2002/0187631 A1 | 12/2002 | Kim et al. | 2003/0198754 A1 | 10/2003 | Xi et al. | |
| 2002/0192952 A1 | 12/2002 | Itoh et al. | 2003/0203616 A1 | 10/2003 | Chung et al. | |
| 2002/0197402 A1 | 12/2002 | Chiang et al. | 2003/0205729 A1 | 11/2003 | Basceri et al. | |
| 2002/0197863 A1 | 12/2002 | Mak et al. | 2003/0212285 A1 | 11/2003 | Uhlenbrock et al. | |
| 2003/0004723 A1 | 1/2003 | Chihara | 2003/0213560 A1* | 11/2003 | Wang et al. | 156/345.31 |
| 2003/0010451 A1 | 1/2003 | Tzu et al. | 2003/0213987 A1 | 11/2003 | Basceri et al. | |
| 2003/0013300 A1 | 1/2003 | Byun | 2003/0216981 A1 | 11/2003 | Tillman | |
| 2003/0013320 A1 | 1/2003 | Kim et al. | 2003/0218427 A1* | 11/2003 | Hoffman et al. | 315/111.41 |
| 2003/0017697 A1 | 1/2003 | Choi et al. | 2003/0219942 A1 | 11/2003 | Choi et al. | |
| 2003/0022338 A1 | 1/2003 | Ruben et al. | 2003/0221780 A1* | 12/2003 | Lei et al. | 156/345.29 |
| 2003/0022487 A1 | 1/2003 | Yoon et al. | 2003/0224107 A1 | 12/2003 | Lindfors et al. | |
| 2003/0029715 A1 | 2/2003 | Yu et al. | 2003/0224217 A1 | 12/2003 | Byun et al. | |
| 2003/0031807 A1 | 2/2003 | Elers et al. | 2003/0224578 A1 | 12/2003 | Chung et al. | |
| 2003/0032281 A1 | 2/2003 | Werkhoven et al. | 2003/0224600 A1 | 12/2003 | Cao et al. | |

| Publication No. | Date | Inventors |
|---|---|---|
| 2003/0232497 A1 | 12/2003 | Xi et al. |
| 2003/0235961 A1 | 12/2003 | Metzner et al. |
| 2004/0005749 A1 | 1/2004 | Choi et al. |
| 2004/0005753 A1 | 1/2004 | Kostamo et al. |
| 2004/0009307 A1 | 1/2004 | Koh et al. |
| 2004/0009336 A1 | 1/2004 | Marcadal et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0013803 A1 | 1/2004 | Chung et al. |
| 2004/0014315 A1 | 1/2004 | Lai et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0025370 A1 | 2/2004 | Guenther |
| 2004/0033698 A1 | 2/2004 | Lee et al. |
| 2004/0038529 A1 | 2/2004 | Soininen et al. |
| 2004/0041320 A1 | 3/2004 | Hodumi |
| 2004/0043630 A1 | 3/2004 | Vaartstra et al. |
| 2004/0048461 A1 | 3/2004 | Chen et al. |
| 2004/0065255 A1 | 4/2004 | Yang et al. |
| 2004/0067641 A1 | 4/2004 | Yudovsky |
| 2004/0069227 A1 | 4/2004 | Ku et al. |
| 2004/0071897 A1 | 4/2004 | Verplancken et al. |
| 2004/0077158 A1 | 4/2004 | Um et al. |
| 2004/0077183 A1 | 4/2004 | Chung et al. |
| 2004/0105934 A1 | 6/2004 | Chang et al. |
| 2004/0143370 A1 | 7/2004 | Lu et al. |
| 2004/0144308 A1 | 7/2004 | Yudovsky |
| 2004/0144309 A1 | 7/2004 | Yudovsky |
| 2004/0144311 A1 | 7/2004 | Chen et al. |
| 2004/0170403 A1 | 9/2004 | Lei |
| 2004/0187304 A1 | 9/2004 | Chen et al. |
| 2004/0197492 A1 | 10/2004 | Chen et al. |
| 2004/0202786 A1 | 10/2004 | Wongsenakhum |
| 2004/0203233 A1 | 10/2004 | Kang et al. |
| 2004/0203254 A1 | 10/2004 | Conley, Jr. et al. |
| 2004/0209460 A1 | 10/2004 | Xi et al. |
| 2004/0209465 A1 | 10/2004 | Xi et al. |
| 2004/0211665 A1 | 10/2004 | Yoon et al. |
| 2004/0214354 A1 | 10/2004 | Marsh et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0241321 A1 | 12/2004 | Ganguli et al. |
| 2004/0247788 A1 | 12/2004 | Fang et al. |
| 2004/0253375 A1 | 12/2004 | Ivanov et al. |
| 2004/0256351 A1 | 12/2004 | Chung et al. |
| 2004/0266175 A1 | 12/2004 | Chen et al. |
| 2005/0006799 A1 | 1/2005 | Gregg et al. |
| 2005/0008779 A1 | 1/2005 | Yang et al. |
| 2005/0009325 A1 | 1/2005 | Chung et al. |
| 2005/0031786 A1 | 2/2005 | Lee et al. |
| 2005/0059240 A1 | 3/2005 | Choi et al. |
| 2005/0059241 A1 | 3/2005 | Kori et al. |
| 2005/0064207 A1 | 3/2005 | Senzaki et al. |
| 2005/0070126 A1 | 3/2005 | Senzaki |
| 2005/0074968 A1 | 4/2005 | Chen et al. |
| 2005/0081882 A1 | 4/2005 | Greer et al. |
| 2005/0085031 A1 | 4/2005 | Lopatin et al. |
| 2005/0095859 A1 | 5/2005 | Chen et al. |
| 2005/0104142 A1 | 5/2005 | Narayanan et al. |
| 2005/0106865 A1 | 5/2005 | Chung et al. |
| 2005/0115675 A1 | 6/2005 | Tzu et al. |
| 2005/0118804 A1 | 6/2005 | Byun et al. |
| 2005/0136188 A1 | 6/2005 | Chang |
| 2005/0139160 A1 | 6/2005 | Lei et al. |
| 2005/0139948 A1 | 6/2005 | Chung et al. |
| 2005/0153571 A1 | 7/2005 | Senzaki |
| 2005/0164487 A1 | 7/2005 | Seutter et al. |
| 2005/0173068 A1 | 8/2005 | Chen et al. |
| 2005/0176240 A1 | 8/2005 | Wang et al. |
| 2005/0189072 A1 | 9/2005 | Chen et al. |
| 2005/0196960 A1 | 9/2005 | Koo et al. |
| 2005/0205110 A1 | 9/2005 | Kao et al. |
| 2005/0208763 A1 | 9/2005 | Byun et al. |
| 2005/0218507 A1* | 10/2005 | Kao et al. .................. 257/704 |
| 2005/0220998 A1 | 10/2005 | Chang et al. |
| 2005/0229969 A1 | 10/2005 | Nguyen et al. |
| 2005/0233156 A1 | 10/2005 | Senzaki et al. |
| 2005/0238808 A1 | 10/2005 | Gatineau et al. |
| 2005/0252449 A1 | 11/2005 | Nguyen et al. |
| 2005/0255243 A1 | 11/2005 | Senzaki |
| 2005/0255690 A1 | 11/2005 | Chen et al. |
| 2005/0257735 A1 | 11/2005 | Guenther et al. |
| 2005/0260357 A1 | 11/2005 | Olsen et al. |
| 2005/0266682 A1 | 12/2005 | Chen et al. |
| 2005/0271812 A1 | 12/2005 | Myo et al. |
| 2005/0271813 A1 | 12/2005 | Kher et al. |
| 2005/0271814 A1 | 12/2005 | Chang et al. |
| 2005/0277290 A1 | 12/2005 | Yang et al. |
| 2005/0287807 A1 | 12/2005 | Lai et al. |
| 2006/0009034 A1 | 1/2006 | Lai et al. |
| 2006/0018639 A1 | 1/2006 | Ramamurthy et al. |
| 2006/0019033 A1 | 1/2006 | Muthukrishnan et al. |
| 2006/0019494 A1 | 1/2006 | Cao et al. |
| 2006/0019495 A1 | 1/2006 | Marcadal et al. |
| 2006/0030148 A1 | 2/2006 | Seutter et al. |
| 2006/0035025 A1 | 2/2006 | Verplancken |
| 2006/0040052 A1 | 2/2006 | Feng et al. |
| 2006/0057843 A1 | 3/2006 | Chen et al. |
| 2006/0062917 A1 | 3/2006 | Muthukrishnan |
| 2006/0075966 A1 | 4/2006 | Chen et al. |
| 2006/0128132 A1 | 6/2006 | Sinha et al. |
| 2006/0128150 A1 | 6/2006 | Gandikota et al. |
| 2006/0148253 A1 | 7/2006 | Chung et al. |
| 2006/0153973 A1 | 7/2006 | Chang |
| 2006/0153995 A1 | 7/2006 | Narwankar |
| 2006/0156979 A1 | 7/2006 | Thakur et al. |
| 2006/0199372 A1 | 9/2006 | Chung et al. |
| 2006/0213557 A1 | 9/2006 | Ku |
| 2006/0213558 A1 | 9/2006 | Ku |
| 2006/0216928 A1 | 9/2006 | Chung et al. |
| 2006/0223286 A1 | 10/2006 | Chin |
| 2006/0228889 A1 | 10/2006 | Edelberg et al. |
| 2006/0257295 A1 | 11/2006 | Chen et al. |
| 2006/0264031 A1 | 11/2006 | Xi et al. |
| 2006/0276020 A1 | 12/2006 | Yoon |
| 2006/0292864 A1 | 12/2006 | Yang |
| 2006/0292874 A1 | 12/2006 | Kori et al. |
| 2007/0003698 A1 | 1/2007 | Chen et al. |
| 2007/0009658 A1 | 1/2007 | Yoo et al. |
| 2007/0018244 A1 | 1/2007 | Hung |
| 2007/0020890 A1 | 1/2007 | Thakur et al. |
| 2007/0020924 A1 | 1/2007 | Wang et al. |
| 2007/0026147 A1 | 2/2007 | Chen et al. |
| 2007/0054487 A1 | 3/2007 | Ma et al. |
| 2007/0067609 A1 | 3/2007 | Chen et al. |
| 2007/0077750 A1 | 4/2007 | Ma et al. |
| 2007/0079759 A1 | 4/2007 | Lee et al. |
| 2007/0095285 A1 | 5/2007 | Thakur |
| 2007/0099415 A1 | 5/2007 | Chen et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2007/0166477 A1* | 7/2007 | Chang .................. 427/446 |
| 2007/0259111 A1 | 11/2007 | Singh et al. |

FOREIGN PATENT DOCUMENTS

| | | |
|---|---|---|
| EP | 1 167 569 | 1/2002 |
| EP | 1 293 509 | 5/2004 |
| GB | 2 355 727 | 5/2001 |
| JP | 58-098917 | 6/1983 |
| JP | 02-246161 | 9/1990 |
| JP | 04-291916 | 9/1992 |
| JP | 05-206036 | 8/1993 |
| JP | 05-234899 | 9/1993 |
| JP | 05-270997 | 10/1993 |
| JP | 06-224138 | 5/1994 |
| JP | 07-300649 | 11/1995 |
| JP | 05-047666 | 2/1996 |
| JP | 10-308283 | 11/1998 |
| JP | 2000-031387 | 1/2000 |
| JP | 2000-058777 | 2/2000 |
| JP | 2000-319772 | 3/2000 |
| JP | 2000-178735 | 6/2000 |
| JP | 2001-020075 | 11/2000 |
| JP | 2001-111000 | 4/2001 |
| JP | 2001-172767 | 6/2001 |
| JP | 2001-220294 | 8/2001 |
| JP | 2001-237400 | 8/2001 |
| JP | 2001-254181 | 9/2001 |
| JP | 2000-212752 | 11/2002 |
| KR | 20020084597 | 11/2002 |
| TW | 434696 | 5/2001 |
| TW | 539760 | 7/2003 |
| WO | WO 96/17107 | 6/1996 |
| WO | WO 96/017107 | 6/1996 |
| WO | WO 98/051838 | 11/1998 |
| WO | WO 99/01595 | 1/1999 |
| WO | WO 99/29924 | 6/1999 |
| WO | WO 99/65064 | 12/1999 |
| WO | WO 00/15865 | 3/2000 |
| WO | WO 00/16377 | 3/2000 |
| WO | WO 00/54320 | 9/2000 |
| WO | WO 00/63957 | 10/2000 |
| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/66832 | 9/2001 |
| WO | WO 01/88972 | 11/2001 |
| WO | WO 02/01628 | 1/2002 |
| WO | WO 02/08485 | 1/2002 |
| WO | WO 02/08488 | 1/2002 |
| WO | WO 02/43115 | 5/2002 |
| WO | WO 02/45167 | 6/2002 |
| WO | WO 02/45871 | 6/2002 |
| WO | WO 02/46489 | 6/2002 |
| WO | WO 02/067319 | 8/2002 |
| WO | WO 03/023835 | 3/2003 |
| WO | WO 03/056612 | 7/2003 |
| WO | WO 2004/008491 | 1/2004 |
| WO | WO 2004/106584 | 12/2004 |
| WO | WO 2005/020317 | 3/2005 |
| WO | WO 2005/027211 | 3/2005 |

OTHER PUBLICATIONS

Office Action dated Jan. 11, 2010 and Search Report for Taiwan Patent Application No. 95141027.
Office Action dated Jan. 8, 2010 and Search Report for Taiwan Patent Application No. 95141045.
Office Action dated Jan. 8, 2010 and Search Report for Taiwan Patent Application No. 95141025.

Aaltonen "Atomic Layer Deposition of Noble Metal Thin Films," Academic Dissertation presented at the Department of Chemistry of the University of Helsinki on Apr. 8, 2005, Helsinki, Finland, pp. 1-71.
Aaltonen, et al. "Atomic Layer Deposition of Ruthenium from RuCp2 and Oxygen: Film Growth and Reaction Mechanism Studies," Electrochemical Society Proceedings, vol. 2003-08, pp. 946-953.
Aaltonen, et al. "Atomic Layer Deposition of Ruthenium Thin Films from Ru(thd)3 and Oxygen," Chem. Vap. Deposition (2004), 10, No. 4, pp. 215-219.
Aaltonen, et al. "Ruthenium Thin Films Grown by Atomic Layer Deposition," Chem. Vap. Deposition (2003), 9, No. 1, pp. 45-49.
Aoyama, et al. "Ruthenium Films Prepared by Liquid Source Chemical Vapor Deposition Using Bis-(ethylcyclopentadienyl)ruthenium," Jpn. J. Appl. Phys. vol. 38 (1999), pp. L1134-L1136.
Ashtiani, et al. "Pulsed Nucleation Layer of Tungsten Nitride Barrier Film and its Application in DRAM and Logic Manufacturing," SEMI Technical Symposium: Innovations in Semiconductor Manufacturing (STS: ISM), SEMICON Korea 2006, Semiconductor Equipment and Materials International, pp. 1-6.
Cameron, et al. "Atomic Layer Deposition of SiO2 and TiO2 in Alumina Tubular Membranes," Langmuir, vol. 16, No. 19, American Chemical Society, 2000 pp. 7435-7444.
Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).
Dadgar, et al. "Growth of Ru doped semi-insulating InP by low pressure metalorganic chemical vapor deposition," Journal of Crystal Growth 195 (1998), pp. 69-73.
Dadgar, et al. "Ruthenium: A superior compensator of InP," Applied Physics Letters, vol. 73, No. 26, Dec. 28, 1998, American Institute of Physics, pp. 3878-3880.
Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606-1608.
Dormans, et al. "OMCVD of cobalt and cobalt silicide," Journal of Crystal Growth 114, (1991), Elsevier Publishers B.V., pp. 364-372.
Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461) 2001.
Elam, et al. "Nucleation and Growth During Tungsten Atomic Layer Deposition on SiO2 Surfaces," Thin Solid Films, 386, (2001), pp. 41-52.
George, et al. "Surface Chemistry for Atomic Layer Growth," J. Phys. Chem. 1996, 100, 13121-13131.
Goswami, et al. Transition Metals Show Promise as Copper Barriers, Semiconductor International, ATMI, San Jose—May 1, 2004, Semiconductor International, pp. 1-7.
Hong, et al. "Characteristics of PAALD-TaN thin films derived from TAIMATA precursor for copper metallization", Internconnect Technology Conference, 2004. Proceedings of the IEEE 2004 International, Jun. 7-9, 2004, pp. 9-11.
Hwang, et al. "Nanometer-Size α-PbO2-type TiO2 in Garnet: A Thermobarometer for Ultrahigh-Pressure Metamorphism," Science Vo. 288 (Apr. 14, 2000).
Kim, et al. "Atomic Layer Deposition of Low Resistivity and High-Density Tungsten Nitride Thin Film Using B2H6, WF6 and NH3," Electrochem. Solid-State Lett., vol. 9, Issue 3, (2006), pp. C54-C57.
Kim, et al. "Investigation of Chemical Vapor Deposition (CVD)—Derived Cobalt Silicidation for the Improvement of Contact Resistance," Japanese Journal of Applied Physics, vol. 44, No. 6A, 2005, pp. 3828-3831.
Klaus, et al. "Atomic Layer Deposition of SiO2 Using Catalyzed and Uncatalyzed Self-Limiting Surface Reactions," Surface Review and Letters, vol. 6, Nos. 3 & 4 (1999) 435-448.
Klaus, et al. "Atomically Controlled Growth of Tungsten and Tungsten Nitride Using Sequential Surface Reactions," Applied Surface Science, 162-163 (2000), pp. 479-491.

Kukli, et al. "Atomic Layer Epitaxy Growth of Tantalum Oxide Thin Films from Ta(OC2H5)5 and H2O," Journal of the Electrochemical Society, vol. 142, No. 5, May 1995; p. 1670-5.

Kukli, et al. "In situ Study of Atomic Layer Epitaxy Growth of Tantalum Oxide Thin Films From Ta(OC2H5)5 and H2O," Applied Surface Science, vol. 112, Mar. 1997, p. 236-42.

Kukli, et al. "Properties of {Nb1-xTax}2O5 Solid Solutions and {Nb1-xTax}2O5-ZrO2 Nanolaminates Grown by Atomic Layer Epitaxy," 1997; p. 785-93.

Kukli, et al. "Properties of Ta2O5-Based Dielectric Nanolaminates Deposited by Atomic Layer Epitaxy," Journal of the Electrochemical Society, vol. 144, No. 1, Jan. 1997; p. 300-6.

Kukli, et al. "Tailoring the Dielectric Properties of HfO2-Ta2-O5 Nanolaminates," Applied Physics Letters, vol. 68, No. 26, Jun. 24, 1996; p. 3737-9.

Kwon, et al. "Atomic Layer Deposition of Ruthenium Thin Films for Copper Glue Layer," Journal of the Electrochemical Society, 151 (2) (2004), pp. G109-G112.

Kwon, et al. "PEALD of Ruthenium Adhesion Layer for Copper Interconnects," Journal of the Electrochemical Society, 151 (12) (2004), pp. C753-C775.

Kwon, et al. "Plasma-Enhanced Atomic Layer Deposition of Ruthenium Thin Films," Electrochemical and Solid-State Letters, 7 (4) (2004), pp. C46-C48.

Lashdaf, et al. "Deposition of palladium and ruthenium β-diketonates on alumina and silica supports in gas and liquid phase," Applied Catalysis A: General 241 (2003), pp. 51-63.

Lee, et al. "Excellent conformal deposition obtained of pure Co Films by MOCVD using Co2(CO)8 as a Co precursor,"http:/www.samsung.com/AboutSAMSUNG.ELECTRONICSGLOBAL/SocialCommitment/HumantechThese/WinningPapers/downloads/11th/silverproze/LeeJeongGil.pdf.

Lee, et al. "Pulsed Nucleation for Ultra-High Aspect Ratio Tungsten Plugfill," Materials Research Society, 2002, pp. 649-653.

Lim, et al. "Atomic layer deposition of transition metals," Nature Materials, vol. 2 Nov. 2003, pp. 749-754.

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122-2128.

Meda, et al. "Chemical Vapor Deposition of Ruthenium Dioxide Thin Films From Bis(2, 4-dimethylpentadienyl) Ruthenium," Chemical Aspects of Electronic Ceramics Processing, Symposium Mater. Res. Soc., Warrendale, PA, USA, 1998, pp. 75-80, XP009050315, ISBN: 1-55899-400-9.

Min, et al. "Atomic Layer Deposition of TiN Thin Films by Sequential Introduction of Ti Precursor and NH3," Mat. Res. Soc. Symp. Proc. vol. 514 (1998).

Min, et al. "Chemical Vapor Deposition of Ti-Si-N. Films With Alternating Source Supply," Mat. Rec. Soc. Symp. Proc. vol. (1999).

Min, et al. "Metal-organic Atomic-layer Deposition of Titanium-silicon-nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996) 23-29.

Park, et al. "Performance improvement of MOSFET with HfO2-Al2O3 laminate gate dielectric and CVD-TaN metal gate deposited by TAIMATA", Electron Devices Meeting, 2003. IEDM '03 Techinical Digest. IEEE International Dec. 8-10, 2003, pp. 13.6.1-13.6.4.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From TiI4 and NH3," J. Electrochem. Soc., vol. 145, No. 8 (Aug. 1998) pp. 2914-2920.

Ritala, et al. "Atomic Layer Epitaxy Growth of TiN Thin Films," J. Electrochem. Soc., vol. 142, No. 8, Aug. 1995.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and Al2O3 Films Deposited by Atomic Layer Deposition," Chemical Vapor Deposition, Jan. 1999, 5, No. 1, pp. 6-9.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Rossnagel, et al. "Plasma-enhanced Atomic Layer Deposition of Ta and Ti for Interconnect Diffusion Barriers," J. Vac. Sci. Technol. B., vol. 18, No. 4 (Jul. 2000); p. 2016-20.

Shenai, et al. "Correlation of vapor pressure equation and film properties with trimethylindium purity for the MOVPE grown III-V compounds," Journal of Crystal Growth 248 (2003) pp. 91-98.

Shibutami, et al. "A Novel Ruthenium Precursor for MOCVD without Seed Ruthenium Layer," TOSOH Research & Technology Review, vol. 47 (2003), pp. 61-64.

Sun, et al. "Properties of Ru Thin Films Fabricated on TiN by Metal-Organic Chemical Vapor Deposition," Japanese Journal of Applied Physics, vol. 43, No. 4A, 2004, The Japan Society of Applied Physics, pp. 1566-1570.

Yang, et al. "Atomic Layer Deposition of Tungsten Film from WF6/B2H6: Nucleation Layer for Advanced Semiconductor Devices," Conference Proceedings ULSI XVII (2002), Materials Research Society, pp. 655-660.

Yun, et al. "Highly Scalable PVD/CVD-Cobalt Bilayer Salicidation Technology for sub-50nm CMOSFETs.".

Office Action dated Jun. 24, 2009 for Korean Patent Application No. 10-2007-7024225.

International Search Report and Written Opinion dated Oct. 22, 2008 for International Application No. PCT/US06/60559.

* cited by examiner

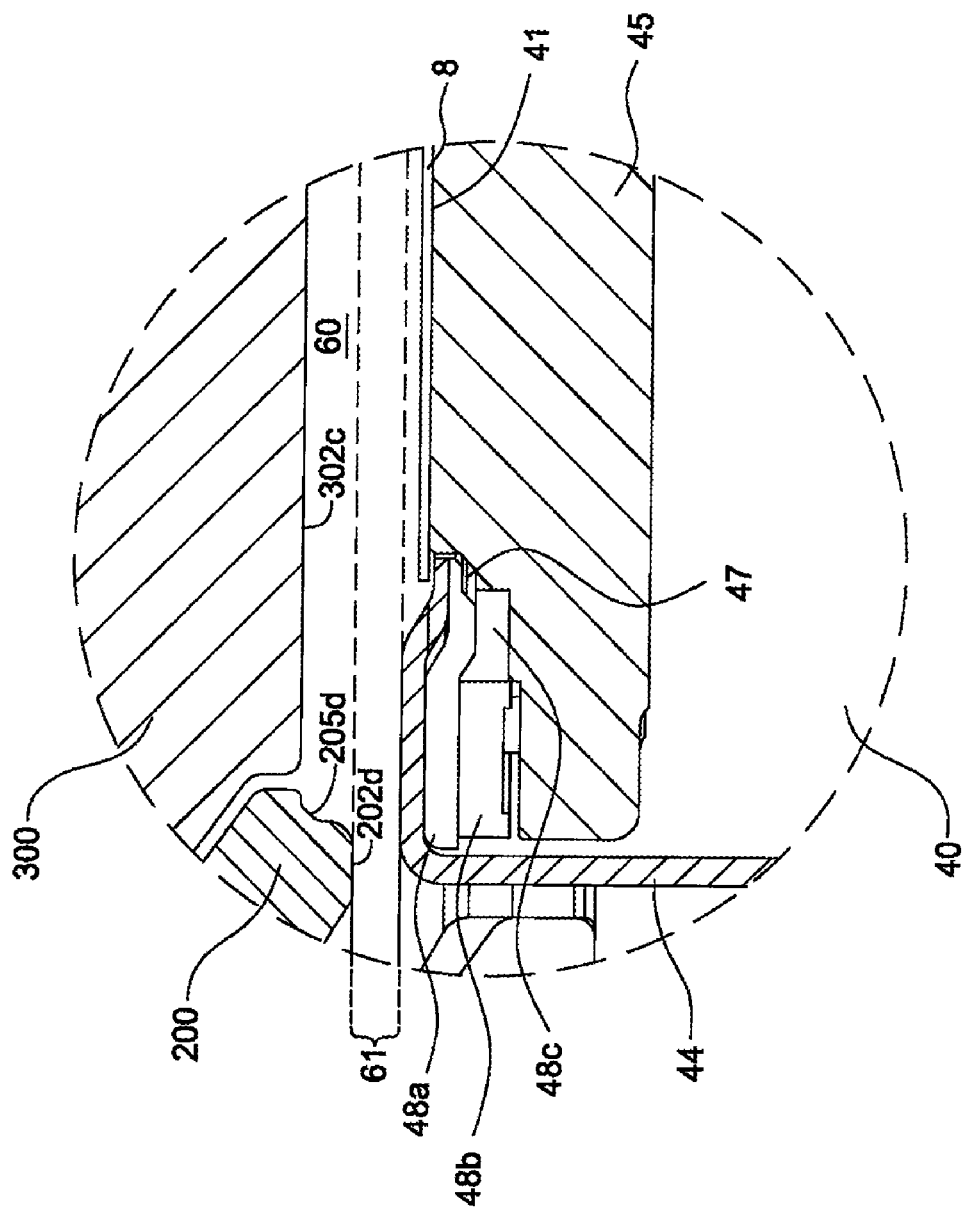

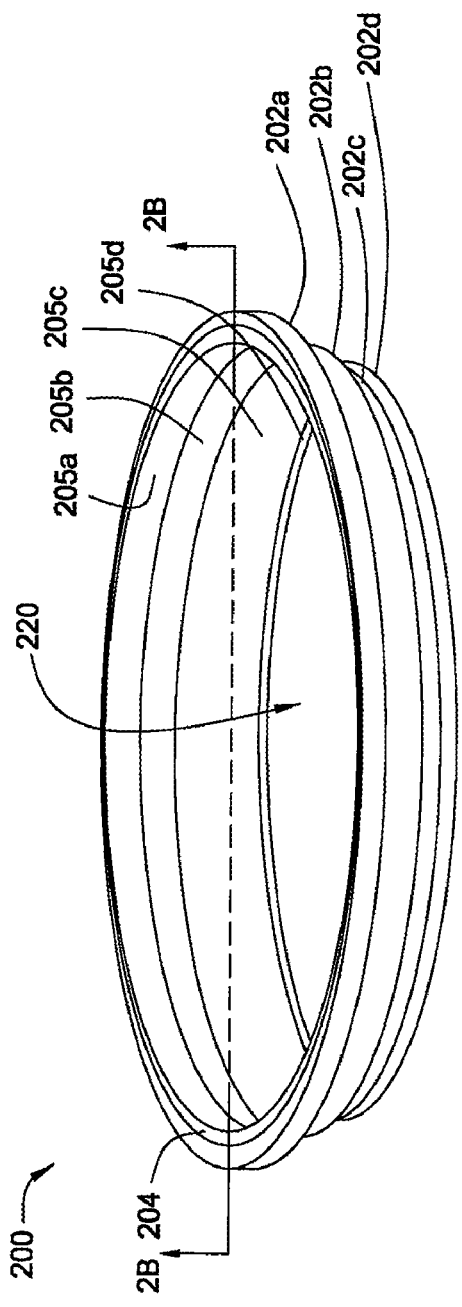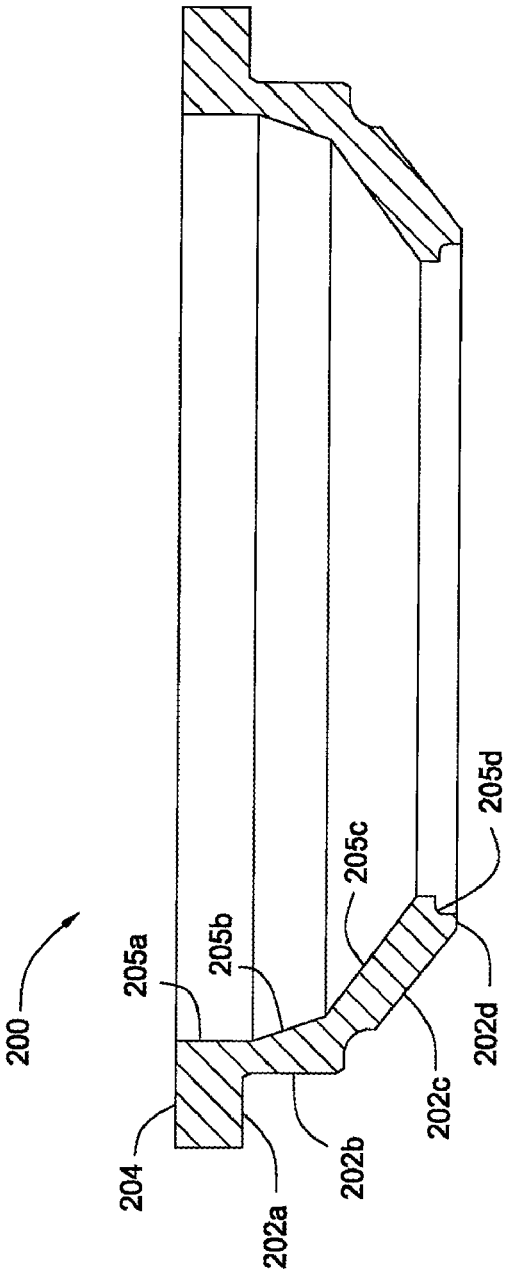
FIG. 2A
FIG. 2B

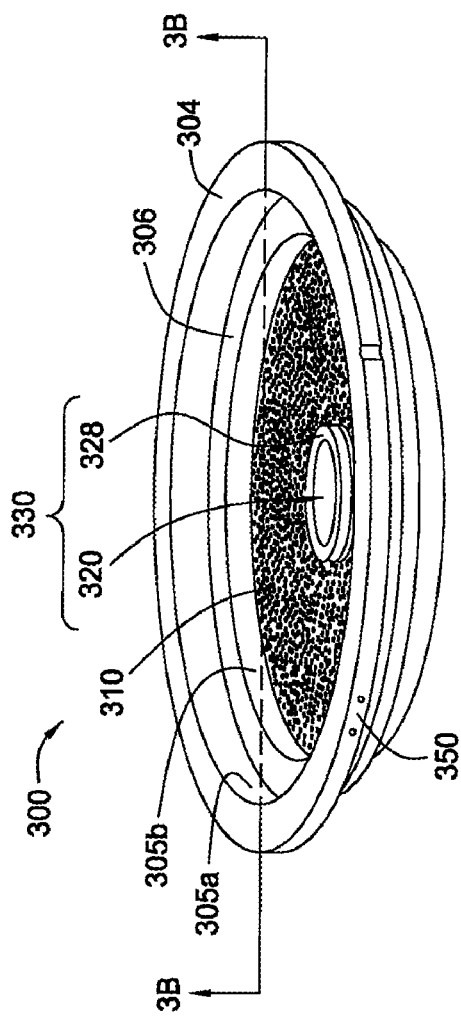
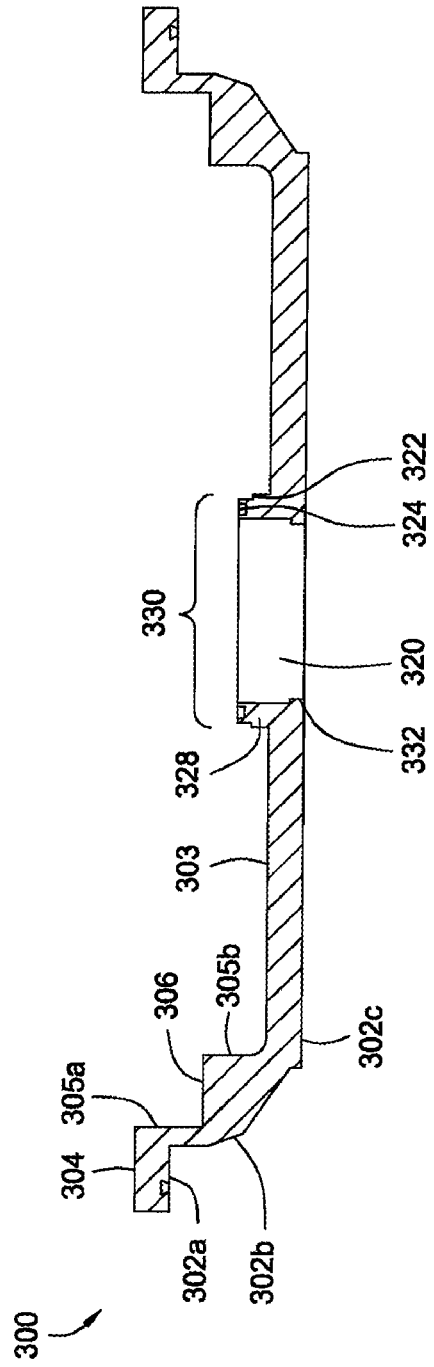

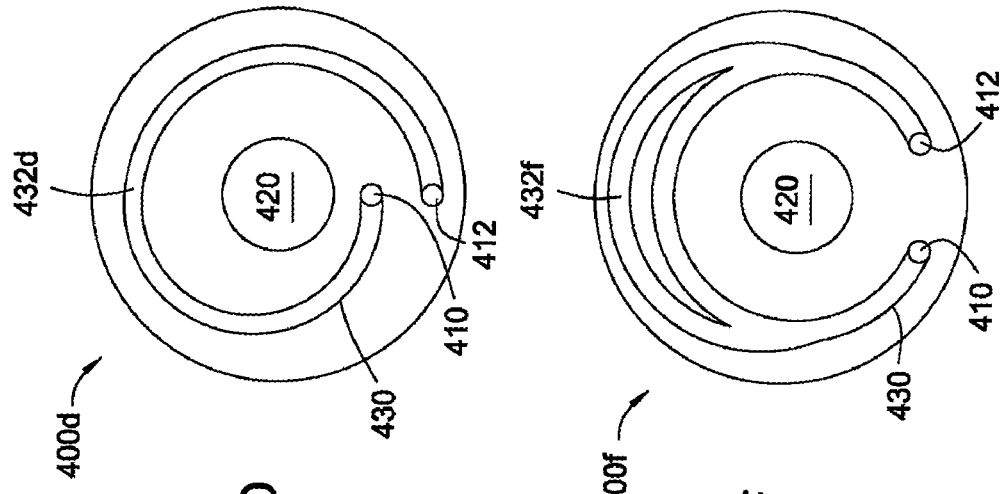
FIG. 4D
FIG. 4F
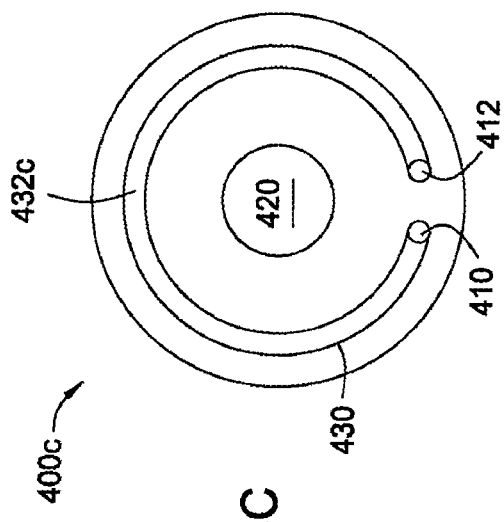
FIG. 4C
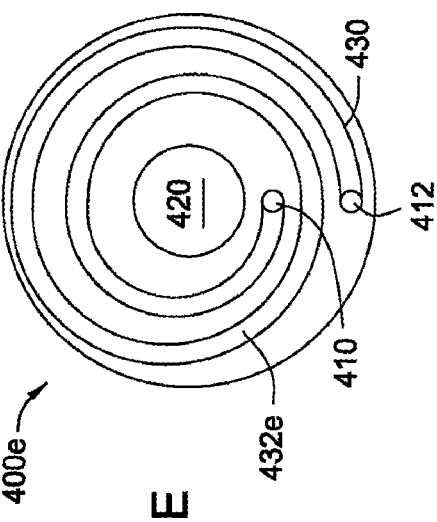
FIG. 4E

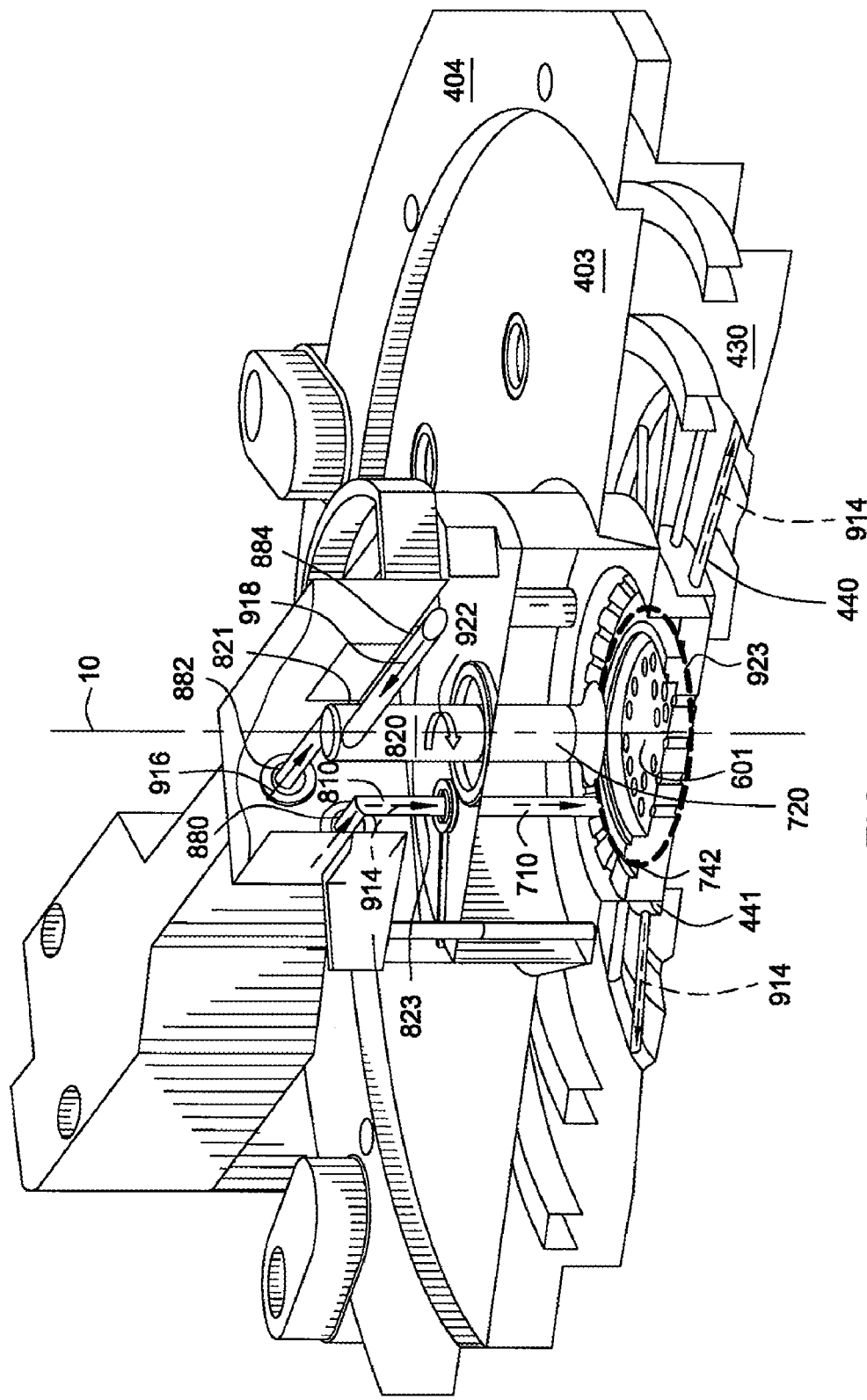

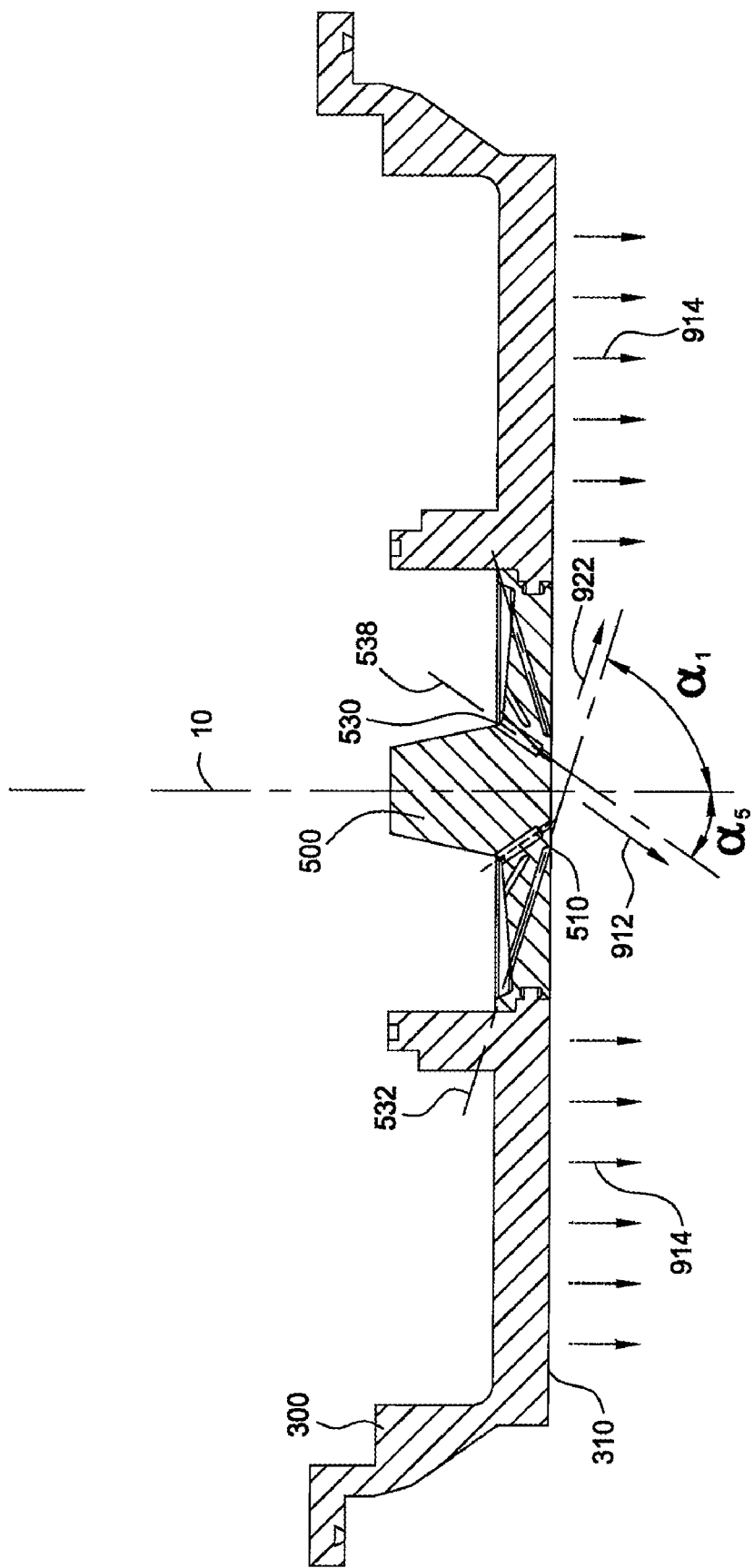

APPARATUS AND PROCESS FOR PLASMA-ENHANCED ATOMIC LAYER DEPOSITION

CROSS-REFERENCE TO RELATED APPLICATIONS

This application claims benefit of U.S. Ser. No. 60/733,870, filed Nov. 4, 2005, U.S. Ser. No. 60/733,655, filed Nov. 4, 2005, U.S. Ser. No. 60/733,654, filed Nov. 4, 2005, U.S. Ser. No. 60/733,574, filed Nov. 4, 2005, and U.S. Ser. No. 60/733,869, filed Nov. 4, 2005, which are all incorporated herein by reference in their entirety.

BACKGROUND OF THE INVENTION

1. Field of the Invention

Embodiments of the invention generally relate to an apparatus and a method for depositing materials, and more particularly to an atomic layer deposition chamber configured to deposit a material during a plasma-enhanced process.

2. Description of the Related Art

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 µm and aspect ratios of 10 or greater. Accordingly, conformal deposition of materials to form these devices is becoming increasingly important.

While conventional chemical vapor deposition (CVD) has proved successful for device geometries and aspect ratios down to 0.15 µm, the more aggressive device geometries require an alternative deposition technique. One technique that is receiving considerable attention is atomic layer deposition (ALD). During an ALD process, reactant gases are sequentially introduced into a process chamber containing a substrate. Generally, a first reactant is pulsed into the process chamber and is adsorbed onto the substrate surface. A second reactant is pulsed into the process chamber and reacts with the first reactant to form a deposited material. A purge step is typically carried out between the delivery of each reactant gas. The purge step may be a continuous purge with the carrier gas or a pulse purge between the delivery of the reactant gases. Thermally induced ALD processes are the most common ALD technique and use heat to cause the chemical reaction between the two reactants. While thermal ALD processes work well to deposit some materials, the processes often have a slow deposition rate. Therefore, fabrication throughput may be impacted to an unacceptable level. The deposition rate may be increased at a higher deposition temperature, but many chemical precursors, especially metal-organic compounds, decompose at elevated temperatures.

The formation of materials by plasma-enhanced ALD (PE-ALD) processes is also a known technique. In some examples of PE-ALD processes, a material may be formed from the same chemical precursors as a thermal ALD process, but at a higher deposition rate and a lower temperature. Although several variations of techniques exist, in general, a PE-ALD process provides that a reactant gas and a reactant plasma are sequentially introduced into a process chamber containing a substrate. The first reactant gas is pulsed into the process chamber and is adsorbed onto the substrate surface. Thereafter, the reactant plasma is pulsed into the process chamber and reacts with the first reactant gas to form a deposited material. Similarly to a thermal ALD process, a purge step may be conducted between the delivery of each of the reactants. While PE-ALD processes overcome some of the shortcomings of thermal ALD processes due to the high degree of reactivity of the reactant radicals within the plasma, PE-ALD processes have many limitations. PE-ALD process may cause plasma damage to a substrate (e.g., etching), be incompatible with certain chemical precursors and require additional hardware.

Therefore, there is a need for an apparatus and a process for depositing or forming a material on a substrate by a vapor deposition technique, preferably by a plasma-enhanced technique, and more preferably, by a PE-ALD technique.

SUMMARY OF THE INVENTION

Embodiments of the invention provide an apparatus configured to form a material during an atomic layer deposition (ALD) process, such as a plasma-enhanced ALD (PE-ALD) process. In one embodiment, a process chamber is configured to expose a substrate to a sequence of gases and plasmas during a PE-ALD process. The process chamber contains components that are capable of being electrically insulated, electrically grounded or RF energized. In one example, a chamber body and a gas manifold assembly are grounded and separated by electrically insulated components, such as an insulation cap, a plasma screen insert and an isolation ring. A showerhead, a plasma baffle and a water box are positioned between the insulated components and become RF hot when activated by a plasma generator.

In one example, a chamber for processing substrates is provided which includes a substrate support having a substrate receiving surface and a chamber lid assembly with a process region contained therebetween. In one embodiment, the chamber lid assembly contains a showerhead assembly having an inner region and an outer region, a cooling assembly in contact with the showerhead assembly, a plasma baffle disposed within the inner region of the showerhead assembly, a plasma screen disposed above the showerhead assembly and configured to direct a first process gas to the plasma baffle and a second process gas to the outer region of the showerhead assembly, a first gas region located between the plasma baffle and the plasma screen and a second gas region located between the outer region of the showerhead assembly and the cooling assembly.

In another example, a chamber for processing substrates is provided which includes a substrate support having a substrate receiving surface and a chamber lid that contains a channel at a central portion of the chamber lid. A tapered bottom surface extending from the channel to a plasma screen disposed above a plasma baffle and a showerhead, wherein the showerhead is shaped and sized to substantially cover the substrate receiving surface, a first conduit coupled to a first gas inlet within the channel and a second conduit coupled to a second gas inlet within the channel, wherein the first conduit and the second conduit are positioned to provide a gas flow in a circular direction.

In another example, a chamber for processing substrates is provided which includes a substrate support having a substrate receiving surface, a chamber lid assembly contains a showerhead assembly having an inner region and an outer region, a plasma screen disposed above the showerhead assembly and configured to direct a first process gas to the inner region and a second process gas to the outer region and a process region situated between the substrate receiving surface and the chamber lid assembly. The plasma screen contains an inner area for receiving the first process gas and an outer area for receiving the second process gas.

In another embodiment, a lid assembly is configured to expose a substrate to a sequence of gases and plasmas during a PE-ALD process. The lid assembly contains components that are capable of being electrically insulated, electrically grounded or RF energized. In one example, the lid assembly contains a grounded gas manifold assembly positioned above electrically insulated components, such as an insulation cap, a plasma screen insert and an isolation ring. A showerhead, a plasma baffle and a water box are positioned between the insulated components and become RF hot when activated by a plasma generator.

In one example, the showerhead assembly contains a showerhead plate having a lower surface to substantially cover the substrate receiving surface. The inner region of the showerhead assembly contains the plasma baffle as a removable component. The showerhead assembly and the plasma baffle usually contain a conductive material, such as aluminum, stainless steel, steel, iron, chromium, nickel, alloys thereof or combinations thereof. Also, the lower surface of the showerhead plate and the plasma baffle are positioned parallel or substantially parallel to the substrate receiving surface and are connected to an electrical source for igniting a plasma. The outer region of the showerhead assembly contains a plurality of holes in fluid communication with the process region. Each of the holes may have a diameter within a range from about 0.20 mm to about 0.80 mm, preferably, from about 0.40 mm to about 0.60 mm, such as about 0.51 mm. The showerhead plate may contain about 1,000 holes or more, such as about 1,500 holes or more. The holes have a diameter to prohibit back diffusion of gas or to prohibit formation of a secondary plasma.

In another example, a lid assembly for conducting a vapor deposition process within a process chamber is provided which includes an insulation cap containing a first channel configured to flow a first process gas and a plasma screen having an upper surface with an inner area and an outer area. The insulation cap may be positioned on the upper surface of the plasma screen. A first plurality of openings within the inner area of the plasma screen is configured to direct the first process gas from above the upper surface to below a lower surface and a second plurality of openings within the outer area of the plasma screen is configured to flow a second process gas from above the upper surface to below the lower surface. In one example, the first plurality of openings contains holes and the second plurality of openings contains slots. Also, the insulation cap may contain a second channel configured to flow the second process gas to the outer area of the plasma screen. The inner area of the plasma screen contains a zone free of holes and a first flow pattern of the first process gas is directional at a line-of-sight to the zone. The line-of-sight of the first flow pattern is directional obscure to the plurality of holes so to prohibit a secondary plasma from igniting above the upper surface of the plasma screen. In one example, each of the holes have a diameter within a range from about 0.5 mm to about 5 mm, preferably, from about 1 mm to about 3 mm, and more preferably, about 1.5 mm. The plurality of holes may contain at least about 100 holes, preferably at least about 150 holes. The insulation cap and the plasma screen may each be formed from a material that is electrically insulating, thermally insulating or electrically and thermally insulating, such as a ceramic material, a quartz material or a derivative thereof.

In another embodiment, a showerhead assembly contains a showerhead and a plasma baffle for dispersing process gases within a plasma-enhanced vapor deposition chamber. The showerhead plate contains an inner area configured to position the plasma baffle therein and an outer area which has a plurality of holes for emitting a process gas. The plasma baffle contains a conical nose disposed on an upper surface to receive another process gas, a lower surface to emit the process gas and a plurality of openings configured to flow the process gas from above the upper surface into a process region. The openings are preferably slots that are positioned at predetermined angle for emitting the process gas with a circular flow pattern.

In one example, the plasma baffle assembly contains a plurality of slots extending from the first gas region through the assembly to provide fluid communication from the first gas region into the process region. The plasma baffle assembly further contains a nose cone extending from an upper surface of the plasma baffle to a lower surface of the plasma screen. The slots extend across the upper surface between the nose cone and an outer edge of the assembly at a tangential angle from a center portion. Each slot is extended through the plasma baffle assembly at a predetermined injection angle relative to the substrate receiving surface. The predetermined injection angle may be within a range from about 20° to about 70°, preferably, from about 30° to about 60°, and more preferably, from about 40° to about 50°, such as about 45°. Each slot of the plurality of slots may have a width within a range from about 0.60 mm to about 0.90 mm, preferably, from about 0.70 mm to about 0.80 mm, such as about 0.76 mm and may have a length within a range from about 10 mm to about 50 mm, preferably, from about 20 mm to about 30 mm, such as about 23 mm or more. The plasma baffle assembly usually contains about 10 slots or more, such as about 20 slots or more. The slots have a width to prohibit back diffusion of gas or to prohibit formation of a secondary plasma. In one example, the upper surface of the plasma baffle is directed downwardly way from the nose cone. The upper surface may angled in order receive a process gas through openings of the slots and disperse the process gas with a uniform flow rate.

In another example, a plasma baffle assembly for receiving a process gas within a plasma-enhanced vapor deposition chamber is provided which includes a plasma baffle plate containing an upper surface to receive a process gas and a lower surface to emit the process gas. The plasma baffle assembly contains a plurality of openings configured to flow the process gas from above the upper surface to below the lower surface, wherein each opening is positioned at an obscured angle or at a predetermined angle, measured from a perpendicular axis of the lower surface.

In another example, the cooling assembly contains a plurality of passageways for the second process gas to pass into the second gas region. The plurality of passageways provides fluid communication from the plasma screen to the second gas region. The plurality of passageways contains at least about 10 channels, preferably, at least about 20 channels, and more preferably, at least about 30 channels, such as about 36 channels.

In another example, a showerhead assembly for conducting a vapor deposition process is provided which includes a showerhead plate having a bottom surface to substantially cover a substrate receiving surface within a process chamber, an inner region of the showerhead plate for distributing a first process gas through a plurality of slots positioned at a predetermined injection angle relative to the substrate receiving surface and an outer region of the showerhead plate for distributing a second process gas through a plurality of holes.

In another example, a showerhead assembly for receiving a process gas within a plasma-enhanced vapor deposition chamber is provided which includes a showerhead plate containing an upper surface to receive gases and a lower surface to emit the gases. An inner area on the upper surface for receiving a first process gas contains a first plurality of openings configured to flow the first process gas from above the upper surface to below the lower surface. An outer area on the upper surface for receiving the second process gas contains a second plurality of openings configured to flow the second process gas from above the upper surface to below the lower surface. For example, a cooling assembly may be positioned above and in contact with the showerhead plate. An inner region is formed between the inner area and the cooling assembly and an outer region is formed between the outer area and the cooling assembly. The inner region of the showerhead plate may contain a plasma baffle.

In another example, a cooling assembly contains a plurality of passageways for directing a second process gas into the outer region. Each passageway of the plurality of passageways extends into the outer region at a predetermined angle. The predetermined angle may prohibit back diffusion of gas or formation of a secondary plasma. In one example, the predetermined angle may be within a range from about 5° to about 85°, preferably, from about 10° to about 45°, and more preferably, from about 15° to about 35°. Each passageway of the plurality of passageways may provide an obscured flow path for the second process gas into the outer region. In one example, the cooling assembly may have about 36 passageways.

In another embodiment, a lid assembly for conducting a vapor deposition process within a process chamber is provided which includes an insulation cap and a plasma screen. In one example, the insulation cap has a centralized channel configured to flow a first process gas from an upper surface to an expanded channel and an outer channel configured to flow a second process gas from an upper surface to a groove which is encircling the expanded channel. In one example, the plasma screen has an upper surface containing an inner area with a plurality of holes and an outer area with a plurality of slots. The insulation cap may be positioned on top of the plasma screen to form a centralized gas region with the expanded channel and a circular gas region with the groove.

In another example, an insulating cap is positioned above the plasma screen. The insulating cap contains at least two gas passageways, such that a first gas passageway is positioned to direct the first process gas to an inner region of the plasma screen and a second gas passageway is positioned to direct the second process gas to an outer region of the plasma screen. The insulating cap contains an electrically insulating material, such as a ceramic material, a quartz material or a derivative thereof.

In another example, a gas manifold is disposed above the insulating cap and contains at least two gas passageways. A first gas passageway is positioned to provide the first process gas to the insulating cap and a second gas passageway is positioned to provide the second process gas to the insulating cap. A first conduit and a second conduit may be coupled to the first gas passageway and are positioned to provide the first process gas a gas flow in a circular direction. The first conduit and the second conduit are independently positioned to direct gas at an inner surface of the first gas passageway. The gas flow usually has the circular direction with a geometry of a vortex, a helix, a spiral, a swirl, a twirl, a twist, a coil, a corkscrew, a curl, a whirlpool, or derivatives thereof. The first conduit and the second conduit are independently positioned at an angle from a center axis of the first gas passageway. The angle may be greater than 0°, preferably, greater than about 20°, and more preferably, greater than about 35°. A valve may be coupled between the first conduit and a precursor source to enable an ALD process with a pulse time of about 10 seconds or less, preferably, about 6 seconds or less, and more preferably, about 1 second or less, such as within a range from about 0.01 seconds to about 0.5 seconds.

In another example, a capping assembly for conducting a vapor deposition process within a process chamber is provided which includes an insulation cap containing an upper surface configured to receive a grounded gas manifold, a first channel configured to flow a first process gas from the upper surface to a lower surface of the insulation cap and a second channel configured to flow a second process gas from the upper surface to the lower surface. The lower surface may further contain an inner region and an outer region, such that the first channel is in fluid communication with the inner region and the second channel is in fluid communication with the outer region. In one example, the inner region contains an expanding channel. The expanding channel may have an inner diameter within a range from about 0.5 cm to about 7 cm, preferably, from about 0.8 cm to about 4 cm, and more preferably, from about 1 cm to about 2.5 cm. Also, the expanding channel may contain an outer diameter within a range from about 2 cm to about 15 cm, preferably, from about 3.5 cm to about 10 cm, and more preferably, from about 4 cm to about 7 cm.

In another example, a plasma screen assembly for receiving a process gas within a plasma-enhanced vapor deposition chamber is provided which includes a plasma screen containing an upper surface to receive gases and a lower surface to emit the gases, an inner area on the upper surface for receiving a first process gas, wherein the inner area contains a first plurality of openings configured to flow the first process gas from above the upper surface to below the lower surface, and an outer area on the upper surface for receiving the second process gas, wherein the outer area contains a second plurality of openings configured to flow the second process gas from above the upper surface to below the lower surface. The inner area further contains a zone free of the plurality of openings and a first flow pattern of the first process gas is directional at a line-of-sight to the zone, so to be directional obscure to the plurality of openings.

In another example, the plasma screen assembly contains an inner area for receiving the first process gas and an outer area for receiving the second process gas. The inner area of the plasma screen assembly contains a plurality of holes for directing the first process gas to the plasma baffle assembly. Each hole may have a diameter within a range from about 0.5 mm to about 5 mm preferably, from about 1 mm to about 3 mm, such as about 1.5 mm. The outer area of the plasma screen contains a plurality of slots for directing the second process gas into the second gas region. The slots may be parallel or substantially parallel to a substrate receiving surface or the slots may be perpendicular or substantially perpendicular to the plurality of holes within the first area of the plasma screen. Each slot may have a width within a range from about 0.20 mm to about 0.80 mm, preferably, from about 0.40 mm to about 0.60 mm, such as about 0.51 mm. The plasma screen assembly contains at least about 10 slots, preferably about 36 slots or more. Also, the plasma screen assembly is formed from an electrically insulating material, such as a ceramic material, a quartz material or a derivative thereof.

In another example, a plasma screen assembly for receiving a process gas within a plasma-enhanced vapor deposition chamber is provided which includes an upper surface to receive gases and a lower surface to emit the gases. An inner area on the upper surface for receiving a first process gas contains a first plurality of openings configured to flow the first process gas from above the upper surface to below the lower surface. An outer area on the upper surface for receiving the second process gas contains a second plurality of openings configured to flow the second process gas from above the upper surface to below the lower surface.

Embodiments of the invention also provide a method for forming a material on a substrate during a thermal ALD process and a PE-ALD process. In another embodiment, a method is provided which includes flowing at least one process gas through at least one conduit to form a circular gas flow pattern, exposing a substrate to the circular gas flow pattern, sequentially pulsing at least one chemical precursor into the process gas and igniting a plasma from the process gas to deposit a material on the substrate. In one example, the circular gas flow pattern has circular geometry of a vortex, a helix, a spiral, a swirl, a twirl, a twist, a coil, a corkscrew, a curl, a whirlpool, or derivatives thereof. Materials that may be deposited by the method include ruthenium, tantalum, tantalum nitride, tungsten, or tungsten nitride.

In another example, a method for depositing a material on a substrate is provided which includes positioning a substrate on a substrate support within a process chamber containing a chamber lid assembly, flowing at least one carrier gas through at least one conduit to form a circular gas flow pattern, exposing the substrate to the circular gas flow pattern, pulsing at least one precursor into the at least one carrier gas and depositing a material containing at least one element from the at least one precursor onto the substrate. The chamber lid assembly may contain a showerhead assembly having an inner region and an outer region, a plasma screen disposed above the showerhead assembly and configured to direct a first process gas to the inner region and a second process gas to the outer area, a first gas region located above the inner region and between the showerhead assembly and the plasma screen and a second gas region located above the outer region.

In another example, a method for depositing a material on a substrate is provided which includes positioning a substrate on a substrate support within a process chamber containing a gas delivery system capable of forming a gas flow in a circular direction, flowing at least one carrier gas into the process chamber to form a circular gas flow pattern and exposing the substrate to the circular gas flow pattern during a plasma-enhanced atomic layer deposition process comprising sequentially igniting a plasma and pulsing at least one precursor into the at least one carrier gas to deposit a material onto the substrate.

In another example, a method for forming a ruthenium material on a substrate is provide which includes positioning a substrate within a plasma-enhanced process chamber containing a showerhead, a plasma baffle and a plasma screen and exposing the substrate sequentially to a pyrrolyl ruthenium precursor and a reagent during an ALD process while forming a ruthenium material on the substrate. The pyrrolyl ruthenium precursor contains ruthenium and at least one pyrrolyl ligand with the chemical formula of:

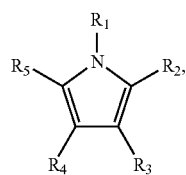

wherein $R_1$, $R_2$, $R_3$, $R_4$ and $R_5$ are each independently selected from hydrogen or an organic group, such as methyl, ethyl, propyl, butyl, amyl, derivatives thereof or combinations thereof. In one example, each $R_2$, $R_3$, $R_4$ and $R_5$ is either a hydrogen group or a methyl group. In another example, each $R_2$ and $R_5$ is a methyl group or an ethyl group.

The method further provides that the pyrrolyl ruthenium precursor may contain a first pyrrolyl ligand and a second pyrrolyl ligand, such that the first pyrrolyl ligand may be the same as or different than the second pyrrolyl ligand. Alternatively, the pyrrolyl ruthenium precursor may contain a first pyrrolyl ligand and a dienyl ligand. For example, the pyrrolyl ruthenium precursor may be a pentadienyl pyrrolyl ruthenium precursor, a cyclopentadienyl pyrrolyl ruthenium precursor, an alkylpentadienyl pyrrolyl ruthenium precursor or an alkylcyclopentadienyl pyrrolyl ruthenium precursor. Therefore, the method provides that the pyrrolyl ruthenium precursor may be an alkyl pyrrolyl ruthenium precursor, a bis(pyrrolyl) ruthenium precursor, a dienyl pyrrolyl ruthenium precursor, or derivatives thereof. Some exemplary pyrrolyl ruthenium precursors include bis(tetramethylpyrrolyl) ruthenium, bis(2,5-dimethylpyrrolyl) ruthenium, bis(2,5-diethylpyrrolyl) ruthenium, bis(tetraethylpyrrolyl) ruthenium, pentadienyl tetramethylpyrrolyl ruthenium, pentadienyl 2,5-dimethylpyrrolyl ruthenium, pentadienyl tetraethylpyrrolyl ruthenium, pentadienyl 2,5-diethylpyrrolyl ruthenium, 1,3-dimethylpentadienyl pyrrolyl ruthenium, 1,3-diethylpentadienyl pyrrolyl ruthenium, methylcyclopentadienyl pyrrolyl ruthenium, ethylcyclopentadienyl pyrrolyl ruthenium, 2-methylpyrrolyl pyrrolyl ruthenium, 2-ethylpyrrolyl pyrrolyl ruthenium, and derivatives thereof.

In another example, a method for forming a ruthenium material on a substrate is provide which includes positioning a substrate within a plasma-enhanced process chamber containing a showerhead, a plasma baffle and a plasma screen and exposing the substrate sequentially to an active reagent and a pyrrolyl ruthenium precursor during a PE-ALD process. Although a plasma may be ignited during any time period of the PE-ALD process, preferably, the plasma is ignited while the reagent is exposed to the substrate. The plasma activates the reagent to form an active reagent. Examples of an active reagent include an ammonia plasma, a nitrogen plasma and a hydrogen plasma. One embodiment of the PE-ALD process provides that the plasma is generated external from the process chamber, such as by a remote plasma generator (RPS) system. However, a preferred embodiment of the PE-ALD process provides that the plasma is generated in situ by a plasma capable process chamber utilizing a radio frequency (RF) generator.

In another example, a method for forming a ruthenium material on a substrate is provide which includes positioning a substrate within a plasma-enhanced process chamber containing a showerhead, a plasma baffle and a plasma screen and exposing the substrate sequentially to a reagent and a pyrrolyl ruthenium precursor during a thermal-ALD process. The ruthenium material may be deposited on a barrier layer (e.g., copper barrier) or dielectric material (e.g., low-k) disposed on the substrate during the various ALD processes described herein. The barrier layer may contain a material that includes tantalum, tantalum nitride, tantalum silicon nitride, titanium, titanium nitride, titanium silicon nitride, tungsten or tungsten nitride. In one example, the ruthenium material is deposited on a tantalum nitride material previously formed by an ALD process or a PVD process. The dielectric material may include silicon dioxide, silicon nitride, silicon oxynitride, carbon-doped silicon oxides or a $SiO_xC_y$ material.

A conductive metal may be deposited on the ruthenium material. The conductive material may contain copper, tungsten, aluminum, an alloy thereof or a combination thereof. In one aspect, the conductive metal may be formed as one layer during a single deposition process. In another aspect, the conductive metal may be formed as multiple layers, each deposited by an independent deposition process. In one embodiment, a seed layer is deposited on the ruthenium material by an initial deposition process and a bulk layer is subsequently deposited thereon by another deposition process. In one example, a copper seed layer is formed by an electroless deposition process, an electroplating (ECP) process or a PVD process and a copper bulk layer is formed by an electroless deposition process, an ECP process or a CVD process. In another example, a tungsten seed layer is formed by an ALD process or a PVD process and a tungsten bulk layer is formed by a CVD process or a PVD process.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1G illustrate schematic views of a process chamber as described in an embodiment herein;

FIGS. 2A-2B illustrate a schematic view of an isolation ring as described in an embodiment herein;

FIGS. 3A-3B illustrate schematic views of a showerhead as described in an embodiment herein;

FIGS. 4A-4F illustrate schematic views of a water box as described in an embodiment herein;

FIGS. 9A-9D illustrate schematic views of a gas flows described in an embodiment herein.

DETAILED DESCRIPTION OF THE PREFERRED EMBODIMENT

Embodiments of the invention provide an apparatus configured to deposit a material during a thermal atomic layer deposition (ALD) process, or preferably, during a plasma-enhance ALD (PE-ALD) process. Other embodiments of the invention provide processes for forming the material within the process chamber. In one embodiment, a process chamber is configured to perform a PE-ALD process and has multiple components that are electrically insulated, electrically grounded or RF hot. In one example, a chamber body and gas manifold assembly are grounded and separated by electrically insulated components, such as an isolation ring, a plasma screen insert and an insulation cap. A showerhead, a plasma baffle and a water box are disposed between the electrically insulated components and are RF hot when activated by a plasma generator.

Hardware

Figure 1A:
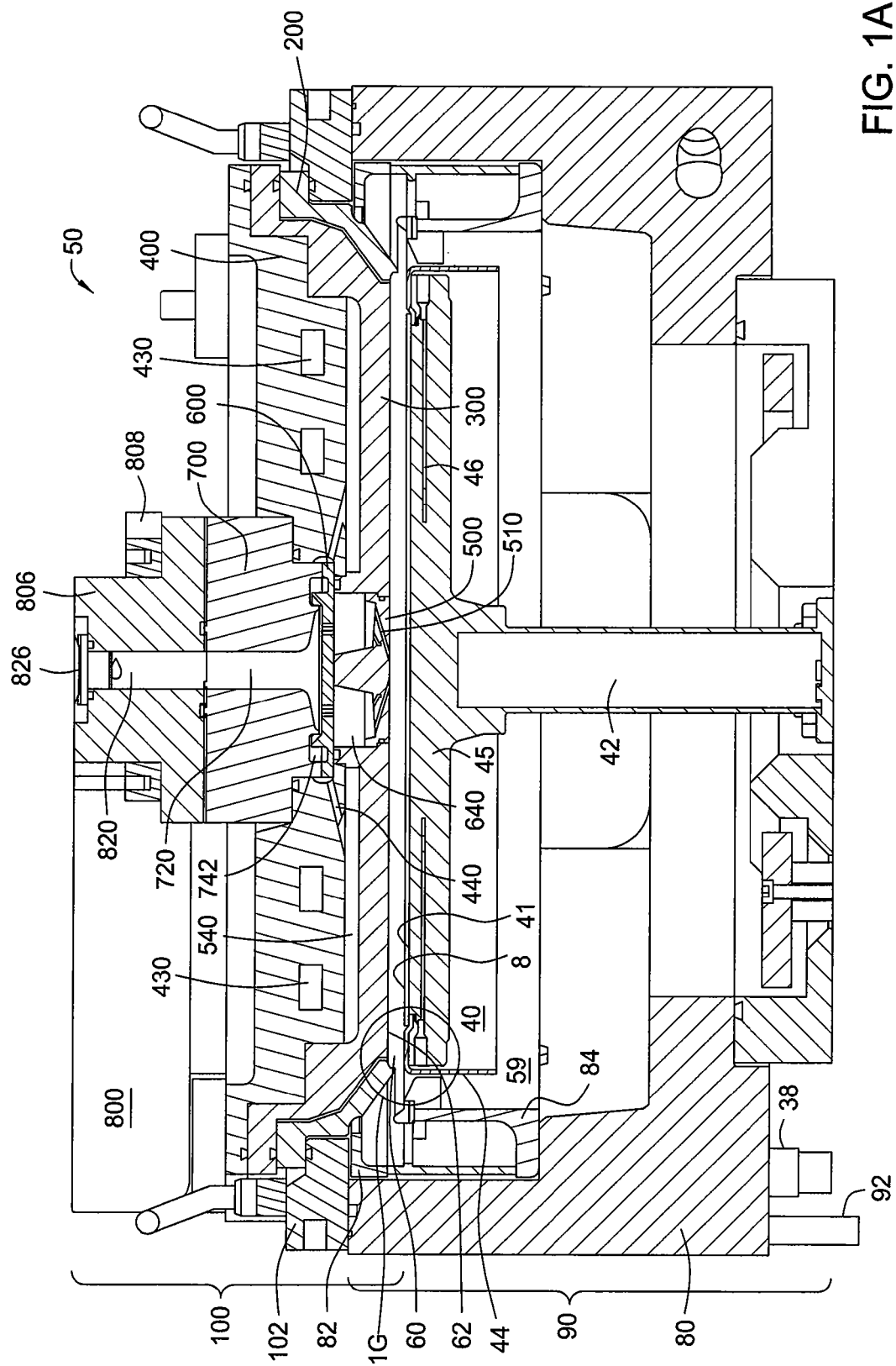

FIGS. 1A-1G illustrate schematic views of lid assembly 100 that may be used to perform a variety of ALD processes. In one embodiment, process chamber 50 may be used to form materials on substrate 8 during a thermal ALD process or a PE-ALD process. FIG. 1A depicts a schematic cross-sectional view of process chamber 50 that may be used to perform integrated circuit fabrication. Process chamber 50 contains lid assembly 100 attached to chamber body assembly 90. Process region 60 for substrate processing is formed and generally situated between lid assembly 100 and chamber body assembly 90, and more specifically, just above support surface 41 of substrate support 40 and substrate 8 and just below upper surface 62. In one embodiment, the chamber spacing between upper surface 62 and support surface 41 is within a range from about 0.50 mm to about 50.00 mm, preferably, from about 1.00 mm to about 12.00 mm, and more preferably, from about 4.00 mm to about 8.00 mm, such as 5.84 mm (0.230 in). The spacing may vary depending on the gases being delivered and the process conditions during a deposition process.

Substrate support 40 contains edge ring 44 and heating element 45 (FIGS. 1A and 1G). Heating element 45 is embedded within substrate support 40. Edge ring 44 is circumferentially disposed around substrate support 40 and over an upper portion of substrate support 40. Inner edge rings 48a, 48b and 48c are situated on heating element 45 and below the segment of edge ring 44 which covers the upper portion of substrate support 40. Edge ring 44 may be used as a purge ring by allowing an edge purge gas to flow from substrate support 40, through gap 47, between inner edge rings 48a, 48b and 48c, edge ring 44 and heating element 45 and over the edge of substrate 8 (FIG. 1G). The flow of the edge purge gas prevents reactive process gasses from diffusing into heating element 45.

Choke gap 61 is a circumferential gap or space formed between edge ring 44 and upper surface 62, more specifically, between the top edge surface of edge ring 44 and lower surface 202d of isolation ring 200. Choke gap 61 also helps provide a more uniform pressure distribution within process region 60 by partially separating process region 60 from the non-uniform pressure distribution of interior chamber region 59. Choke gap 61 may be varied depending on the process conditions and the required pumping efficiency. The pumping efficiency during a deposition process may be controlled by adjusting choke gap 61. Choke gap 61 is increased by lowering substrate support 40 or decreased by raising substrate support 40. The pumping conductance from the pumping port 38 in the lower portion of process chamber 50 to the center of channel 820 is modified by changing the distance of choke gap 61 to control the thickness and the uniformity of a film during deposition processes described herein. In one embodiment, the spacing of upper choke gap 61 is within a range from about 0.50 mm to about 50.00 mm, preferably, from about 1.00 mm to about 5.00 mm, and more preferably, from about 2.5 mm to about 4 mm, such as 3.30 mm (0.130 in).

In one embodiment, the pressure differentials of the pumping conductance may be controlled in order to reduce or eliminate the formation of secondary plasmas. Since the generation and sustainability of a plasma is ion concentration dependant, the pressure within a particular region may be reduced to minimize the ion concentration. Therefore, a secondary plasma may be avoided within a desired region of the process chamber. In a preferred embodiment, process chamber 50 is configured to conduct a PE-ALD process. Therefore, various regions and components throughout process chamber 50 are electrically insulated, electrically grounded or RF hot.

In one example, chamber body 80 and gas manifold assembly 800 are grounded and separated by electrically insulated isolation ring 200, plasma screen insert 600 and insulation cap 700. Therebetween the electrically insulated components, showerhead 300, plasma baffle insert 500 and water box 400 are RF hot when activated upon by plasma generator system 92 (FIG. 1E). Process chamber 50 also contains insulator ring liner 82, chamber liner 84 and other insulation liners to minimize or completely eliminate any line-of-sight between upper surface 62 and the various surfaces of chamber body assembly 90. The insulation liners help minimize or eliminate plasma erosion of the metallic surfaces of chamber body assembly 90. Therefore, substrate support 40 and a wafer contained thereon are a grounded path from RF powered showerhead 300 while generating a plasma.

Referring to FIG. 1A, in one aspect, since process region 60 is isolated from interior chamber region 59, a reactant gas or purge gas needs only adequately fill process region 60 to ensure sufficient exposure of substrate 8 to the reactant gas or purge gas. In a conventional chemical vapor deposition process, process chambers are required to provide a combined flow of reactants simultaneously and uniformly to the entire substrate surface in order to ensure that the co-reaction of the reactants occurs uniformly across the surface of substrate 8. During an ALD process, process chamber 50 is used to sequentially expose substrate 8 to chemical reactants, such as a gas or a plasma, that adsorb or react as thin layers onto the surface of substrate 8. As a consequence, an ALD process does not require a flow of a reactant to simultaneously reach the surface of substrate 8. Instead, a flow of a reactant needs to be provided in an amount which is sufficient to adsorb a thin layer of the reactant on the surface of substrate 8 or in an amount which is sufficient to react with an adsorbed layer on the surface of substrate 8.

Since process region 60 may comprise a smaller volume when compared to the inner volume of a conventional CVD chamber, a smaller amount of gas is required to fill process region 60 for a particular process in an ALD sequence. Since interior chamber region may have a volume of about 20 L, process region 60 is separated from interior chamber region 59 to have a smaller volume, such as about 3 L or less, preferably, about 2 L or less, and more preferably, about 1 L or less. In an embodiment for a chamber adapted to process 200 mm diameter substrates, the volume of process region 60 is about 1,000 $cm^3$ or less, preferably, about 500 $cm^3$ or less, and more preferably, about 200 $cm^3$ or less. In an embodiment for a chamber adapted to process 300 mm diameter substrates, the volume of process region 60 is about 3,000 $cm^3$ or less, preferably, about 1,500 $cm^3$ or less, and more preferably, about 1,000 or less, such as about 800 $cm^3$ or less. In one example of a chamber adapted to process 300 mm diameter substrates, process region 60 has a volume of about 770 $cm^3$ or less. In another embodiment, substrate support 40 may be raised or lowered to adjust the volume of process region 60. For example, substrate support 40 may be raised to form process region 60 having a volume of about 770 $cm^3$ or less. The smaller volume of process region 60 requires less gas (e.g., process gas, carrier gas or purge gas) to be flowed into process chamber 50 during a process. Therefore, the throughput of process chamber 50 is greater since less time is needed to provide and remove gases and the operation cost is reduced since the waste of chemical precursors and other gases may be minimized due to the smaller amount of the gases.

Figure 1B:
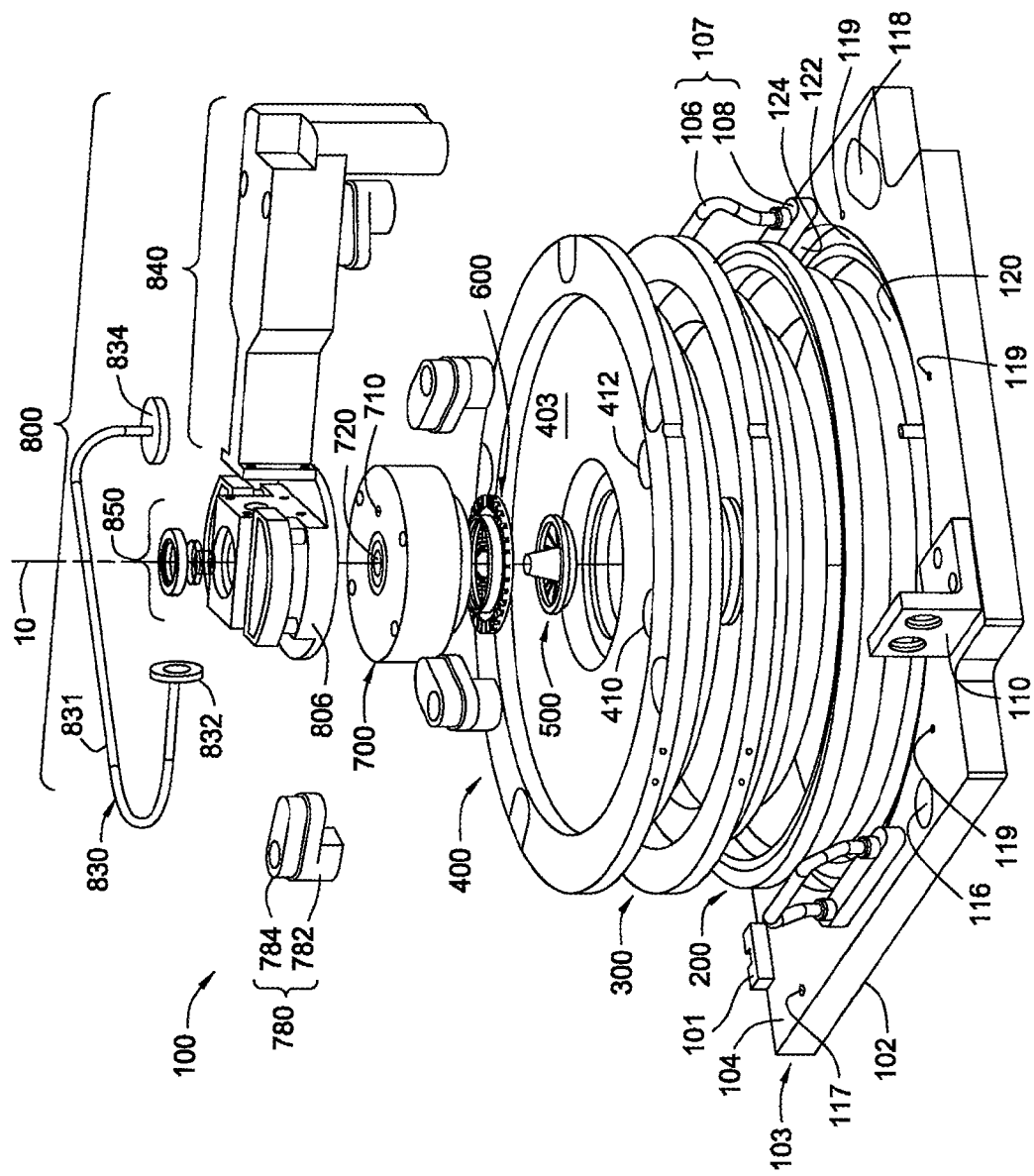

FIG. 1B further illustrates an exploded view of lid assembly 100 and components thereof. Lid support 103 having lower surface 102 and upper surface 104 may be formed from a variety of materials including a metal. Preferably, lid support 103 is formed from a metal, such as aluminum, steel, stainless steel (e.g., iron-chromium alloys optionally containing nickel), iron, nickel, chromium, an alloy thereof or combinations thereof. Lid assembly 100 may be attached to chamber body assembly 90 by hinges (not shown). Alignment slots 101 on lid support 103 are positioned to be aligned with a post (not shown) attached to chamber body assembly 90, once lid assembly is in a closed position. Lid support 103 also contains support bracket 110 and handle assembly 107 mounted on upper surface 104. Handle assembly 107 may contain thermal isolator 108 between handle 106 positioned on upper surface 104. Also, lid assembly 100 has opening 120 with ledge surface 122 and wall surface 124. Multiple holes and openings, such as ports 116, 117 and 118, may also pass through lid support 103 and may provide a passageway for conduit, tubing, hosing, fasteners, instruments and other devices. Lid support 103 further contains holes that may not pass through. For example, holes 119 may be threaded and used to receive a fastener, such as a screw or a bolt.

Lid assembly 100 further contains isolation ring 200, showerhead 300, water box 400, plasma baffle insert 500, plasma screen insert 600, insulation cap 700 and gas manifold assembly 800. Each component (i.e., isolation ring 200, showerhead 300, water box 400, plasma baffle insert 500, plasma screen insert 600, insulation cap 700 or gas manifold assembly 800) of lid assembly 100 may be scaled to process a substrate of varying size, such as a wafer with a 150 mm diameter, a 200 mm diameter, a 300 mm diameter or larger. Also, each component may be positioned and secured on lid support 103 by clips 780. Clip 780 latches over upper surface 404 of water box 400 and is secured by a fastener placed through holes 119 (FIGS. 1A-1G). In one example, clip 780 contains metal clip segment 784 disposed on insulator segment 782. Insulator segment 782 may be formed from an electrically insulating material, a thermally insulating material or a combination thereof. Insulator segments 782 provide electrical and thermal isolation between upper surface 404 and lid support 103 while clips 780 secure the various components of lid assembly 100. Axis 10 pass through the center of lid assembly 100 including, once aligned, opening 120 of lid support 103 and opening 220 of isolation ring 200, opening 320 of showerhead 300, opening 420 of water box 400, conical nose 520 of plasma baffle insert 500, center portion 601 of plasma screen insert 600, channel 720 of insulation cap 700 and channel 820 of gas manifold assembly 800.

Figure 1C:
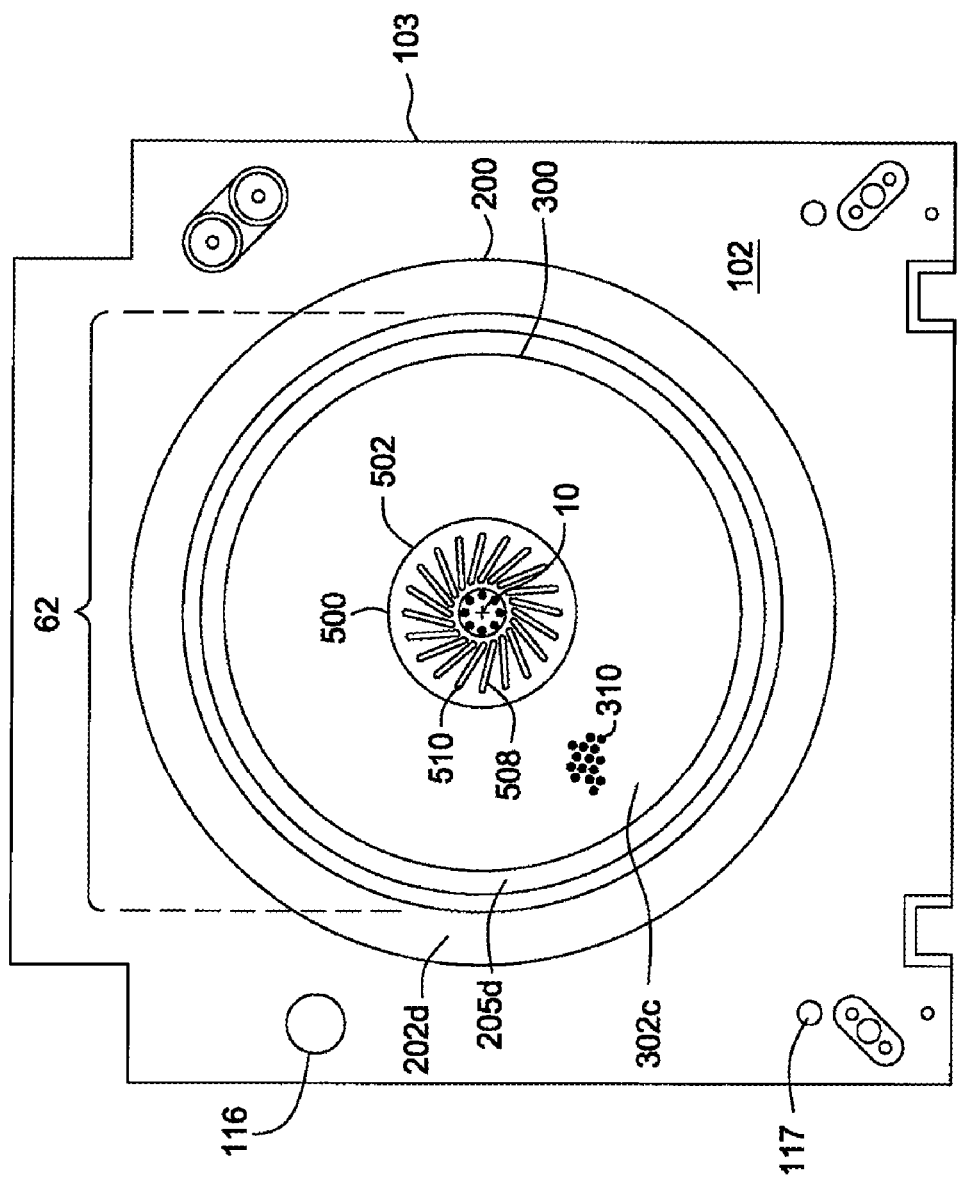

FIG. 1C depicts a view from underneath lid assembly 100, down axis 10, to illustrate upper surface 62 and lower surface 102 of lid support 103. Upper surface 62 of process region 60 is formed collectively of lower surfaces 202d and 205d of isolation ring 200, lower surface 302c of showerhead 300 and lower surface 502 of plasma baffle insert 500. Substrate 8 is positioned below upper surface 62 within process region 60 and exposed to process gases during a deposition process. In one embodiment, the substrate is sequentially exposed to at least two process gases (e.g., gas or plasma) during an ALD process. In one example of an ALD process, substrate 8 is exposed to a first process gas coming from slots 510 of plasma baffle insert 500 and to a second process gas coming from holes 310 of showerhead 300.

A view along axis 10 further illustrates that although opening 508 of slot 510 is visible on lower surface 502, the other end of slot 510 (e.g., opening 506 on upper surface 503, FIG. 5C) is not visible. This obscured view down axis 10 is due to the angle of slots 510 (angle $\alpha_1$ in FIG. 5B) that depict a pathway between process region 60 and gas region 640 above plasma baffle insert 500 does not have a line-of-sight. The obscured pathway has many advantages over a non-obscured pathway having a line-of-sight between process region 60 and gas region 640 including a reduction or absence of a secondary plasma within or above plasma baffle insert 500.

"Line-of-sight" as used herein refers to a straight path or a substantially straight path between two points. The straight path or the substantially straight path may provide an unobstructed pathway or an unobscured pathway for a gas or a plasma to flow between at least two points. Generally, an obstructed pathway or an obscured pathway prohibits or substantially reduces the passage of a plasma while permitting the passage of a gas. Therefore, a line-of-sight pathway usually permits the passage of a gas or a plasma, while a pathway not have a line of sight between two points prohibits or substantially reduces the passage of a plasma and permits the passage of a gas.

In one embodiment, a portion of upper surface 62, namely lower surface 302c and lower surface 502, may be roughened (e.g., machined) to produce more surface area across upper surface 62. The increased surface area of upper surface 62 may increase adhesion of accumulated material during a deposition process, while decreasing contaminants due to the flaking of the accumulated material. In one example, the mean roughness ($R_a$) of each lower surface 302c and lower surface 502 independently may be at least about 15 microinch (about 0.38 μm), preferably, about 100 microinch (about 2.54 μm), and more preferably, about 200 microinch (about 5.08 μm) or higher. Lower surface 102 of lid support 103 may also be roughened to have a roughness of at least about 15 microinch (about 0.38 μm), preferably, at least about 50 microinch (about 1.27 μm), for example, about 54 microinch (about 1.37 μm).

Figure 1D:
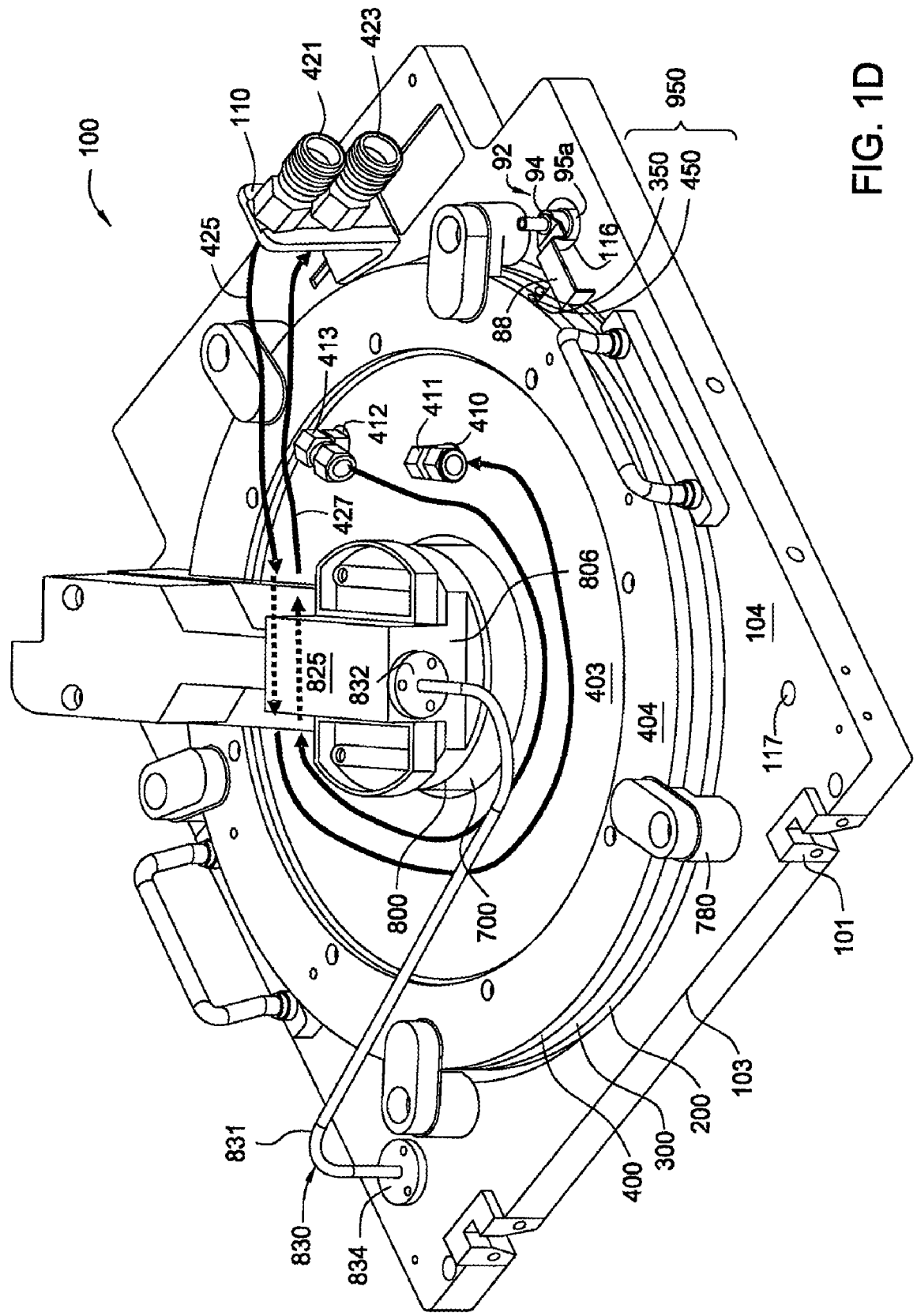
Figure 1E:
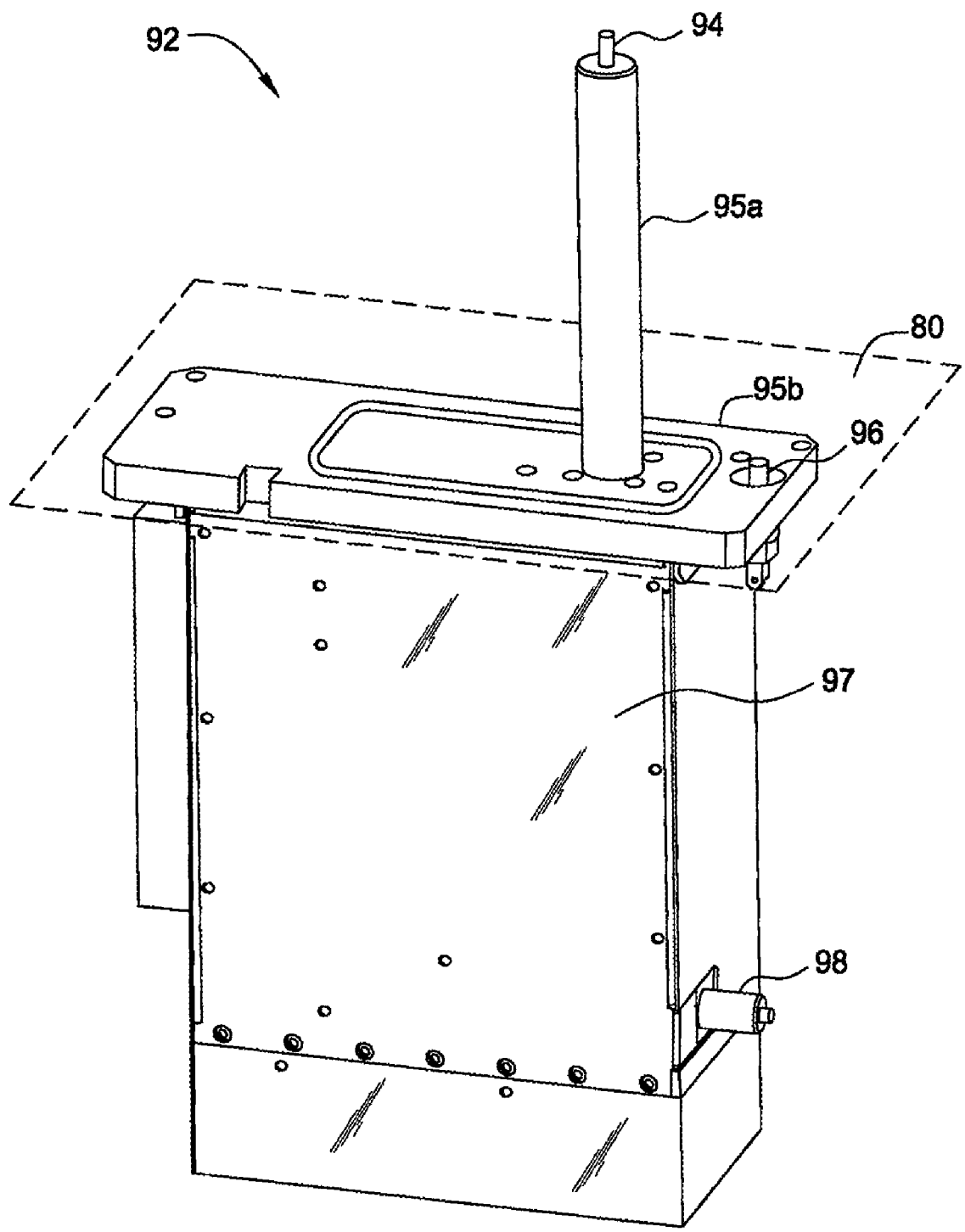

FIGS. 1B and 1D further illustrates gas manifold assembly 800 containing conduit assembly 840, manifold cap assembly 850 and gas conduit assembly 830. Manifold cap assembly 850 may have viewing window assembly 826 for observing ignited plasma (FIG. 1A). Alternatively, manifold cap assembly 850 may contain surface 825 which lacks a viewing window (FIG. 1D). Gas conduit assembly 830 may be connected to and in fluid communication with port 117 at flange 834 while extended to be connected to and in fluid communication with gas inlet 813 on manifold block 806 (FIGS. 1D and 8D).

In one embodiment, plasma generator system 92 is attached to lid assembly 100 by RF strap 88 (FIG. 1D). A portion of plasma generator system 92, namely RF stinger 94 and insulator 95a, protrudes through port 116 on lid support 103 and couples to showerhead 300 and water box 400. Insulator 95a maintains RF stinger 94 electrically isolated from lid support 103 while RF strap electrically connects RF stinger 94 to region 950 containing contacts 350 and 450 on showerhead 300 and water box 400. RF stinger 94 is a conductive material, such as a metal rod or electrode, which may contain copper, brass, stainless steel, steel, aluminum, iron, nickel, chromium, alloys thereof, other conductive materials or combinations thereof.

Plasma generator system 92 further contains plasma generator 97 that may be mounted under chamber body 80 (FIG. 1E). Insulator 95b may be placed between plasma generator 97 and chamber body 80 to electrically isolate plasma generator 97. Match 96 may protrude through insulator 95b and be in electrical contact with chamber body 80. Plasma generator 97 further contains connector 98. In one example, connector 98 is an RF coaxial cable connector, such as a type N connector. Plasma generator system 92 may be operated by plasma generator controller 22 connected to signal bus system 30. In one example, process conditions of plasma generator system 92 may be set to have a chamber impendence of about 4 ohms with about 9 amperes at about 300 watts. A plasma system and a process chamber that may be used in combination with lid assembly 100 or may be used as plasma generator system 92 and chamber body assembly 90 is the TXZ® CVD, chamber available from Applied Materials, Inc., located in Santa Clara, Calif. Further disclosure of plasma systems and process chambers is described in commonly assigned U.S. Pat. Nos. 5,846,332, 6,079,356, and 6,106,625, which are incorporated herein by reference in their entirety, to provide further disclosure for a plasma generator, a plasma chamber, a vapor deposition chamber, a substrate pedestal and chamber liners.

Figure 1F:
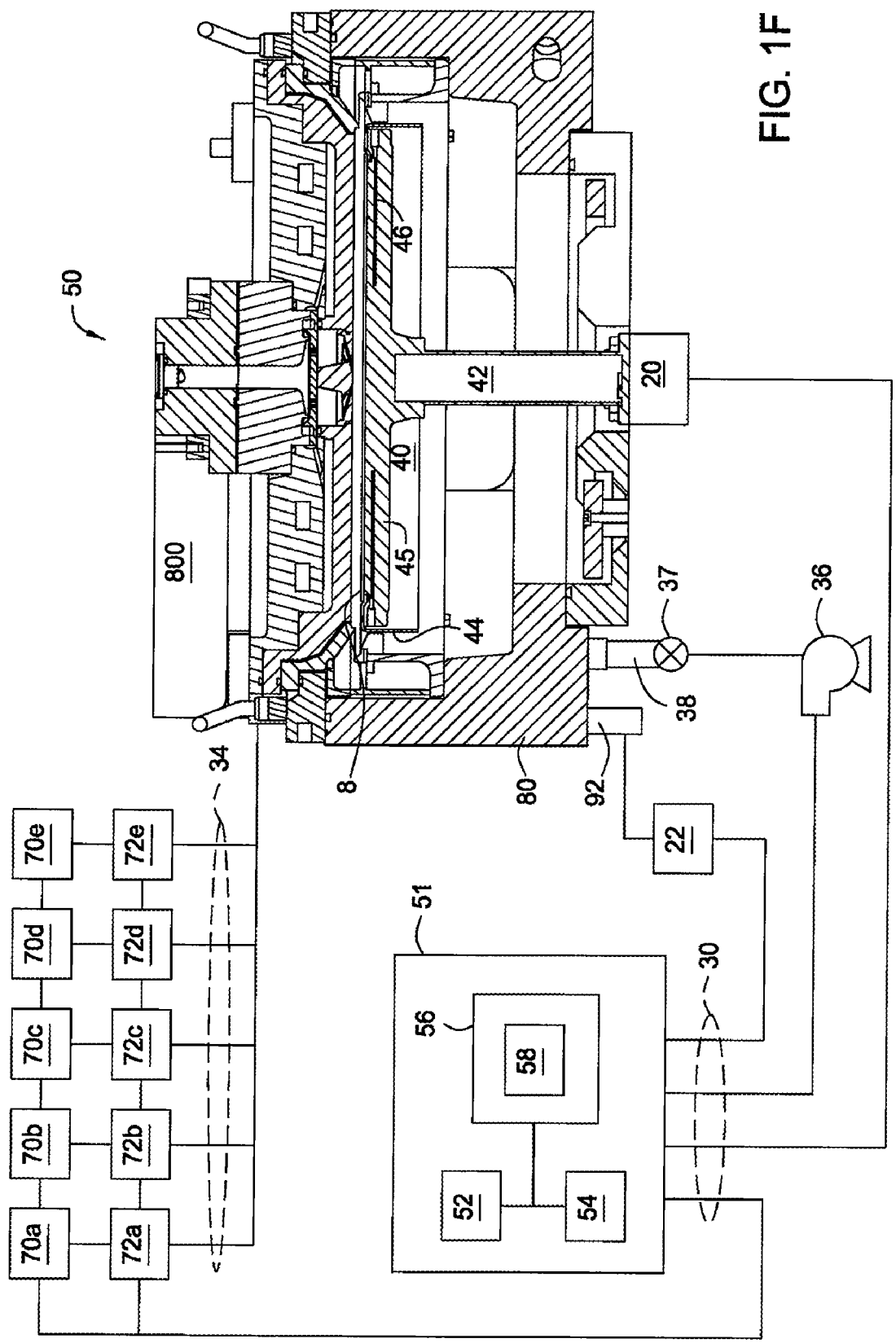

Chamber body assembly 90 of process chamber 50 contains insulator ring liner 82 that is used to reduce plasma exposure to chamber body 80 and helps ensure that plasma is confined within process region 60 (FIG. 1F). Also, chamber body assembly 90 generally houses substrate support 40 attached to post 42 within interior chamber region 59. Substrate support 40 is movable in a vertical direction inside process chamber 50 using support controller 20. In one embodiment, substrate support 40 is rotatable. Process region 60 is situated above substrate support 40 and below lid assembly 100, preferably, at least below showerhead 300, plasma baffle insert 500 and a portion of isolation ring 200.

Depending on the specific process, substrate 8 may be heated to some desired temperature prior to or during a pre-treatment step, a deposition step, post-treatment step or other process step used during the fabrication process. For example, substrate support 40 may be heated using embedded heating element 45. Substrate support 40 may be resistively heated by applying an electric current from AC power supply to heating element 45. Substrate 8 is, in turn, heated by substrate support 40. Alternatively, substrate support 40 may be heated using radiant heaters such as, for example, lamps (not shown).

Temperature sensor 46, such as a thermocouple, is also embedded in substrate support 40 to monitor the temperature of substrate support 40 in a conventional manner. The measured temperature is used in a feedback loop to control AC power supply for heating element 45, such that the temperature of substrate 8 may be maintained or controlled at a desired temperature which is suitable for the particular process application. Substrate lift pins (not shown) may also be embedded in substrate support 40 and are used to raise substrate 8 from support surface 41.

Vacuum pumping system 36 is used to evacuate and to maintain the pressure inside process chamber 50 (FIG. 1F). Vacuum pumping system 36 may be connected to process chamber 50 by pumping port 38 and valve 37. Gas manifold assembly 800, through which process gases are introduced into process chamber 50, is located above substrate support 40. Gas manifold assembly 800 may be connected to a gas panel, which controls and supplies various process gases to process chamber 50.

Gas sources 70a, 70b, 70c, 70d, and 70e provide precursor gas, carrier gas or purge gas to process chamber 50 through conduit system 34. Gas sources 70a, 70b, 70c, 70d and 70e may be directly or indirectly connected to a chemical supply or a gas supply. The chemical or gas supplies include a tank, an ampoule, a bubbler, a vaporizer or another container used to store, transfer or form a chemical precursor. The chemical or gas supply may also be from an in-house source. Proper control and regulation of the gas flows from gas sources 70a, 70b, 70c, 70d, and 70e to gas manifold assembly 800 are performed by valve assemblies 72a, 72b, 72c, 72d and 72e coupled to control unit 51. Gas manifold assembly 800 allows process gases to be introduced into process chamber 50 and may optionally be heated to prevent condensation of any gases within the conduits or lines of gas manifold assembly 800.

Each valve assembly 72a, 72b, 72c, 72d and 72e may comprise a diaphragm and a valve seat. The diaphragm may be biased open or closed and may be actuated closed or open respectively. The diaphragms may be pneumatically actuated or may be electrically actuated. Examples of pneumatically actuated valves are available from Fujikin and Veriflow and examples of electrically actuated valves are available from Fujikin. Control unit 51 may be coupled to valve assemblies 72a, 72b, 72c, 72d and 72e to control actuation of the diaphragms of the valves. Pneumatically actuated valves may provide pulses of gases in time periods as low as about 0.020 seconds. Electrically actuated valves may provide pulses of gases in time periods as low as about 0.005 seconds. Generally pneumatically and electrically actuated valves may provide pulses of gases in time periods as high as about 3 seconds. Although higher time period for gas pulsing is possible, a typical ALD process utilizes ALD valves to generate pulses of gas while being opened for an interval of about 5 seconds or less, preferably about 3 seconds or less, and more preferably about 2 seconds or less. In one embodiment, an ALD valve pulses for an interval in a range from about 0.005 seconds to about 3 seconds, preferably from about 0.02 seconds to about 2 seconds and more preferably from about 0.05 seconds to about 1 second. An electrically actuated valve typically requires the use of a driver coupled between the valve and control unit 51. In another embodiment, each valve assemblies 72a, 72b, 72c, 72d and 72e may contain a mass flow controller (MFC) to control gas dispersion, gas flow rates and other attributes to an ALD pulse sequence.

A precursor or a gas delivery system within an ALD apparatus is used to store and dispense chemical precursors, carrier gases, purge gases or combinations thereof. The delivery system may contain valves (e.g., ALD valves or MFCs), conduits, reservoirs, ampoules and bubblers, heater and/or control unit systems, which may be used with process chamber 50 or lid assembly 100 and coupled in fluid communication with gas manifold 800 or conduit system 34. In one example, a delivery system may contain gas sources 70a-70e and valve assemblies 72a, 72b, 72c, 72d, and 72e coupled to control unit 51. Delivery systems configured for an ALD process system are described in commonly assigned and co-pending U.S. Ser. No. 11/127,753, entitled "Apparatus and Methods for Atomic Layer Deposition of Hafnium-Containing High-k Materials," filed May 12, 2005, and published as US 2005-0271812, U.S. Ser. No. 11/119,388, entitled "Control of Gas Flow and Delivery to Suppress the Formation of Particle in an MOCVD/ALD System," filed Apr. 29, 2005, and published as US 2005-0252449, U.S. Ser. No. 10/281,079, entitled "Gas Delivery Apparatus for Atomic Layer Deposition," filed Oct. 25, 2002 and published as US 2003-0121608, and U.S. Ser. No. 10/700,328, entitled "Precursor Delivery System with Rate Control," filed Nov. 3, 2003 and published as US 2005-009859, which are incorporated herein by reference in their entirety.

Control unit 51, such as a programmed personal computer, work station computer, or the like, may be coupled to process chamber 50 to control processing conditions. For example, control unit 51 may be configured to control flow of various process gases and purge gases from gas sources 70a-70e through valve assemblies 72a-72e during different stages of a substrate process sequence. Illustratively, control unit 51 comprises central processing unit (CPU) 52, support circuitry 54, and memory 56 containing associated control software 58.

Software routines, as required, may be stored in memory 56 or executed by a remotely located source (e.g., computer or server). The software routines are executed to initiate process recipes or sequences. The software routines, when executed, transform the general purpose computer into a specific process computer that controls the chamber operation during a chamber process. For example, software routines may be used to precisely control the activation of gas sources 70a-70e through valve assemblies 72a-72e during the execution of process sequences according to the embodiments described herein. Alternatively, the software routines may be performed in the hardware, as an application specific integrated circuit or other type of hardware implementation or a combination of software or hardware.

Control unit 51 may be one of any form of general purpose computer processor that can be used in an industrial setting for controlling various chambers and sub-processors. CPU 52 may use any suitable memory 56, such as random access memory, read only memory, floppy disk drive, compact disc drive, hard disk or any other form of digital storage, local or remote. Various support circuits may be coupled to the CPU 52 for supporting process chamber 50. Control unit 51 may be coupled to another controller that is located adjacent individual chamber components, such as programmable logic controllers of valve assemblies 72a-72e. Bi-directional communications between control unit 51 and various other components of process chamber 50 are handled through numerous signal cables collectively referred to as signal buses 30, some of which are illustrated in FIG. 1F. In addition to control of process gases and purge gases from gas sources 70a-70e, valve assemblies 72a-72e and any programmable logic controllers, control unit 51 may be configured to be responsible for automated control of other activities used during a fabrication process. Control unit 51 is connected to plasma generator controller 22, vacuum pumping system 36 and support controller, including temperature monitoring and control and control of lift pins (not shown).

Isolation ring 200 contains opening 220 (FIGS. 2A-2B) and may be positioned between showerhead 300 and lid support 103 (FIGS. 1A-1B). Isolation ring 200 contains upper surface 204 to support showerhead 300. Opening 220 may be aligned with opening 120 such that axis 10 passes through each center. Isolation ring contains inner surfaces 205a, 205b, 205c and 205d that taper inward towards axis 10.

Isolation ring 200 further contains lower surfaces 202a, 202b, 202c and 202d. Lower surface 202a may be used to contact ledge surface 122 of lid support 103 while supporting isolation ring 200. Lower surfaces 202d and 205d forms process region 60 while contributing to upper surface 62 therein (FIG. 1C). The portion of upper surface 62 contributed by lower surface 202d forms an outer ring seal between process region 60 and interior chamber region 59. Isolation ring 200 may be formed from an electrically insulating material that is plasma resistant or chemical resistant against the process reagents. Isolation ring 200 may also contain a thermally insulating material. Materials useful to construct isolation ring 200 include ceramic, quartz, fused quartz, sapphire, pyrolytic boron nitride (PBN) material, glass, plastic, derivatives thereof, or combinations thereof.

Showerhead 300 contains opening 320 (FIGS. 3A-3B) and may be positioned between isolation ring 200 and water box 400 (FIG. 1A-1B). Showerhead 300 contains upper surfaces 303, 304, and 306, where upper surfaces 304 and 306 may be used to support water box 400. Wall surfaces 305a and 305b are disposed between upper surfaces 303, 304 and 306. Showerhead 300 further contains lower surfaces 302a, 302b, and 302c. Lower surface 302a may be used to contact upper surface 204 of isolation ring 200 while supporting showerhead 300. Lower surface 302c also forms process region 60 while contributing to upper surface 62 therein (FIG. 1C). Showerhead 300 may be formed from a variety of materials including a metal or another electrically conductive material. Preferably, showerhead 300 is formed from a metal, such as aluminum, steel, stainless steel, iron, nickel, chromium, an alloy thereof or combinations thereof.

Opening 320 passes through showerhead 300 and may be aligned with openings 120 and 220 such that axis 10 passes through each center (FIG. 1B). Also, opening 320 passes through ring assembly 330. Ring assembly 330 is positioned in the center of showerhead 300 and may be used to house plasma baffle insert 500. Ring assembly 330 contains ring 328 disposed above the surface of upper surface 303. Ledge 332 protrudes inwardly from ring 328 towards axis 10 and is used to support plasma baffle insert 500 thereon. Ledge 322 protrudes outwardly from ring 328 away from axis 10 and is used to support water box 400 in conjunction with upper surfaces 304 and 306. Upper surface 324 of ring 328 is used to support plasma screen insert 600.

Upper surface 303 of showerhead 300 receives a process gas for distributing into process region 60 through holes 310. Holes 310 pass through showerhead 300 from upper surface 303 to lower surface 302c and provide fluid communication therethrough. Holes 310 in showerhead 300 may have a diameter within a range from about 0.10 mm to about 1.00 mm, preferably, from about 0.20 mm to about 0.80 mm, and more preferably, from about 0.40 mm to about 0.60 mm. Showerhead 300 may have at least about 100 holes, preferably, about 1,000 holes, and more preferably, about 1,500 holes or more. Showerhead 300 may have as many as 6,000 holes or 10,000 holes depending on size of the holes 310, the distribution pattern of the holes 310, size of substrate and desired exposure rate. Holes 310 may have a varying or consistent geometry from hole to hole. In one example, showerhead 300 is constructed from metal (e.g., aluminum or stainless steel) and has 1,500 holes that are formed with a diameter of 0.50 mm.

Showerhead 300 contains opening 320 (FIG. 3) and may be positioned between isolation ring 200 and water box 400 (FIG. 1A-1B). Showerhead 300 contains upper surfaces 303, 304 and 306, where upper surfaces 304 and 306 may be used to support water box 400. Wall surfaces 305a and 305b are disposed between upper surfaces 303, 304 and 306. Showerhead 300 further contains lower surfaces 302a, 302b and 302c. Lower surface 302a may be used to contact upper surface 204 of isolation ring 200 while supporting showerhead 300. Lower surface 302c also forms process region 60 while contributing upper surface 62 therein (FIG. 1C). Showerhead 300 may be formed from a variety of materials including a metal or another electrically conductive material. Preferably, showerhead 300 is formed from a metal, such as aluminum, steel, stainless steel, iron, nickel, chromium, alloys thereof or combinations thereof.

A plurality of holes 310 are formed through showerhead 300, so that upper surface 303 is in fluid communication to lower surface 302c. Holes 310 may have a variety of sizes and be contained across upper surface 303 and lower surface 302c in multiple patterns. Each hole of the plurality of holes 310 may have a diameter within a range from about 0.10 mm to about 1.00 mm, preferably, from about 0.20 mm to about 0.80 mm, and more preferably, from about 0.40 mm to about 0.60 mm, such as about 0.51 mm (0.020 in). Showerhead 300 has at least about 100 holes, preferably, about 1,000 holes, and more preferably, about 1,500 holes or more. For example, showerhead 300 may have as many as 6,000 holes or 10,000 holes depending on size of holes 310, the pattern of the holes, size of substrate and desired exposure rate. Preferably, showerhead 300 is constructed from a metal (e.g., aluminum or stainless steel) and has 1,500 holes that are formed with a diameter of about 0.50 mm.

Figure 4A:
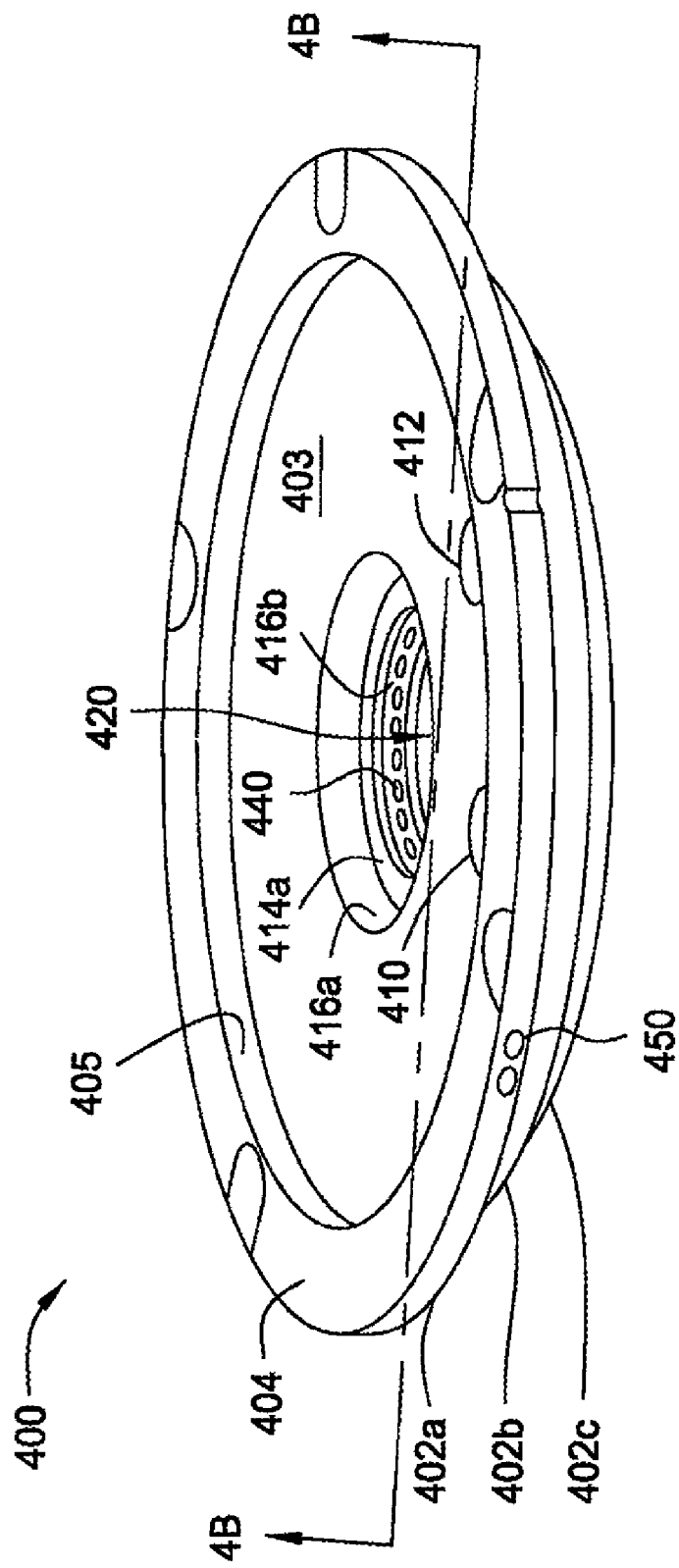
Figure 4B:
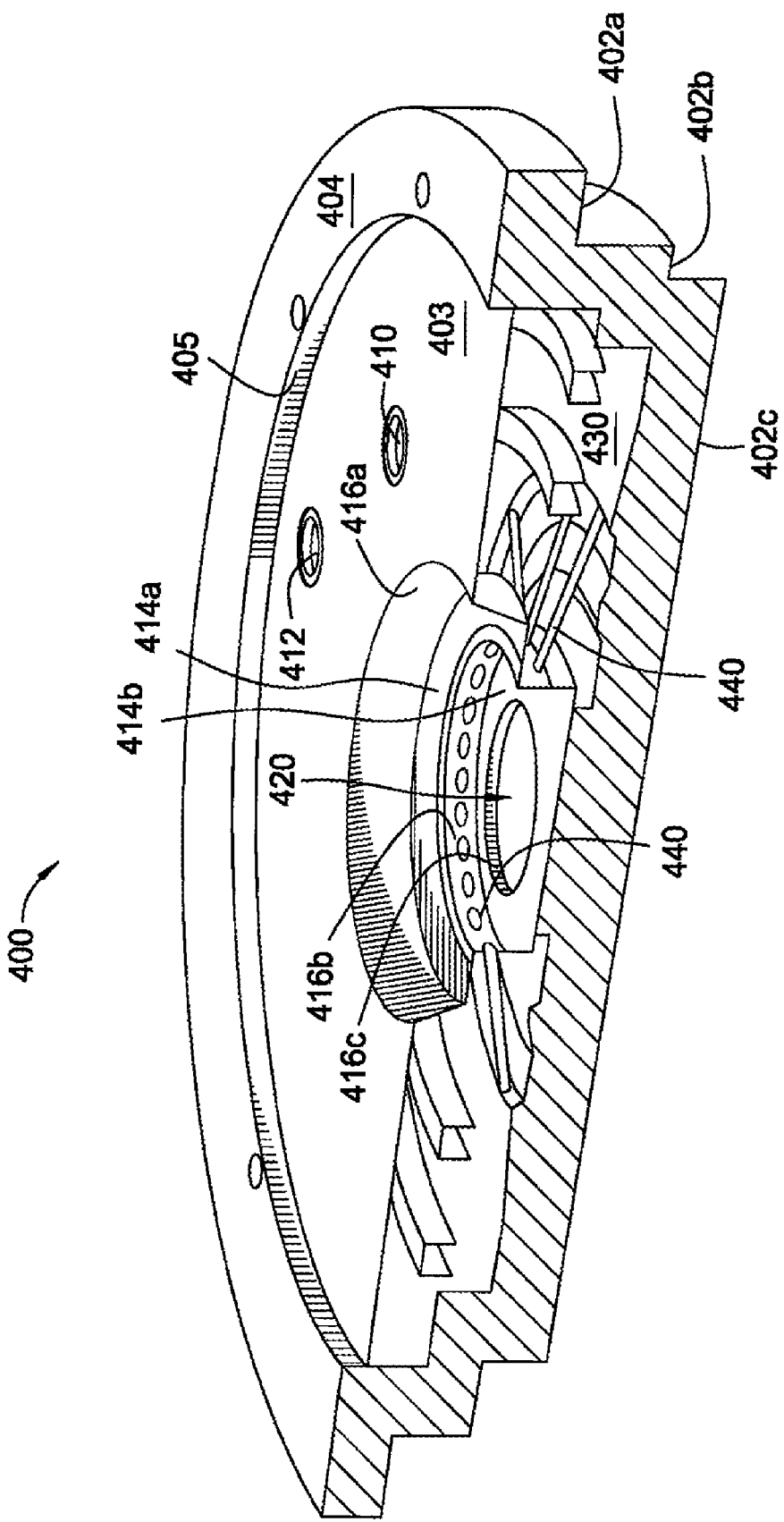

Water box 400, containing opening 420 (FIGS. 4A-4B), may be positioned on top of showerhead 300 and used to regulate the temperature by removing heat from lid assembly 100 (FIG. 1A-1B). Opening 420 contains ledge surfaces 414a and 414b and inner surfaces 416a, 416b and 416c. A plurality of passageways 440 radial extend from inner surface 416b inwardly through water box 400 to lower surface 402c. Opening 420 is adapted to receive plasma baffle insert 500, plasma screen insert 600, insulation cap 700. Insulation cap 700 may be positioned on ledge surface 414a. Water box 400 may be formed from a variety of materials including a metal. Preferably, water box 400 is formed from aluminum, steel, stainless steel, iron, nickel, chromium, an alloy thereof, another metal, or combinations thereof. Lower surfaces 402a and 402b of water box 400 rests on upper surfaces 304 and 306 of showerhead 300. Water box 400 also contains upper surface 403 surrounded by inner surface 405 which has upper surface 404. Water box 400 helps remove heat from lid assembly 100, especially from showerhead 300. Upper surface 403 contains inlet 410 and outlet 412 that are in fluid communication with passageway 430. During a deposition process, a fluid at an initial temperature is administered into water box 400 through inlet 410. The fluid absorbs heat while traveling along passageway 430. The fluid at a higher temperature is removed from water box 400 through outlet 412.

The fluid may be in liquid, gas or supercritical state and is capable of adsorbing and dissipating heat in a timely manner. Liquids that may be used in water box 400 include water, oil, alcohols, glycols, glycol ethers, other organic solvents, supercritical fluids (e.g., $CO_2$) derivatives thereof or mixtures thereof. Gases may include nitrogen, argon, air, hydrofluorocarbons (HFCs), or combinations thereof. Preferably, water box 400 is supplied with water or a water/alcohol mixture.

Inlet 410 may be adapted to receive nozzle 411 connected to line 425 (e.g., hose) in fluid communication with a fluid source. Similarly, outlet 412 may be adapted to receive nozzle 413 connected to line 427 in fluid communication with a fluid return. The fluid source and fluid return may be an in-house cooling system or an independent cooling system. Lines 425 and 427 are connected to source nozzle 421 and return nozzle 423 held in positioned on lid support 103 by support bracket 110. Lines 425 and 427 may be a tube, a hose, a conduit or a line.

In one embodiment, the fluid may be administered into water box 400 at a temperature within a range from about −20° C. to about 40° C., preferably, from about 0° C. to about 20° C. The temperature, flow rate, and fluid composition may be adjusted accordingly to remove the appropriate amount of heat from lid assembly 100 including showerhead 300 while maintaining water box 400 at a predetermined temperature. Water box 400 may be maintained at a predetermined temperature within a range from about 0° C. to about 100° C., preferably, from about 18° C. to about 65° C., and more preferably, from about 20° C. to about 50° C.

In an alternative embodiment, FIGS. 4C-4F illustrate passageways 430c, 430d, 430e and 430f to provide several different geometries that may be used to replace passageway 430. Passageways 430c-430f may include a partial loop 432c (FIG. 4C), a single loop 432d (FIG. 4D), multiple loops 432e (FIG. 4E) or contain branches or spurs 432f around opening 420 (FIG. 4F).

Gas region 540 is above upper surface 303 of showerhead 300 and below the lower surface 402c of water box 400.

Passageways 440 extend from inner surface 416b, pass through water box 400 and into gas region 540. Inner surface 416b may be inwardly concaved such to form gas region 441 that is situated between inner surface 416b and plasma screen insert 600 and insulation cap 700 (FIG. 7C). Gas region 441 encompasses plasma screen insert 600 to maintain fluid communication with slots 614. Passageways 440 provide fluid communication between gas regions 441 and 540. Water box 400 contains numerous passageways 440. For example, water box 400 may contain at least about 10 passageways, preferably, at least about 24 passageways, and more preferably, at least about 36 passageways or more.

FIGS. 5A-5F illustrate schematic views of plasma baffle insert 500 that may be included as a portion of lid assembly 100 as described in several embodiments. Plasma baffle insert 500 is configured to receive a process gas from gas region 640 and distribute or inject the process gas into process region 60. Preferably, plasma baffle insert 500 is configured to distribute the process gas at a predetermined angle. Upper surface 503 contains slots 510 extending through plasma baffle insert 500 to lower surface 502 for distributing the process gas into process region 60.

Figure 5A:
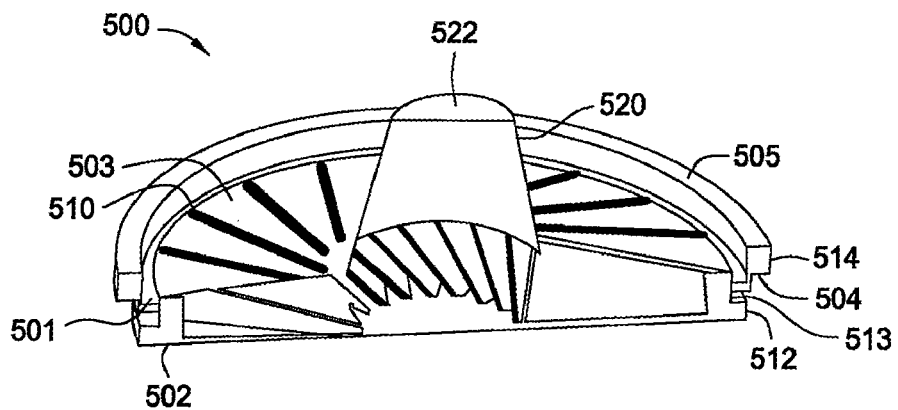
FIGS. 5A-5F illustrate schematic views of plasma baffle inserts as described in embodiments herein.

Plasma baffle insert 500 is illustrated containing conical nose 520 extending from upper surface 503 to nose surface 522 (FIG. 5A). Nose surface 522 may have a variety of geometries, such as flat (FIG. 5B) or conical nose 520 may extend to a point (not illustrated). Preferably, nose surface 522 is substantially, horizontally flat for contacting plasma screen insert 600. Conical nose 520 may extend into gas region 640, which is a region formed above plasma baffle insert 500, below plasma screen insert 600 and within ring assembly 330. Conical nose 520 occupies a predetermined volume within gas region 640. A less amount of process gas is required to fill gas region 640 during a deposition process if conical nose 520 occupies a larger volume. Therefore, a quicker ALD cycle is realized since a reduced amount of process gas is more quickly administered and removed from gas region 640 during each half cycle of an ALD process.

Plasma baffle insert 500 contains lower rim 512 having lower surface 502 and upper rim 514 having upper surface 505 and lower surface 504. Lower rim 512 and upper rim 514 are separated by gap 513. A gasket may be placed within gap 513 to provide more conductivity or a better seal. A gasket may include an o-ring or sealant. Preferably, the gasket is a RF gasket and contains a conductive material, such as a metal cable or a conductively doped-polymeric material. In a preferred example, a RF gasket, such as a twisted stainless steel cable, is placed along gap 513 to provide a more conductive contact with showerhead 300. Plasma baffle insert 500 may be positioned within opening 320 of showerhead 300 so that lower surface 504 of upper rim 514 rests on ledge 332 of showerhead 300 (FIG. 1A-1B). Plasma baffle insert 500 is also circumferentially surrounded by ring assembly 330 within opening 320. Plasma baffle insert 500 may be formed from aluminum, steel, stainless steel, iron, nickel, chromium, other metals, alloys thereof or combinations thereof.

Figure 5B:
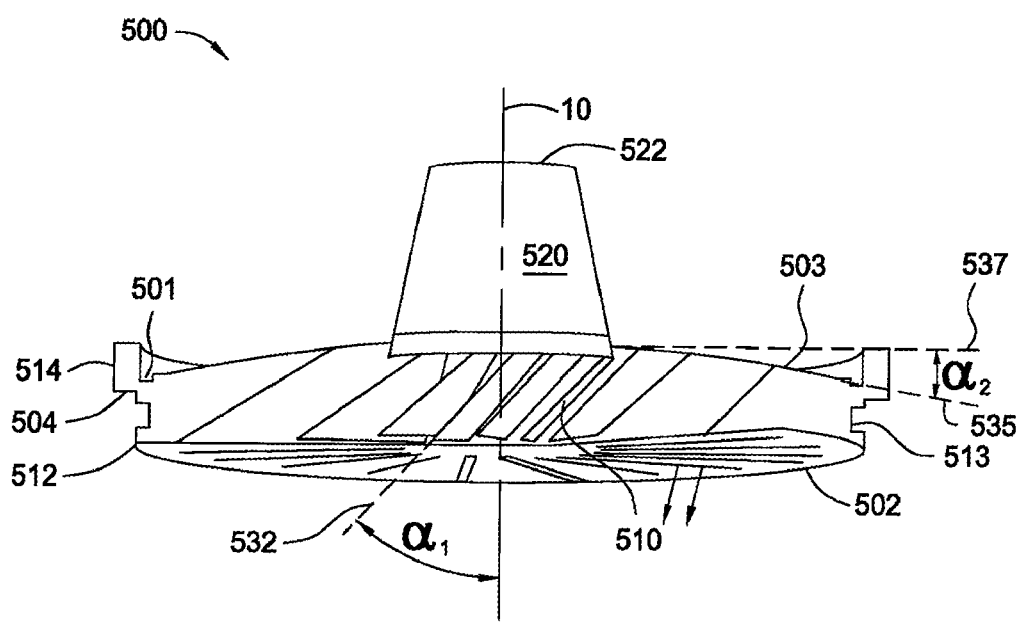
Figure 5C:
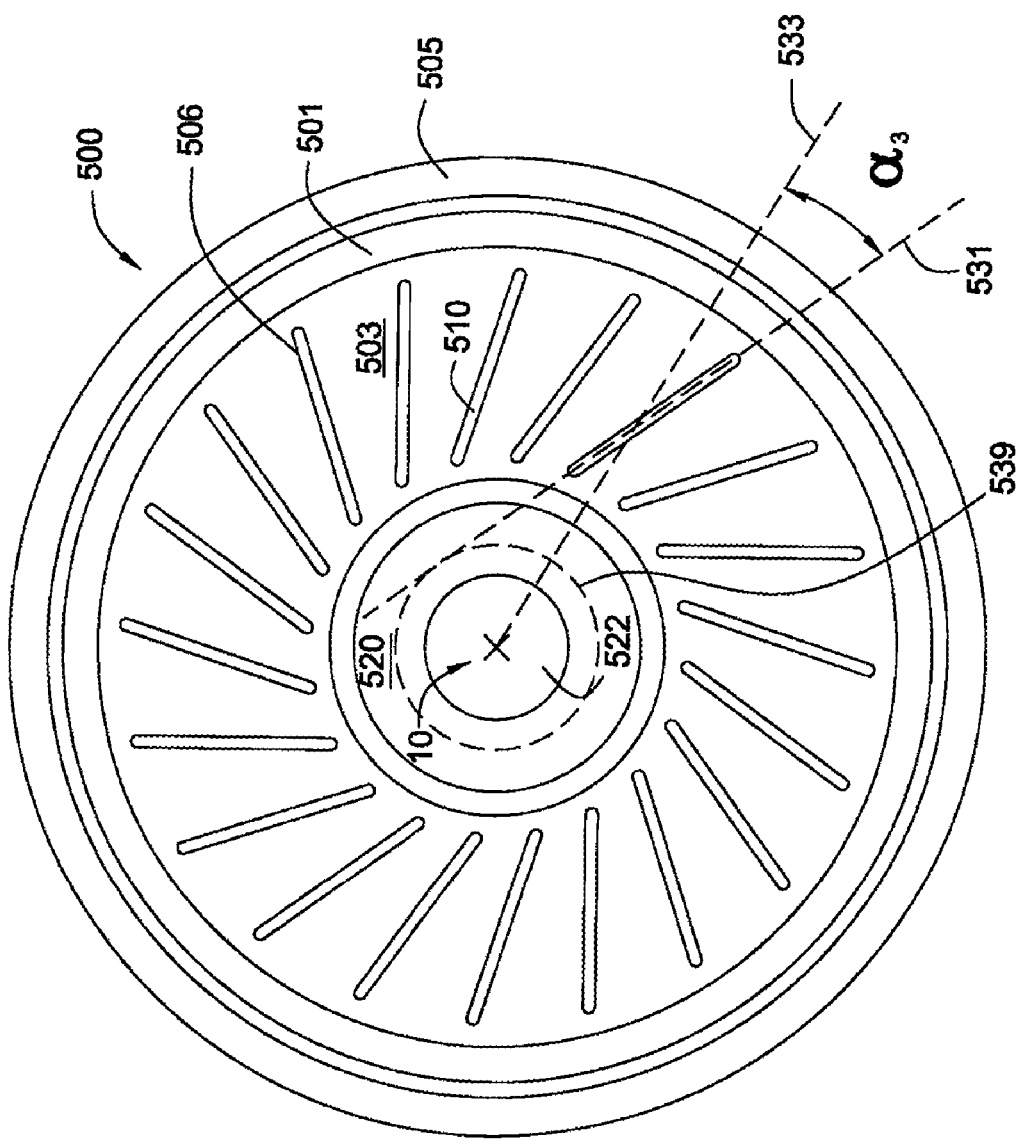

Plasma baffle insert 500 contains a plurality of slots 510, such that openings 508 of upper surface 503 is in fluid communication to openings 506 of lower surface 502 (FIGS. 5B and 5C). Slots 510 provide access for a process gas to flow from gas region 640 and into process region 60 at a predetermined angle. Ideally, slots 510 direct the process gas to contact substrate 8 or support surface 41 at an injection angle $\alpha_1$ measured between axis 10 and line 532. Axis 10 extends perpendicular through lower surface 502 while line 532 extends along the plane of slots 510. Therefore, slots 510 contained within plasma baffle insert 500 are positioned at injection angle $\alpha_1$ to direct a process gas having a flow pattern at injection angle $\alpha_1$, as depicted in FIGS. 5C and 9C-9D.

In some embodiments, plasma baffle insert 500 may contain trough 501 or a plurality of holes 530 to assist in moving process gases from upper surface 503. In one embodiment, plasma baffle insert 500 may contain trough 501 around an outside perimeter of slots 510, as depicted in FIGS. 5A-5C. Alternatively, slots 510 may extend into trough 501 (not shown).

Figure 5D:
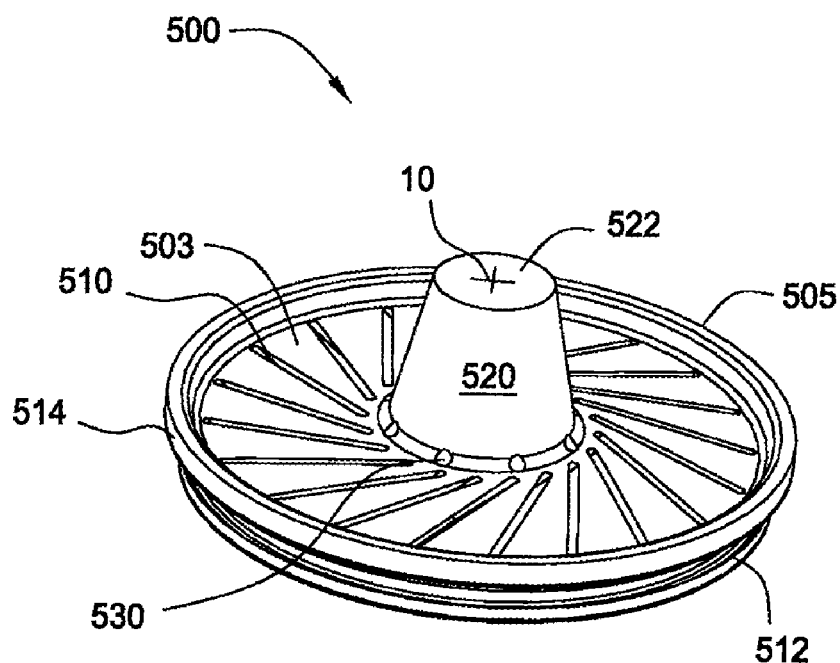
Figure 5E:
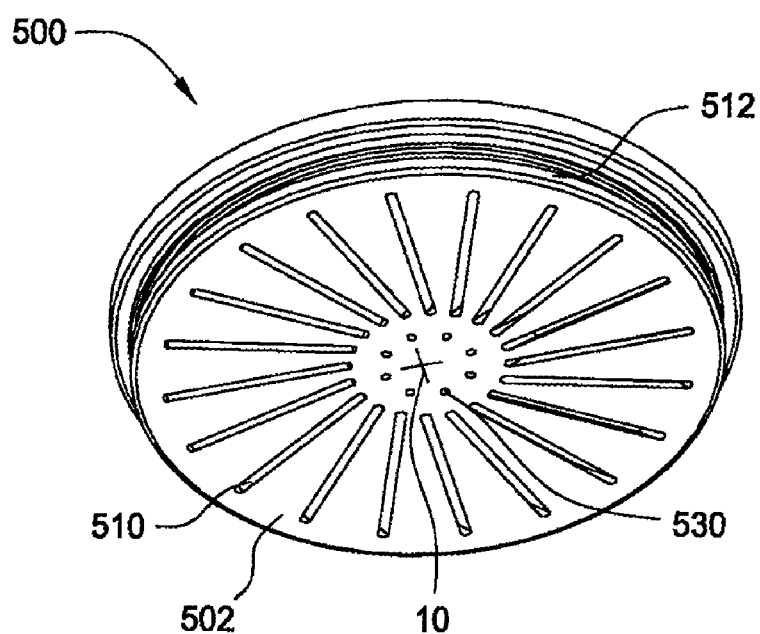
Figure 5F:
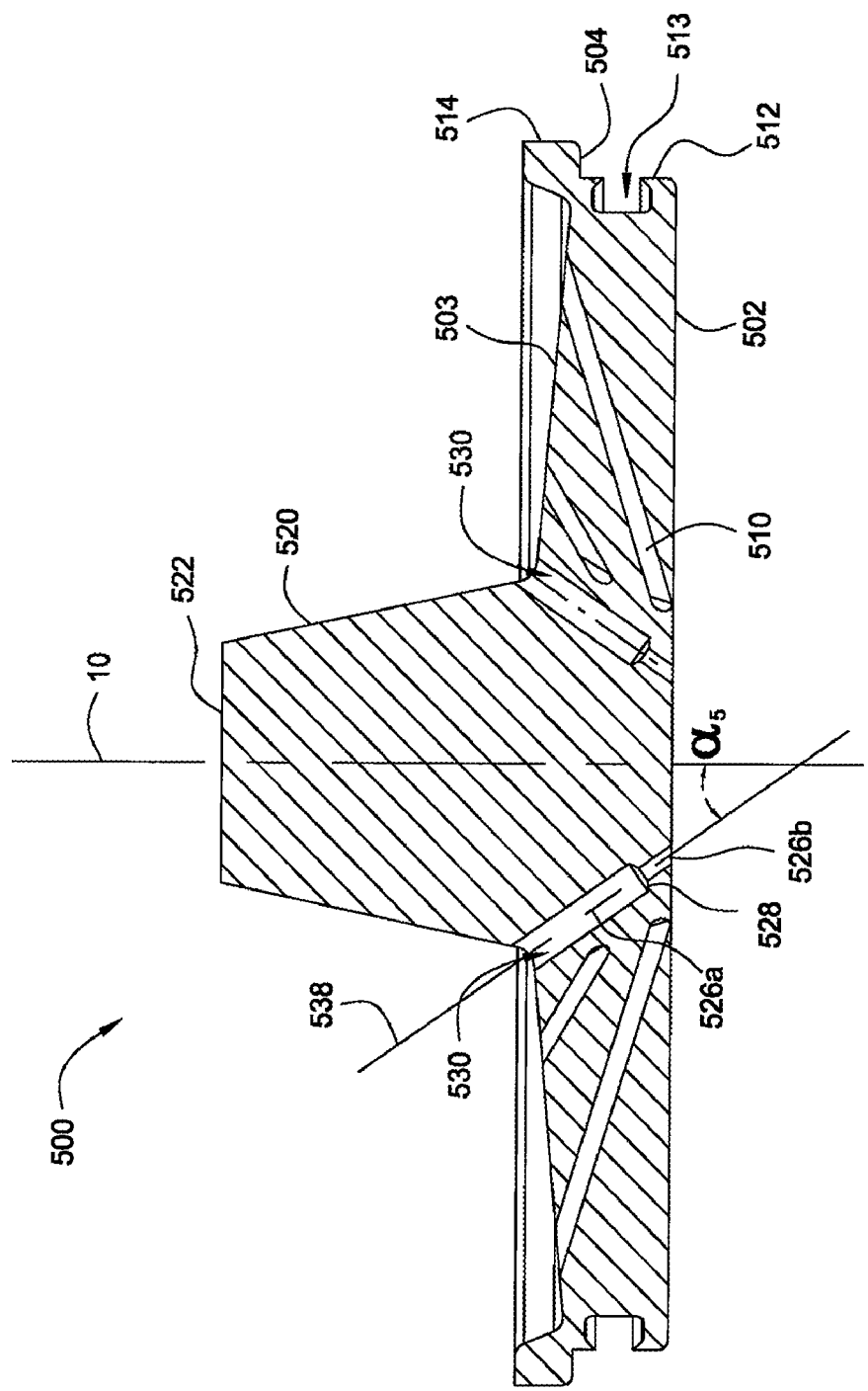

In another embodiment, plasma baffle insert 500 may contain holes 530 around an outside perimeter of conical nose 520, as depicted in FIGS. 5D-5F. Each hole 530 extends from upper surface 503 to lower surface 502 along axial line 538. In one example, each hole 530 has a constant diameter along axis line 538. Preferably, each hole 530 contains upper passageway 526a and lower passageway 526b separated by choke 528. The diameter of upper passageway 526a is usually larger than the diameter of lower passageway 526b.

In some embodiments, a process gas with a flow pattern parallel or perpendicular to support surface 41 (i.e., about 0° or about 90° from injection angle $\alpha_1$) may unevenly accumulate a chemical precursor across the surface of substrate 8. During a vapor deposition process, substrate 8 may exposed to the process gas at a predetermined angle of less than about 90°, but more than about 0°, to ensure an even exposure of the process gas. In one embodiment, injection angle $\alpha_1$ of slots 510 may be at an angle within a range from about 20° to about 70°, preferably, from about 30° to about 60°, and more preferably, from about 40° to about 50°, such as about 45°. The process gas may have a circular pathway inherited from the injection angle $\alpha_1$ of slots 510. The circular pathway usually has a vortex geometry, a helix geometry, a spiral geometry, a swirl geometry, a twirl geometry, a twist geometry, a coil geometry, a corkscrew geometry, a curl geometry, a whirlpool geometry, or derivatives thereof.

Holes 530 contained within plasma baffle insert 500 may be positioned at injection angle $\alpha_5$ to direct a process gas having flow pattern 912 at injection angle $\alpha_5$, as depicted in FIGS. 5F and 9C-9D. In another embodiment, injection angle $\alpha_5$ of holes 530 may be at an angle within a range from about 0° to about 60°, preferably, from about 15° to about 50°, and more preferably, from about 30° to about 40°, such as about 35°. Flow pattern 912 of the process gas may have a conical pathway inherited from the injection angle $\alpha_5$ of holes 530.

A secondary plasma or back diffusion of gasses within or above the plasma baffle insert 500 may be avoided by limiting the width and length of slots 510 and holes 530. Also, a secondary plasma within or above the plasma baffle insert 500 may be avoided or limited by positioning slots 510 at a predetermined injection angle $\alpha_1$, such that there is not a line-of-sight through plasma baffle insert 500, along axis 10, from support surface 41 to gas region 640 (FIG. 1C). The secondary plasma within or above the plasma baffle insert 500 may also be avoided or limited by positioning holes 530 at a predetermined injection angle $\alpha_5$, such that there is not a line-of-sight through plasma baffle insert 500, along axial line 538, from support surface 41 to gas region 640 (FIG. 1F).

Therefore, the lack of a line-of-sight forms an obscured pathway down each slot 510 or hole 530. For example, slots 510 may have a width within a range from about 0.50 mm to about 1.00 mm, preferably, from about 0.60 mm to about 0.90 mm, and more preferably, from about 0.70 mm to about 0.80 mm, such as about 0.76 mm (0.030 in). Also, slots 510 may have a length within a range from about 3 mm to about 60 mm, preferably, from about 10 mm to about 50 mm, and more preferably, from about 20 mm to about 30 mm, such as about 21.6 mm (0.850 in). Plasma baffle insert 500 may have at least about 10 slots, preferably, about 15 slots, and more preferably, about 20 slots or more. In one example, plasma baffle insert 500 is constructed from metal (e.g., aluminum or stainless steel) and has 20 slots that are about 0.76 mm wide and about 2.16 mm long.

In one embodiment, each hole 530 may have a diameter within a range from about 0.13 mm (0.005 in) to about 2.54 mm (0.100 in), preferably, from about 0.26 mm (0.010 in) to about 2.29 mm (0.090 in), and more preferably, from about 0.51 mm (0.020 in) to about 1.90 mm (0.075 in). In one example, each hole 530 may contain upper passageway 526a having a diameter within a range from about 1.27 mm (0.050 in) to about 2.29 mm (0.090 in), preferably, from about 1.52 mm (0.060 in) to about 2.03 mm (0.080 in), such as about 1.78 mm (0.070 in). Also, each hole 530 may contain lower passageway 526b having a diameter within a range from about 0.38 mm (0.015 in) to about 1.27 mm (0.050 in), preferably, from about 0.64 mm (0.025 in) to about 1.02 mm (0.040 in), such as about 0.81 mm (0.032 in). In one example, each hole 530 contains upper passageway 526a having a diameter within a range from about 1.5 mm to about 2 mm and lower passageway 526b having a diameter within a range from about 0.6 mm to about 1 mm. Plasma baffle insert 500 may have no holes or a plurality of holes 530, such as about 4 holes, preferably, about 8 holes, and more preferably, about 16 holes or more. In one example, plasma baffle insert 500 is constructed from metal (e.g., aluminum or stainless steel) and has 8 holes.

In another embodiment, upper surface 503 of plasma baffle insert 500 is sloped from conical nose 520 towards upper rim 514. In a preferred example, the process gas is directed from holes 612 towards conical nose 520 and down upper surface 503 towards upper rim 514. In one embodiment, plasma baffle insert 500 is formed with upper surface 503 sloped downwardly from conical nose 520 to provide greater mechanical strength and to control varying conductance and flow rates during a process. Upper surface 503 may have a slope with an angle $\alpha_2$ measured between lines 535 and 537. Line 535 extends along the plane of upper surface 503 and line 537 is perpendicular or substantially perpendicular to axis 10 (FIG. 5B). Upper surface 503 is configured to receive a process gas along various portions of openings 506 relative to angle $\alpha_2$. Therefore, angle $\alpha_2$ may be at a predetermined angle in order to eject the process gas from openings 508 of slots 510 with a consistent flow rate along the length of openings 506. In one embodiment, upper surface 503 may be sloped at an angle $\alpha_2$ within a range from about 0° to about 45°, preferably, from about 5° to about 30°, and more preferably, from about 10° to about 20°, such as about 15°. In another embodiment, upper surface 503 may be sloped at an angle $\alpha_2$ within a range from about 0° to about 45°, preferably, from about 2° to about 20°, and more preferably, from about 3° to about 10°, such as about 5°.

Slots 510 disposed around conical nose 520 pass through plasma baffle insert 500 between opening 506 on upper surface 503 (FIG. 5C) and opening 508 on lower surface 504 (FIG. 1C). Openings 506 and 508 may be disposed around conical nose 520 at angle $\alpha_3$, measured between line 531 and radial line 533. Line 531 extends along the length of opening 506 and radial line 533 extends perpendicular from axis 10. Line 531 may also extend along the length of opening 508 (not shown). In one embodiment, openings 506 and 508 may be disposed around conical nose 520 and are tangential or substantially tangential to dashed circle 539 at angle $\alpha_3$. Therefore, line 531, extending along the length of opening 506, may intersect a point on dashed circle 539 and is tangent or substantially tangent to dashed circle 539 at angle $\alpha_3$. Dashed circle 539 may have a radius of a length within a range from about 0.5 mm to about 5 mm, preferably, from about 1 mm to about 3 mm, and more preferably, from about 1.5 mm to about 2.5 mm, for example, about 2 mm (about 0.081 inch). In other embodiments, openings 506 and 508 may be radially disposed around or tangentially about conical nose 520. Also, openings 506 and 508 may have an angle $\alpha_3$ at an angle within a range from about 0° to about 90°, preferably, from about 20° to about 45°, and more preferably, from about 30° to about 40°, such as about 35°.

In one embodiment, plasma screen insert 600 and insulation cap 700 may be placed between gas manifold assembly 800 and plasma baffle insert 500 to prohibit or to limit plasma generation therebetween (FIGS. 1A-1B). Plasma screen insert 600 and insulation cap 700 may also prohibit or limit the transfer of heat from plasma baffle insert 500 to gas manifold assembly 800. Plasma screen insert 600 and insulation cap 700 independently each contain an electrically insulating material, such as ceramic, quartz, glass, sapphire or a derivative thereof.

Figure 6A:
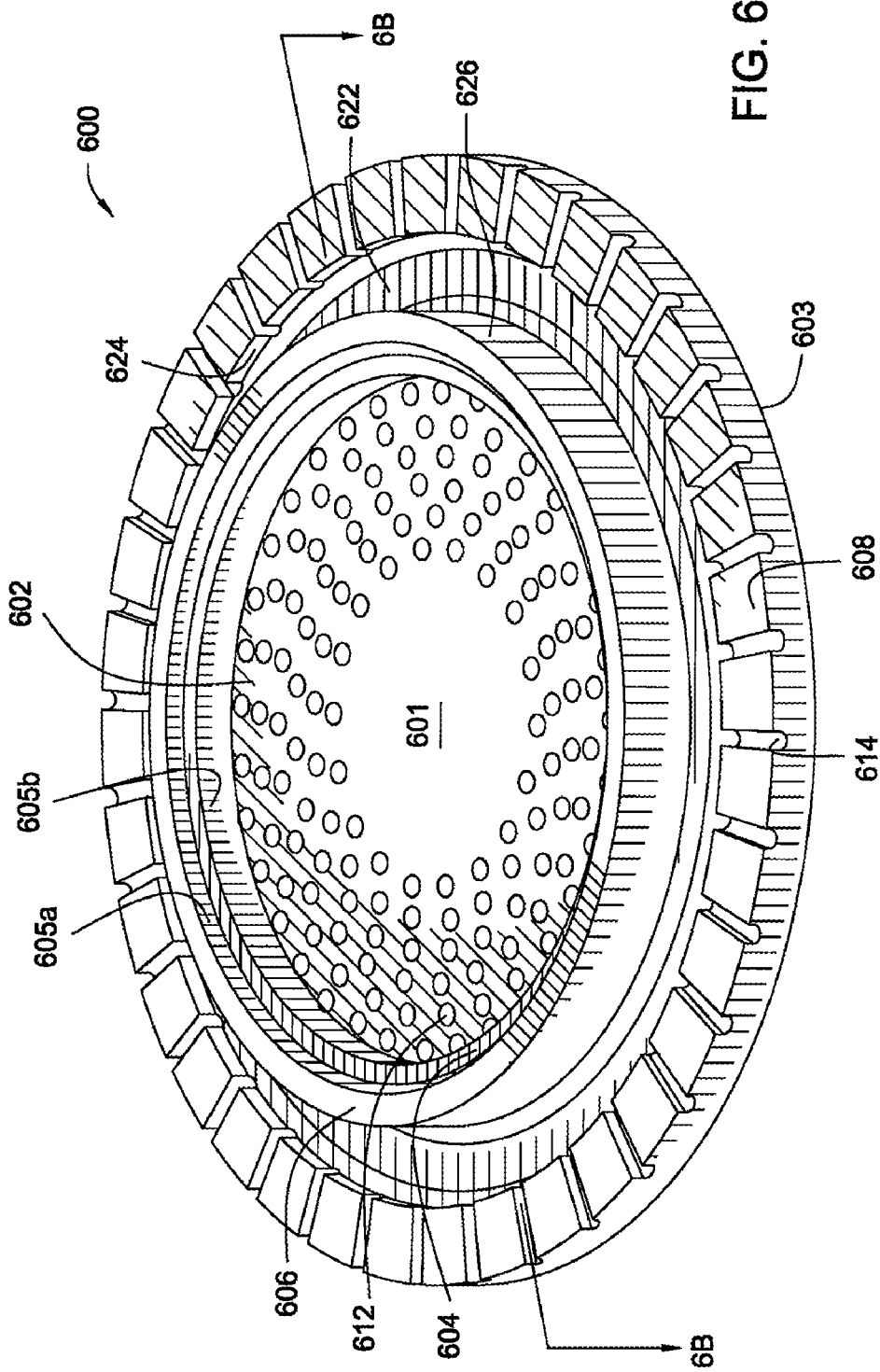
FIGS. 6A-6B illustrate schematic views of a plasma screen insert as described in an embodiment herein.
Figure 6B:
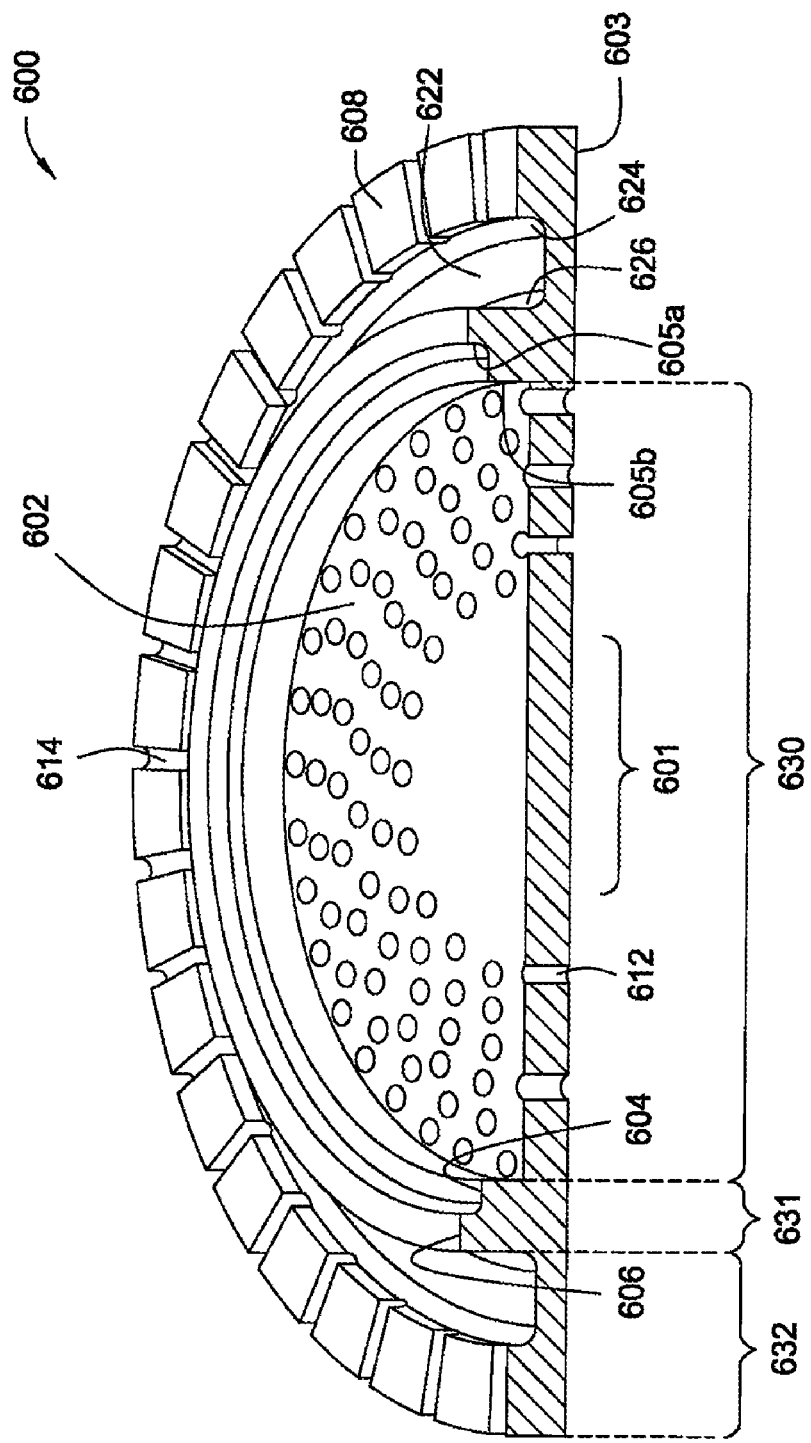

Plasma screen insert 600 contains inner region 630 and outer region 632 separated by ring assembly 631 (FIGS. 6A-6B). Ring assembly 631 contains wall surface 626, inner wall surfaces 605a and 605b and upper surfaces 604 and 606. Inner region 630 is bound within inner wall surfaces 605a and 605b. Inner region 630 contains center portion 601 encompassed by a plurality of holes 612 that pass through plasma screen insert 600. A process gas within inner region 630 is exposed to upper surface 602 and is in fluid communication through holes 612 to lower surface 603 and gas region 640. Center portion 601 generally has no holes between upper surface 602 and lower surface 603.

Outer region 632 extends from ring assembly 631 and contains a plurality of slots 614 that radially extend along upper surface 608. Slots 614 direct a secondary process gas from outer region 632 to gas region 540. Axis 10 extends through the center of plasma screen insert 600 such that the plurality of holes 612 extend parallel or substantially parallel to axis 10 and the plurality of slots extend perpendicular or substantially perpendicular to axis 10.

FIG. 1A illustrates plasma screen insert 600 positioned on ring assembly 330 of showerhead 300 and on conical nose 520 of plasma baffle insert 500. Nose surface 522 is in contact to center portion 601 of lower surface 603. During a deposition process, a secondary plasma above plasma screen insert 600 within the gas region 640 may be avoided by limiting the width and length of slots 614 and the diameter of holes 612. For example, slots 614 may have a width within a range within a range from about 0.10 mm to about 1.00 mm, preferably, from about 0.20 mm to about 0.80 mm, and more preferably, from about 0.40 mm to about 0.60 mm, such as about 0.50 mm. Plasma screen insert 600 may have at least about 10 slots, preferably, about 20 slots, and more preferably, about 36 slots or more. In one embodiment, plasma screen insert 600 has the same amount of slots 614 as water box 400 has passageways 440.

Plasma screen insert 600 contains holes 612 that may have a diameter within a range from about 0.5 mm to about 5 mm, preferably, from about 1 mm to about 3 mm, and more preferably, from about 1.2 mm to about 1.8 mm, such as about 1.50 mm (0.060 in). Plasma screen insert 600 contains a plurality of holes 612 may have about 50 holes or more, preferably, at least about 100 holes, and more preferably, about 150 holes or more, for example. In one example, plasma screen insert 600 is constructed of ceramic and has 36 slots that are about 0.51 mm (0.020 in) wide and about 156 holes that have a diameter of about 1.52 mm. Preferably, plasma screen insert 600 has a circular geometry, but may have a different geometry in alternative embodiments (e.g., oval geometry). Plasma screen insert 600 may have a diameter within a range from about 1 inch (about 2.54 cm) to about 12 inches (about 30.52 cm), preferably, from about 2 inches (about 5.08 cm) to about 8 inches (about 20.36 cm), and more preferably, from about 3 inches (about 7.62 cm) to about 4 inches (about 10.16 cm). Plasma screen insert 600 may have a thickness of about 1 inch (about 2.54 cm) or less, preferably, about 0.5 inches (about 1.27 cm) or less, and more preferably, about 0.25 inches (about 0.64 cm), such as about 0.125 inches (about 0.32 cm), where the thickness is measured along a plane parallel to axis 10 passing through plasma screen insert 600. In one example of plasma screen insert 600, inner region 630 has a thickness of about 0.125 inches (about 0.32 cm) or less and ring assembly 631 has a thickness of about 0.25 inches (about 0.64 cm) or less.

Figure 7A:
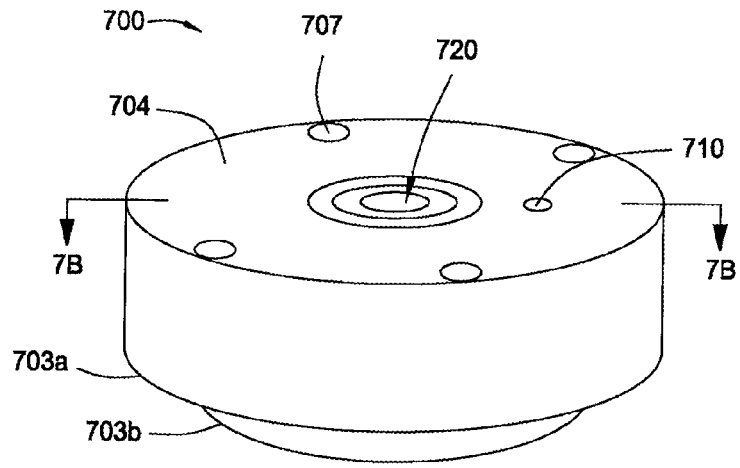
FIGS. 7A-7C illustrate schematic views of an insulation cap insert as described in an embodiment herein.
Figure 7B:
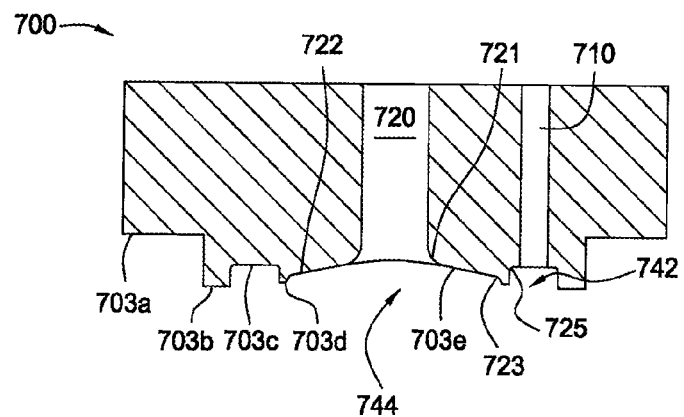
Figure 7C:
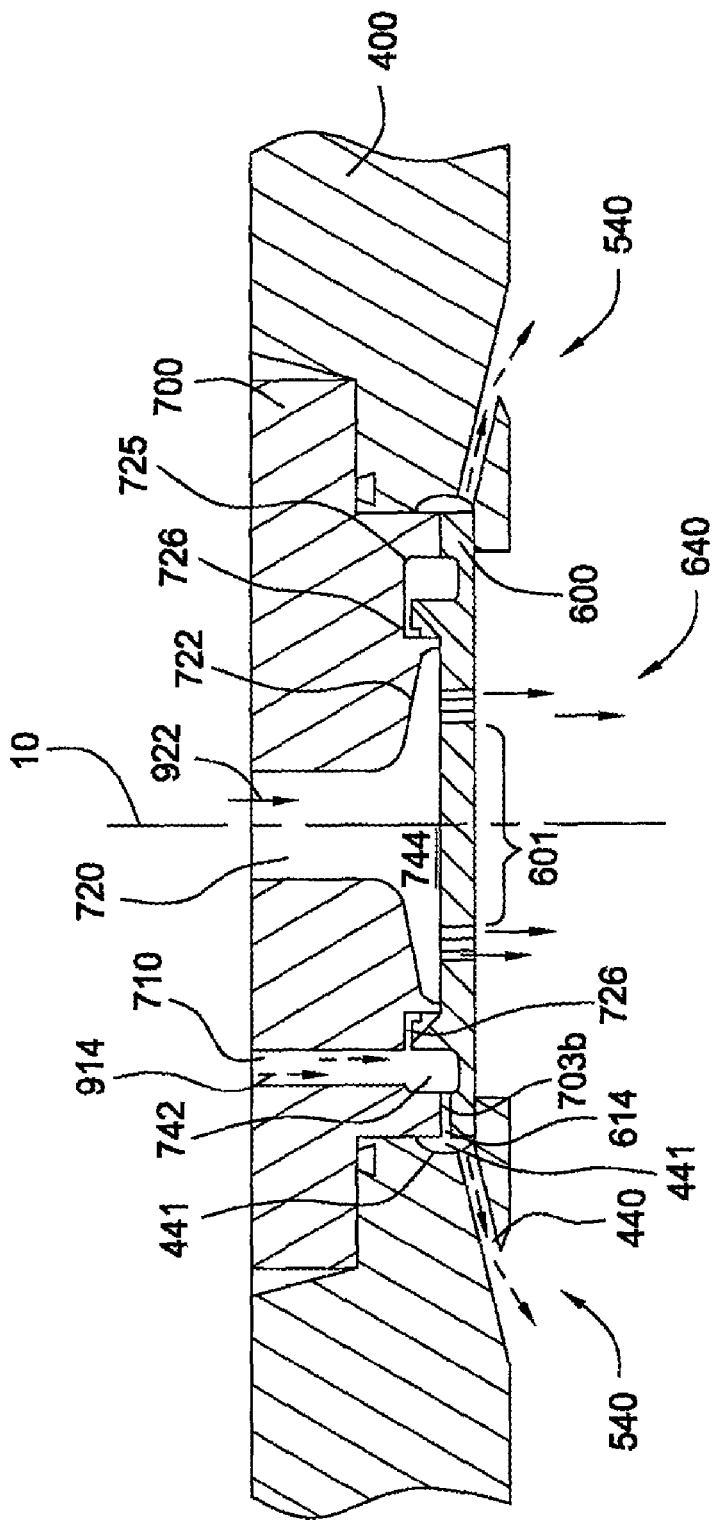

Insulation cap 700 has upper surface 704 and lower surfaces 703a, 703b, 703c, 703d and 703e (FIGS. 7A-7C). Insulation cap 700 contains at least one channel extending from upper surface 704 to lower surfaces 703a-703e. In one example, insulation cap 700 contains only one channel, and a conduit outside of insulation cap 700 may be used to direct a second process gas. In another example, insulation cap 700 contains multiple channels, such as three channels, four channels or more (not shown). In a preferred example, insulation cap 700 contains at least two channels, such as channels 710 and 720. Channel 720 extends from upper surface 704, through insulation cap 700, to form expanding channel 722. Expanding channel 722 tapers from channel 720 at upper portion 721 to lower portion 723 and contains lower surface 703e (FIG. 7B). Axis 10 may pass through the center of channel 720 and expanding channel 722 (FIG. 7C). Channel 710 extends from upper surface 704, through insulation cap 700, to groove 725. In one embodiment, channel 710 has a smaller radius than channel 720. Groove 725 contains lower surface 703c and is formed encircling the bottom of insulation cap 700 (FIG. 7B). Upper surface 704 also contains holes 707 which are configured for receiving fasteners (e.g., bolts or screws) to secure gas manifold assembly 800 thereon.

Insulation cap 700 may be positioned on water box 400 such that lower surface 703a contacts and is supported by water box 400. Lower surfaces 703b, 703c, 703d and 703e either contact plasma screen insert 600 or form regions therebetween (FIG. 7C). Lower surface 703d is placed into contact with upper surface 602 of plasma screen insert 600 to form gas region 744. Gas regions 742 and 744 and gap 726 are each formed between insulation cap 700 and plasma screen insert 600.

Gas region 742 is formed between groove 725 containing lower surface 703c and a portion of outer region 632 of plasma screen insert 600, including trough 622 and wall surfaces 624 and 626 (FIG. 7C). Gas region 742 extends around and above outer region 632 to encompass gas region 744. Channel 710 is in fluid communication with gas region 742 through lower surface 703c. Also, gas region 540 is in fluid communication with gas region 742, since slots 614 extend from wall surface 624 to passageways 440, which further extend through water box 400 and into gas region 540. Slots 614 in combinations with lower surface 703b of insulation cap 700 forms these passageways. During a deposition process, a process gas flows down channel 710, enters gas region 742, flows along trough 622 and exits through slots 614. Gap 726 generally contains an o-ring after assembling the components.

Gas region 744 is formed in part by lower surface 703e of insulation cap 700 and a portion of inner region 630 of plasma screen insert 600, including upper surface 602 and center portion 601. Channel 720 is in fluid communication with gas region 744 through lower surface 703e. Channel 720 is perpendicularly in-line with center portion 601 (along axis 10) which does not contain holes 612. In a preferred example, the diameter of channel 720 is smaller than the diameter of center portion 601 to help deflect a process gas. Expanding channel 722 expands from upper portion 721 to lower portion 723 and covers most of inner region 630 and upper surface 602 within gas region 744. Also, gas region 640 is in fluid communication with gas region 744, since holes 612 extend from through plasma screen insert 600.

During a deposition process, a process gas flows down channel 720, enters gas region 744 and exits through holes 612. Center portion 601 deflects any process gas having a flow path perpendicular to upper surface 602 coming straight from channel 720. Therefore, the obscured flow path reduces or eliminates a secondary plasma from forming between plasma baffle insert 500 and gas manifold assembly 800.

Expanding channel 722 has an inner diameter which increases from upper portion 721 to lower portion 723 (FIG. 7B). In one embodiment, the inner diameter of expanding channel 722 for a chamber adapted to process a 300 mm diameter substrate is within a range from about 0.5 cm to about 7 cm, preferably, from about 0.8 cm to about 4 cm, and more preferably, from about 1 cm to about 2.5 cm at upper portion 721 of expanding channel 722 and within a range from about 2 cm to about 15 cm, preferably, from about 3.5 cm to about 10 cm, and more preferably, from about 4 cm to about 7 cm at lower portion 723 of expanding channel 722. In general, the above dimension apply to an expanding channel adapted to provide a total gas flow rate within a range from about 100 sccm to about 10,000 sccm.

In other specific embodiments, the dimension of expanding channel 722 may be altered to accommodate a certain gas flow therethrough. In general, a larger gas flow will require a larger diameter for expanding channel 722. In one embodiment, expanding channel 722 may be shaped as a truncated cone (including shapes resembling a truncated cone). Whether a process gas is provided toward the walls of expanding channel 722 or directly downward towards substrate 8, the velocity of the gas flow decreases as the process gas travels through expanding channel 722 due to the expansion of the process gas. The reduction of the process gas velocity helps reduce the likelihood the gas flow will blow off reactants absorbed on the surface of substrate 8.

The diameter of expanding channel 722 gradually increases from upper portion 721 to lower portion 723. The gradual increase of the diameter may allow less of an adiabatic expansion of a process gas through expanding channel 722 which helps to control the process gas temperature. For instance, a sudden adiabatic expansion of a gas delivered through gas conduits 882 and 884 into channels 820 and 720 may result in a drop of the gas temperature which may cause condensation of a precursor vapor and formation of particles. On the other hand, a gradually expanding channel 722 according to some embodiments is believed to provide less of an adiabatic expansion of a process gas. Therefore, more heat may be transferred to or from the process gas, and, thus, the gas temperature may be more easily controlled by controlling the surrounding temperature (i.e., controlling the temperature by water box 400). Expanding channel 722 may comprise one or more tapered inner surfaces, such as a tapered straight surface, a concave surface, a convex surface, a combination thereof or may comprise sections of one or more tapered inner surfaces (i.e., a portion tapered and a portion non-tapered).

Gap 726 is also formed between insulation cap 700 and plasma screen insert 600. Gap 726 is formed since a portion of lower surface 703c within groove 725 does not contact upper surfaces 604 and 606 and inner wall surface 605a of ring assembly 631 contained on plasma screen insert 600. An o-ring may be positioned within gap 726 while placing insulation cap 700 onto plasma screen insert 600.

Figure 8A:
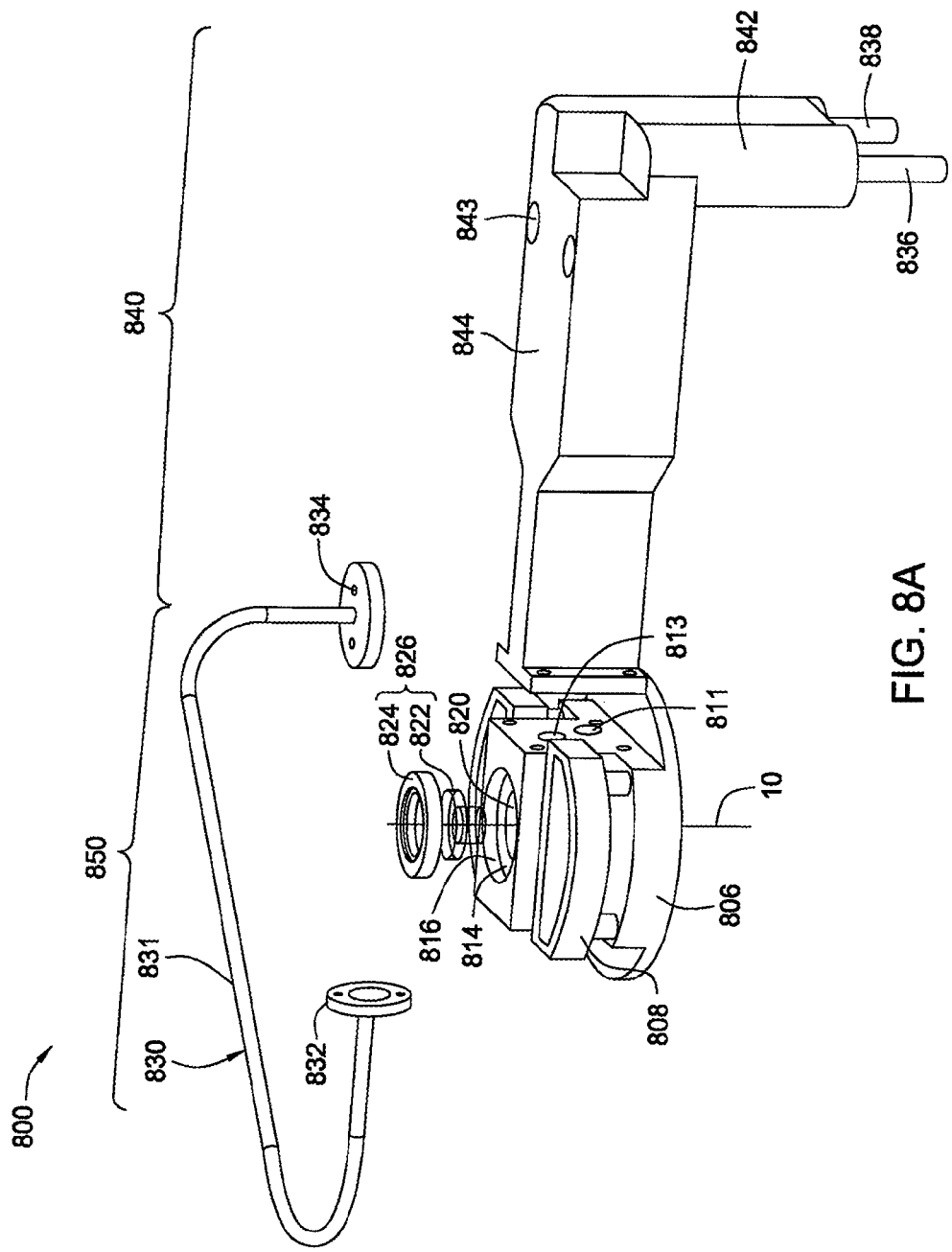
FIGS. 8A-8D illustrate schematic views of a gas manifold assembly as described in an embodiment herein.
Figure 8B:
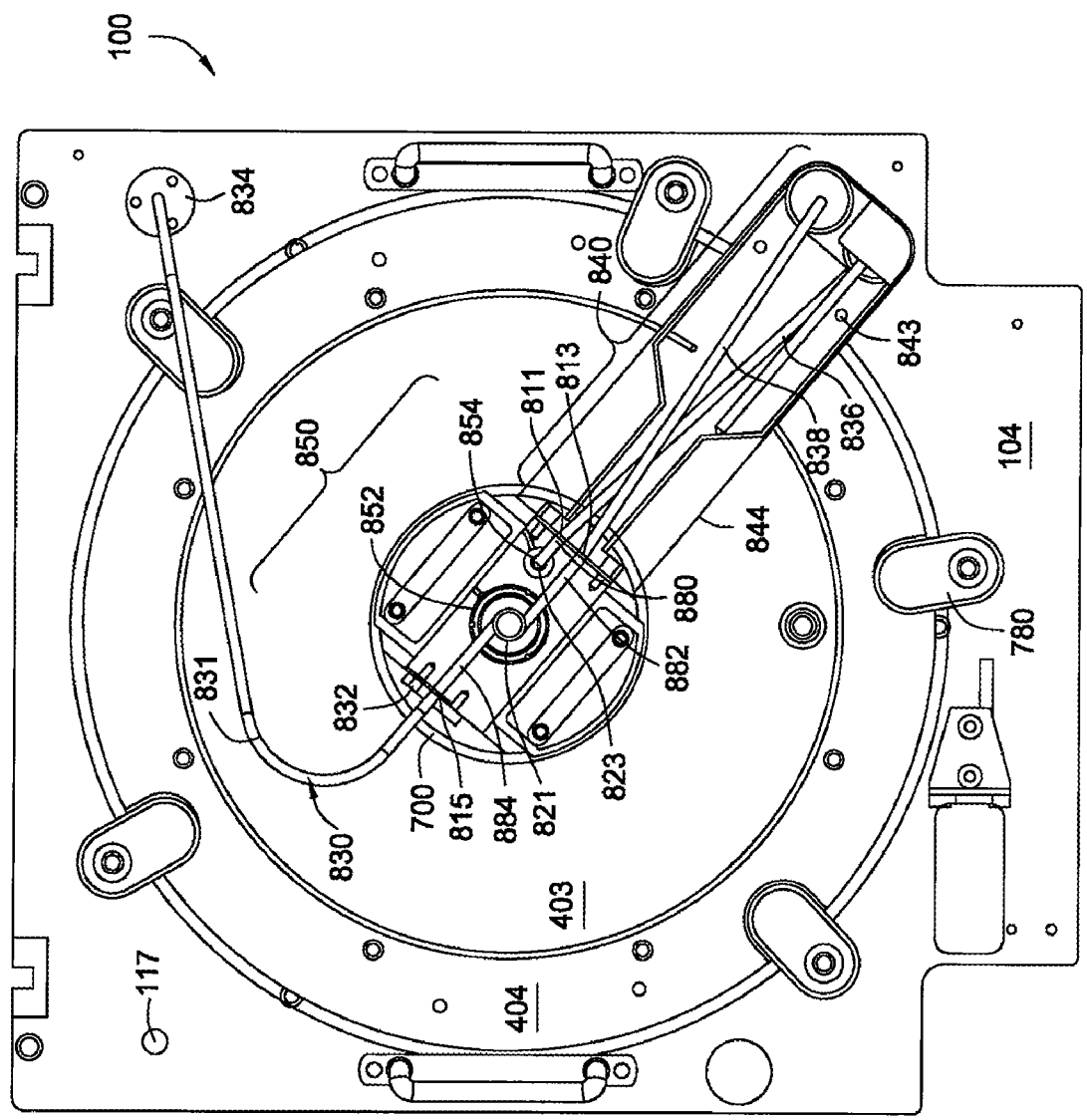

Gas manifold assembly 800 includes conduit assembly 840 and manifold cap assembly 850 containing gas conduit assembly 830 (FIGS. 8A-8B). Conduit assembly 840 contains gas conduits 836 and 838 within upper manifold 844 and lower manifold 842. Gas manifold assembly 800 may be attached to lid assembly 100 by a fastener (e.g., bolt or screw) placed through holes 843. In one embodiment, conduits 836 and 838, independently, are in fluid communication with conduit system 34 for providing precursor gases, purge gases, carrier gases and other process gases (FIG. 1F). In other embodiments, conduits 836 and 838, independently, may be in fluid communication with separate process gas supplies, including a precursor gas supply, a purge gas supply or a carrier gas supply. Gas conduit assembly 830 contains flanges 832 and 834 on opposite sides of conduit 831. Flange 834 is coupled to port 117 on lid support 103 to provide fluid communication from port 117 to conduit 831. Also, flange 832 is coupled to gas inlet 815 on manifold block 806 to provide fluid communication from conduit 831 to conduit 884. Isolators 808 are disposed on manifold block 806 and provide further thermal and electric insulation for the ground manifold. Isolator 808 may be formed from insulating material, such as a ceramic material, a quartz material or a derivative thereof. Preferably, isolator 808 is formed from an insulating polymer, polytetrafluoroethylene (PTFE), such as TEFLON®.

Figure 8C:
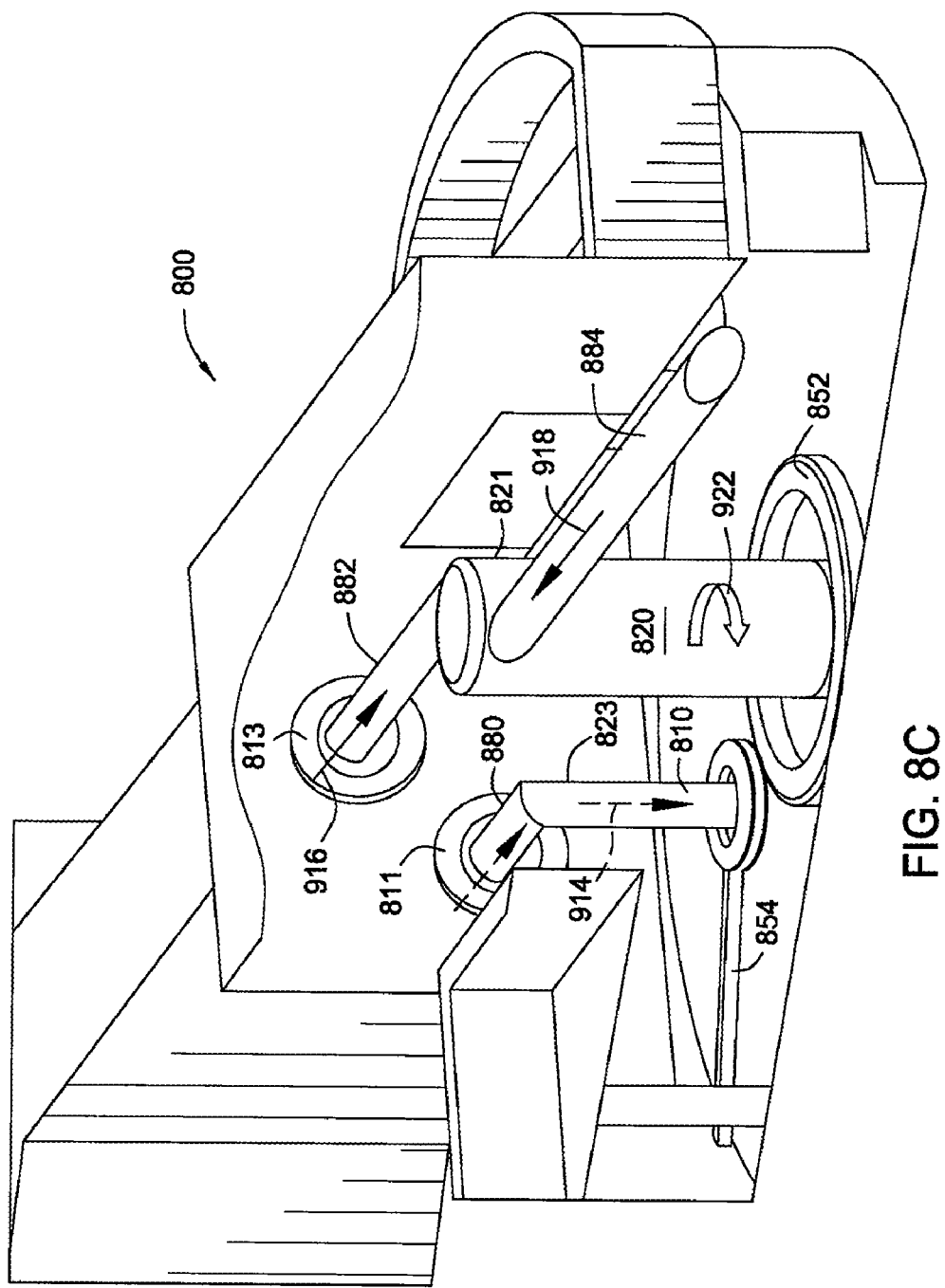
Figure 8D:
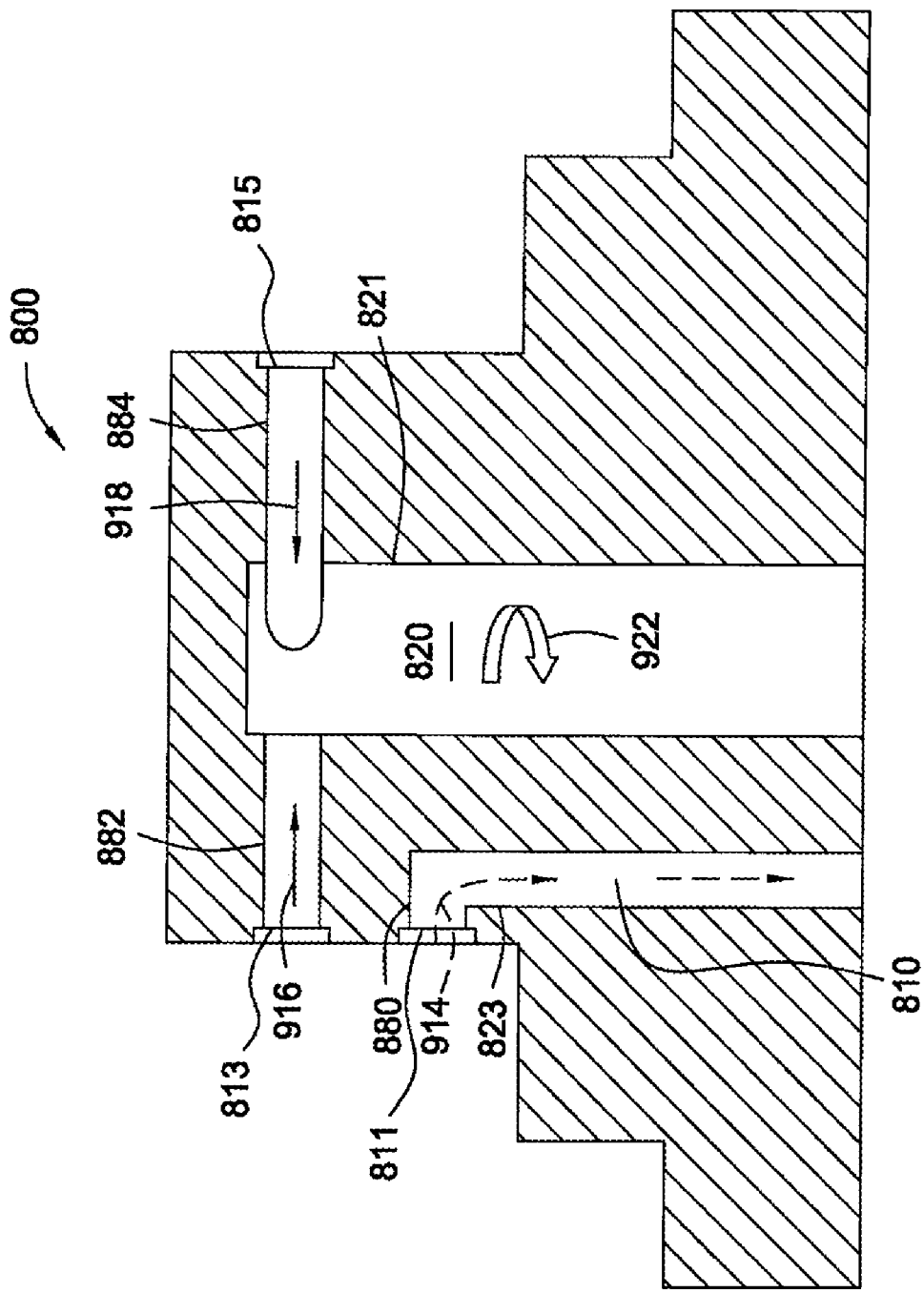

FIGS. 8B-8D illustrate gas conduit 880 extending from gas inlet 811 to channel conduit 823 within manifold cap assembly 850. The interior of channel conduit 823 supports channel 810. A process gas may follow flow pattern 914 through gas conduit 880 and into channel 810 contained in channel conduit 823. Channel conduit 821 is in fluid communication with and coupled to gas conduit 882 extending from gas inlet 813 and gas conduit 884 extending from gas inlet 815. A process gas following flow pattern 916 through gas conduit 882 and another process gas following flow pattern 918 through gas conduit 884 may combine within channel 820 contained in channel conduit 821 to form a process gas having flow pattern 922 (FIGS. 8C-8D). Gas channel conduits 821 and 823 may be supported by gas channel supports 852 and 854 attached within gas manifold assembly 800.

In an alternative embodiment, gas conduit 880 and channel conduit 823 are external from gas manifold assembly 800. Gas conduit 880 and channel conduit 823 may be in fluid communication directly to insulation cap 700, plasma screen insert 600, water box 400 or showerhead 300. In another alternative embodiment, gas manifold assembly 800 includes a plurality of electronic control valves (not shown). The electronic control valves as used herein refer to any control valve capable of providing rapid and precise gas flow to process chamber 50 with valve open and close cycles at a rate within a range from about 0.01 seconds to about 10 seconds, preferably from about 0.1 seconds to about 5 seconds, for example, a longer cycle may last about 3 seconds and a shorter cycle may last about 0.5 seconds.

In one example, manifold cap assembly 850 has viewing window assembly 826 for observing the radiance of a plasma (FIG. 8A). Viewing window assembly 826 contains lens edge ring 824 encompassing lens 822 and may be positioned on ledge 814, surrounded by wall surface 816 within manifold block 806. In another example, manifold cap assembly 850 may contain surface 825 that lacks a viewing window (FIG. 1D). Gas conduit assembly 830 may be connected to and in fluid communication with port 117 at flange 834 while extended to be connected to and in fluid communication with gas inlet 813 on manifold block 806.

Figure 9B:
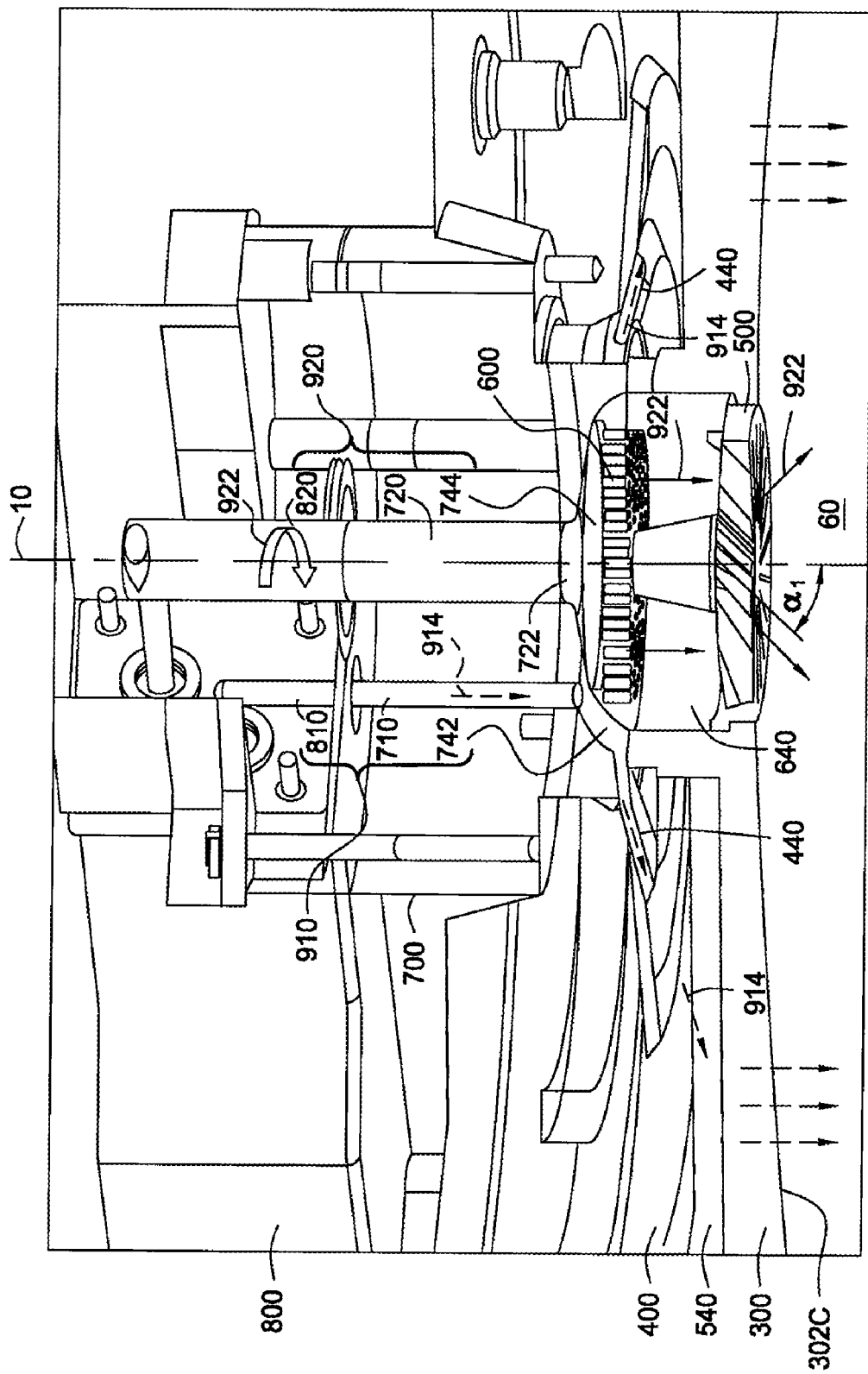
Figure 10A:
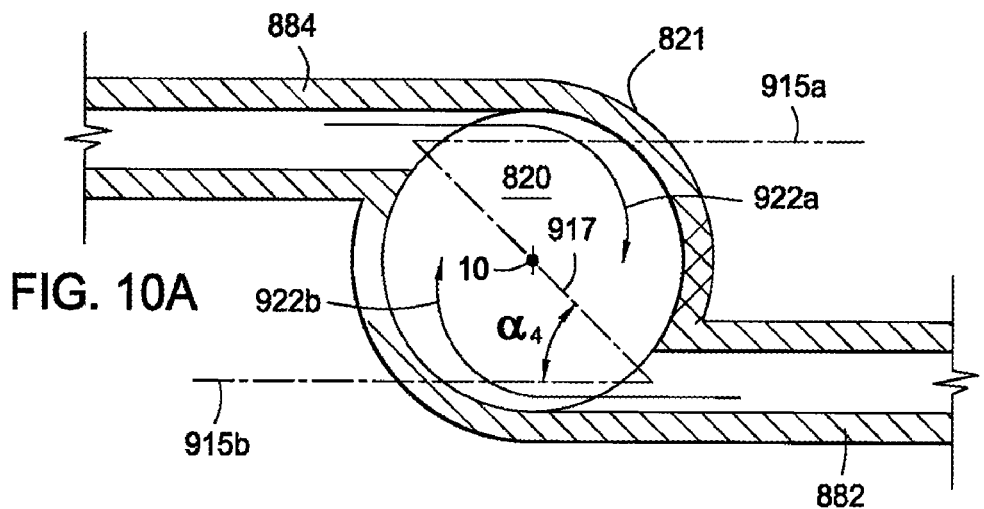
FIGS. 10A-10C illustrate alternative schematic views of a gas flows as described in an embodiment herein.

In one embodiment, gas conduits 882 and 884 are located adjacent the upper portion of channel conduit 821 and channel 820 (FIGS. 8C-8D, 9A and 10A). In other embodiments, one or more gas conduits 882 and 884 may be located along the length of channel 820 between the upper portion of channel 820 and insulation cap 700. Not wishing to be bound by theory, a process gas flowing from gas conduits 882 and 884 into and through channel 820 may form a circular flow pattern, such as flow patterns 922a and 922b (FIG. 10A). Although the exact geometry of flow pattern 922 through channel 820 is not known, it is believed that the process gas may travel with flow pattern 922 having a vortex flow pattern, a helix flow pattern, a spiral flow pattern, a swirl flow pattern, a twirl flow pattern, a twist flow pattern, a coil flow pattern, a corkscrew flow pattern, a curl flow pattern, a whirlpool flow pattern, or derivatives thereof.

Figure 9C:
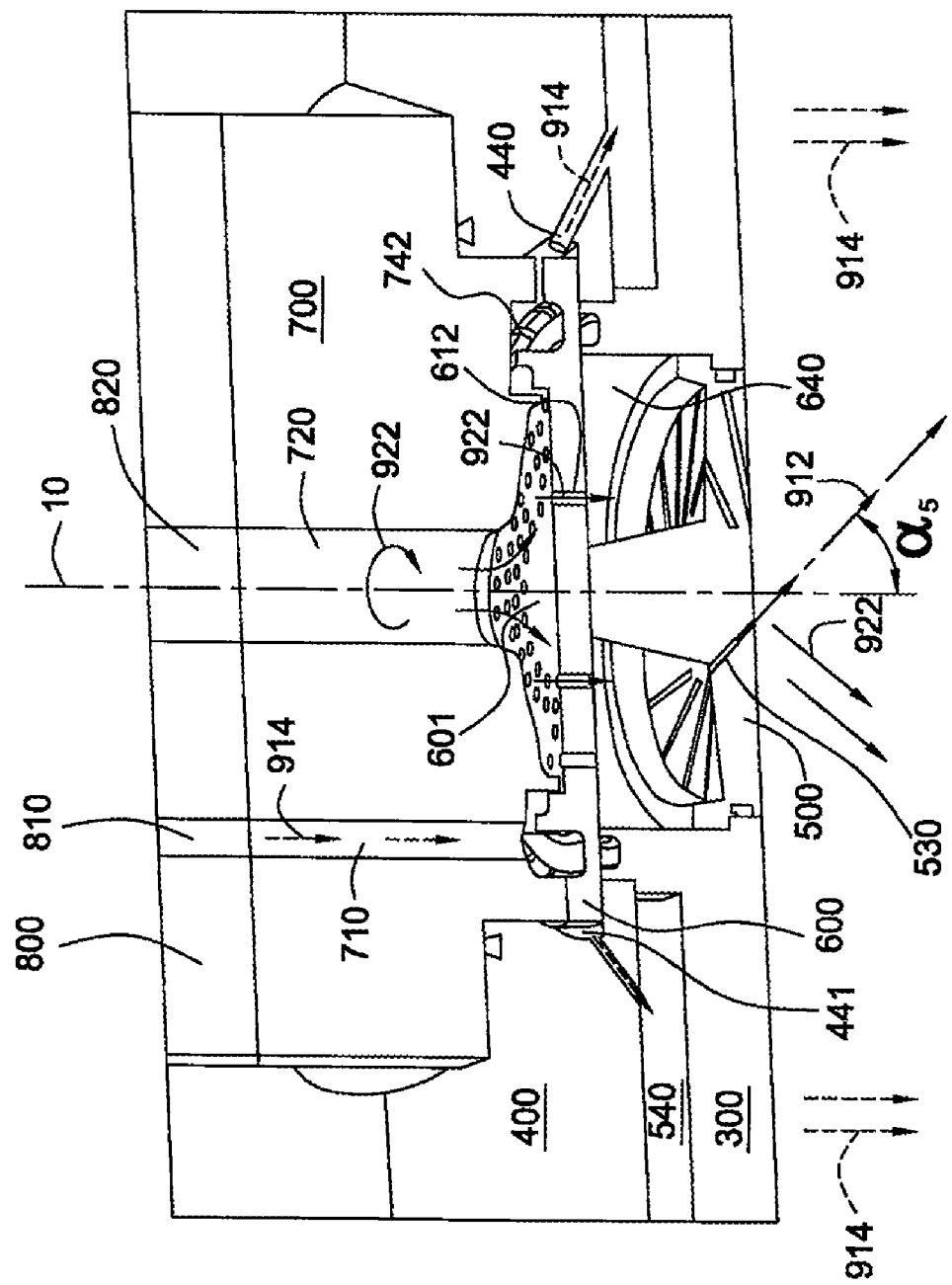

The process gas having flow pattern 922 may be provided within gas region 920, the combined region of channels 720 and 820 and gas region 744 contained within expanding channel 722 (FIG. 9B). In one aspect, the circular flow patterns of flow pattern 922 may help to establish a more efficient purge of gas region 920 due to the sweeping action of the circular flow across the inner surfaces within gas region 920. The circular flow pattern of flow pattern 922 also provides a consistent and conformal delivery of process gas across surface 602 of plasma screen insert 600.

In another embodiment, a process gas passing through gas region 920 with flow pattern 922 is also directed to center portion 601 of plasma screen insert 600 (FIGS. 9A and 9C). Since center portion 601 is free of holes 612, the process gas is directed outwardly, towards holes 612 within upper surface 602. An obscured pathway between gas region 920 and gas region 640 for the process gas is efficiently obtained by forming flow pattern 922. The obscured pathway has many advantages over a non-obscured pathway having a line-of-sight between gas region 920 and gas region 640 including a reduction or absence of a secondary plasma that may be formed between plasma baffle insert 500 and gas manifold assembly 800 within gas region 920.

Flow pattern 922 forms a vertical flow pattern (i.e., parallel to axis 10) since the process gas directional conforms to the angle of holes 612. The process gas passes into gas region 640, is directed outwardly away from conical nose 520 and into slots 510 or holes 530. The process gas is emitted into process region 60 from slots 510 having flow pattern 922 with an injection angle $\alpha_1$, relative from axis 10, as well as from holes 530 having flow pattern 912 with an injection angle $\alpha_5$, relative from axis 10 (FIGS. 9B-9D). Slots 510 contained within plasma baffle insert 500 are positioned at injection angle $\alpha_1$ to direct a process gas having a flow pattern at injection angle $\alpha_1$. Injection angle $\alpha_1$ of the process gas may have an angle within a range from about 20° to about 70°, preferably, from about 30° to about 60°, and more preferably, from about 40° to about 50°, such as about 45°. Holes 530 contained within plasma baffle insert 500 are positioned at injection angle $\alpha_5$ to direct a process gas having a flow pattern at injection angle $\alpha_5$. Injection angle $\alpha_5$ of the process gas may have an angle within a range from about 0° to about 60°, preferably, from about 15° to about 50°, and more preferably, from about 30° to about 40°, such as about 35°. Therefore, flow pattern 922 of the process gas may have a circular pathway inherited from the injection angle $\alpha_1$ of slots 510. The circular pathway usually has a vortex geometry, a helix geometry, a spiral geometry, or a derivative thereof. Also, flow pattern 912 of the process gas may have a conical pathway inherited from the injection angle $\alpha_5$ of holes 530. Process gas having flow pattern 912 may be directed to the center of substrate 8. A substrate within process region 60 may be exposed to the process gas having flow patterns 912 and 922.

Also, the injection angle $\alpha_1$ of slots 510 forms a secondary obscured pathway for the process gas, which is between gas region 640 and process region 60. The secondary obscured pathway further assist the reduction or avoidance of a secondary plasma that may be formed between plasma baffle insert 500 and gas manifold assembly 800 within gas region 920 or within openings 506 on upper surface 503 of plasma baffle insert 500.

In another embodiment, a process gas may have flow pattern 914 while passing through gas region 910, the combined region of channels 710 and 810 and gas region 742 contained within groove 725 (FIG. 9B). Once the process gas enter gas region 742, flow pattern 914 is altered as the process gas is directed around plasma screen insert 600 along circular path 923 (FIG. 9A). The process gas is outwardly directed through slots 614 on plasma screen insert 600 and into gas region 441. An obscured pathway for flow pattern 914 of the process gas is formed between gas region 910 and gas region 441. The obscured pathway has advantages over a non-obscured pathway having a line-of-sight between gas region 910 and gas region 441 including a reduction or absence of a secondary plasma that may be formed between showerhead 300 and gas manifold assembly 800 within gas region 910.

Flow pattern 914 proceeds from gas region 441 with a downwardly flow pattern since the process gas directional conforms to the angle of passageways 440 within water box 400. The process gas passes into gas region 540, is directed outwardly and across upper surface 303 of showerhead 300. The process gas is emitted into process region 60 from holes 310 having flow pattern 914 parallel or substantially parallel of axis 10 (FIG. 9B). A substrate within process region 60 may be exposed to the process gas having flow pattern 914. A secondary obscured pathway for the process gas is formed from gas region 441, to gas region 540 and into process region 60. The secondary obscured pathway further assist the reduction or avoidance of a secondary plasma that may be formed between showerhead 300 and gas manifold assembly 800 within gas region 910.

Figure 10B:
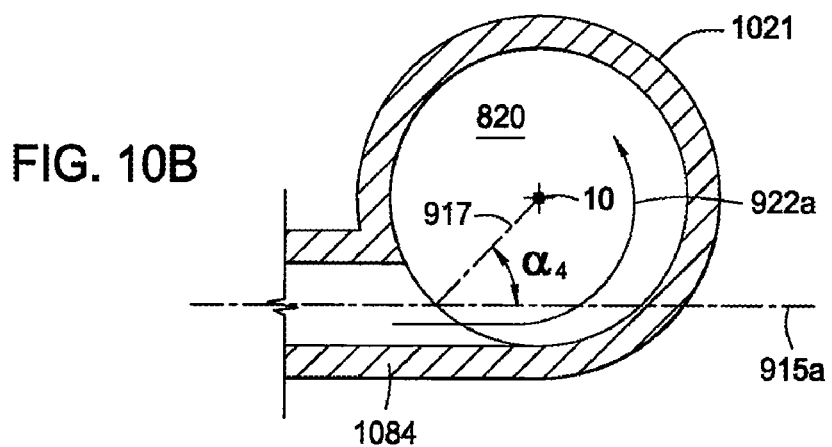
Figure 10C:
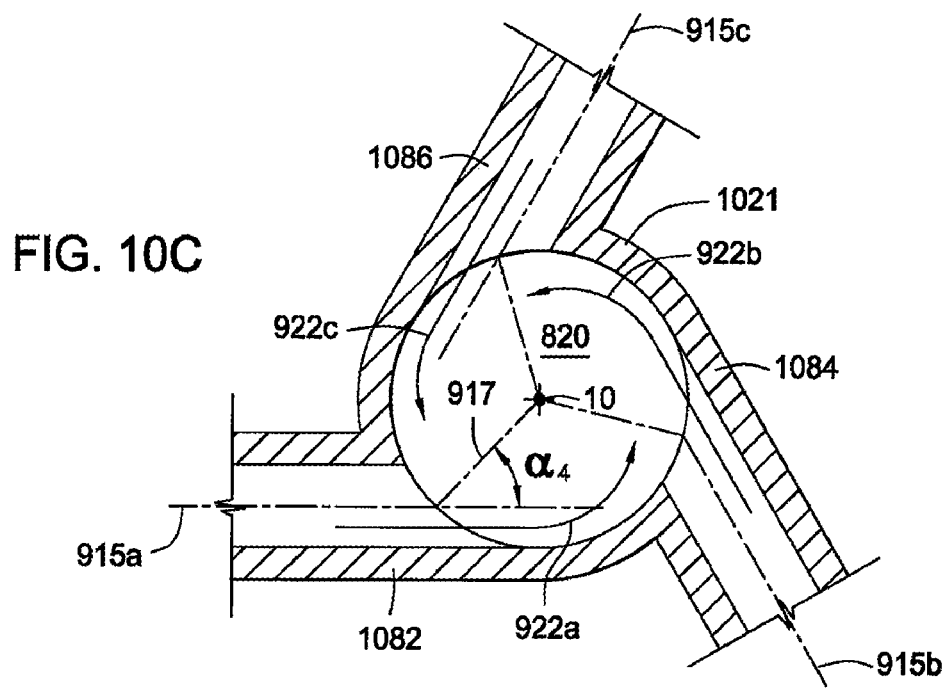

A process gas having circular pathways of flow pattern 922 may be formed by flowing a single process gas or multiple process gases into gas region 820 (FIGS. 10A-10C). In one embodiment, FIG. 10A reveals a top cross-sectional view into channel 820 of channel conduit 821 which is adapted to receive a process gas from gas conduit 882 and a process gas from gas conduit 884. Gas conduit 882 and gas conduit 884 are each coupled to an individual process gas source. Gas conduits 882 and 884 may each be positioned independently at angle $\alpha_4$, measured from center line 915*a* of gas conduit 884 or center line 915*b* of gas conduit 882 to radius line 917 from the center of channel conduit 821, such as axis 10. Gas conduits 882 and 884 may be positioned to have an angle $\alpha_4$ (i.e., when $\alpha_4>0°$) for flowing process gases together in a circular direction, such as flow patterns 922*a* and 922*b*. Flow patterns 922*a* and 922*b* form flow pattern 922 of a process gas passing through channel 820 with a vortex pattern. In one aspect, the circular flow patterns of flow pattern 922 may help to establish a more efficient purge of process region 60 due to the sweeping action of the circular flow across interior surfaces. Also, the circular flow patterns of flow pattern 922 provide a consistent and conformal delivery of process gas to slots 510.

In an alternative embodiment, FIG. 10B is a top cross-sectional view of channel 820 and channel conduit 1021 which is adapted to receive a single gas flow through gas conduit 1084 coupled to a process gas source. Gas conduit 1084 may be positioned at angle $\alpha_4$ from center line 915*a* of gas conduit 1084 and from radius line 917 from the center of channel conduit 1021, such as axis 10. Gas conduit 1084 may be positioned having angle $\alpha_4$ (i.e., when $\alpha_4>0°$) to cause a process gas to flow in a circular direction, such as flow pattern 922*a* and to continue through channel 820 with a vortex pattern.

In another alternative embodiment, FIG. 10C is a top cross-sectional view into channel 820 of channel conduit 1021 which is adapted to receive three gas flows together, partially together (i.e., two of three gas flows together), or separately through three gas inlets, such as gas conduits 1082, 1084 and 1086, each coupled to an individual process gas source. Each one of gas conduits 1082, 1084 and 1086 may be positioned independently at angle $\alpha_4$ from center lines 915*a*, 915*b* and 915*c* of gas conduits 1082, 1084 and 1086 and from radius line 917 from the center of channel conduit 1021, such as axis 10. Each one of gas conduits 1082, 1084 and 1086 may be positioned having angle $\alpha_4$ (i.e., when $\alpha_4>0°$) to cause process gases to flow together in a circular direction, such as flow patterns 922*a*, 922*b* and 922*c* and to continue through channel 820 with a vortex pattern. Further disclosure for adapting process chamber 50 to flow three or more process gas flows is described in commonly assigned U.S. Pat. No. 6,916,398, which is incorporated herein by reference.

In an example for forming a high-k material, the three gas flows may contain a hafnium precursor, a silicon precursor and an oxidizing gas, where, the first flow includes TDEAH, TDMAH, or HfCl$_4$, the second flow includes TDMAS, Tris-DMAS or silane and the third flow includes an oxidizing gas containing water vapor from a water vapor generator (WVG) system. Further disclosure for a process to form high-k materials that may be used with process chamber 50 is described in commonly assigned and co-pending U.S. Ser. No. 11/127,767, filed May 12, 2005, entitled "Apparatus and Methods for Atomic Layer Deposition of Hafnium-Containing High-k Materials," and published as US 2005-0271813, which is incorporated herein by reference.

In an alternative embodiment, conduit system 34 may further contain precursor reservoirs gradually expanding gas conduits forming nozzles at the ends that are also positioned in fluid communication with gas inlets 811, 813 and 815. The nozzles or ends that are useful in some embodiments described herein are further described in commonly assigned U.S. patent Ser. No. 11/119,388, filed Apr. 29, 2005, entitled, "Control of Gas Flow and Delivery to Suppress the Formation of Particles in an MOCVD/ALD System," and published as US 2005-0252449, which is incorporated herein by reference to support disclosure of the precursor reservoirs and the gradually expanding gas conduits. The gas conduit geometry prevents large temperature drops by providing passing gases a means to gradually expand through an increasing tapered flow channel. In one embodiment, the flow channel transitions from the cross-sections of delivery gas lines with internal diameter within a range from about 3 mm to about 15 mm to gas inlets 811, 813 and 815 with a larger diameter within a range from about 10 mm to about 20 mm over a distance within a range from about 30 mm to about 100 mm. A gradual increase of the diameter of a flow channel allows the expanding gases to be in near equilibrium and prevents a rapid lost of heat to maintain a substantially constant temperature. Expanding gas conduits may comprise one or more tapered inner surfaces such as a tapered straight surface, a concave surface, a convex surface, derivatives thereof or combinations thereof or may comprise sections of one or more tapered inner surfaces (e.g., a portion tapered and a portion non-tapered).

Ruthenium ALD Process

Embodiments of the invention provide methods for depositing a variety of material (e.g., ruthenium materials) on a substrate by a vapor deposition process, such as atomic layer deposition (ALD) or plasma-enhanced ALD (PE-ALD). In one aspect, the process has little or no initiation delay and maintains a fast deposition rate while forming a ruthenium material. The ruthenium material is deposited with good step coverage, strong adhesion and contains a low carbon concentration for high electrical conductivity.

In one embodiment, a ruthenium material may be formed during a PE-ALD process containing a constant flow of a reagent gas while providing sequential pulses of a ruthenium precursor and a plasma. In another embodiment, a ruthenium material may be formed during another PE-ALD process that provides sequential pulses of a ruthenium precursor and a reagent plasma. In both of these embodiments, the reagent is generally ionized during the process. Also, the PE-ALD process provides that the plasma may be generated external from the process chamber, such as by a remote plasma generator (RPS) system, or preferably, the plasma may be generated in situ a plasma capable ALD process chamber. During PE-ALD processes, a plasma may be generated from a microwave (MW) frequency generator or a radio frequency (RF) generator. In a preferred example, an in situ plasma is generated by a RF generator, such as within process chamber 50 or with lid assembly 100. In another embodiment, a ruthenium material may be formed during a thermal ALD process that provides sequential pulses of a ruthenium precursor and a reagent.

An ALD process chamber used during embodiments described herein may be process chamber 50, as described above, or another chamber body adapted to receive lid assembly 100, any portion or component of lid assembly 100 or a derivative thereof. Other ALD process chambers may also be used during some of the embodiments described herein and are available from Applied Materials, Inc., located in Santa Clara, Calif. A detailed description of an ALD process chamber may be found in commonly assigned U.S. Pat. Nos. 6,916,398 and 6,878,206, and commonly assigned, co-pending U.S. patent application Ser. No. 10/281,079, entitled "Gas Delivery Apparatus for Atomic Layer Deposition," filed on Oct. 25, 2002, and published as US 2003-0121608, which are hereby incorporated by reference in their entirety. In another embodiment, a chamber configured to operate in both an ALD mode as well as a conventional CVD mode may be used to deposit ruthenium materials is described in commonly assigned and co-pending U.S. Ser. No. 10/712,690, entitled "Apparatus and Method for Hybrid Chemical Processing," filed on Nov. 13, 2003, and published as US 2004-0144311, which are each incorporated herein by reference in their entirety.

The ALD process provides that the process chamber may be pressurized at a pressure within a range from about 0.1 Torr to about 80 Torr, preferably from about 0.5 Torr to about 10 Torr, and more preferably, from about 1 to about 5. Also, the chamber or the substrate may be heated to a temperature of less than about 500° C., preferably within a range from about 100° C. to about 450° C., and more preferably, from about 150° C. to about 400° C., for example, about 300° C. During PE-ALD processes, a plasma is ignited within the process chamber for an in situ plasma process, or alternative, may be formed by an external source, such as a remote plasma generator (RPS) system. A plasma may be generated a MW generator, but preferably by a RF generator. For example, a plasma may be ignited within process chamber 50 or with lid assembly 100. The RF generator may be set at a frequency within a range from about 100 KHz to about 1.6 MHz. In one example, a RF generator, with a frequency of 13.56 MHz, may be set to have a power output within a range from about 100 watts to about 1,000 watts, preferably, from about 250 watts to about 600 watts, and more preferably, from about 300 watts to about 500 watts. In one example, a RF generator, with a frequency of 400 KHz, may be set to have a power output within a range from about 200 watts to about 2,000 watts, preferably, from about 500 watts to about 1,500 watts. A surface of substrate may be exposed to a plasma having a power per surface area value within a range from about 0.01 watts/cm$^2$ to about 10.0 watts/cm$^2$, preferably, from about 0.05 watts/cm$^2$ to about 6.0 watts/cm$^2$.

The substrate may be for example, a silicon substrate having an interconnect pattern defined in one or more dielectric material layers formed thereon. In example, the substrate contains a barrier layer thereon, while in another example, the substrate contains a dielectric surface. The process chamber conditions such as, the temperature and pressure, are adjusted to enhance the adsorption of the process gases on the substrate so as to facilitate the reaction of the pyrrolyl ruthenium precursors and the reagent gas.

In one embodiment, the substrate may be exposed to a reagent gas throughout the whole ALD cycle. The substrate may be exposed to a ruthenium precursor gas formed by passing a carrier gas (e.g., nitrogen or argon) through an ampoule of a ruthenium precursor. The ampoule may be heated depending on the ruthenium precursor used during the process. In one example, an ampoule containing (MeCp)(Py)Ru may be heated to a temperature within a range from about 60° C. to about 100° C., such as 80° C. The ruthenium precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The ruthenium precursor gas and the reagent gas may be combined to form a deposition gas. A reagent gas usually has a flow rate within a range from about 100 sccm to about 3,000 sccm, preferably, from about 200 sccm to about 2,000 sccm, and more preferably, from about 500 sccm to about 1,500 sccm. In one example, ammonia is used as a reagent gas with a flow rate of about 1,500 sccm. The substrate may be exposed to the ruthenium precursor gas or the deposition gas containing the ruthenium precursor and the reagent gas for a time period within a range from about 0.1 seconds to about 8 seconds, preferably, from about 1 second to about 5 seconds, and more preferably, from about 2 seconds to about 4 seconds. The flow of the ruthenium precursor gas may be stopped once the ruthenium precursor is adsorbed on the substrate. The ruthenium precursor may be a discontinuous layer, continuous layer or even multiple layers.

The substrate and chamber may be exposed to a purge step after stopping the flow of the ruthenium precursor gas. The flow rate of the reagent gas may be maintained or adjusted from the previous step during the purge step. Preferably, the flow of the reagent gas is maintained from the previous step. Optionally, a purge gas may be administered into the process chamber with a flow rate within a range from about 100 sccm to about 2,000 sccm, preferably, from about 200 sccm to about 1,000 sccm, and more preferably, from about 300 sccm to about 700 sccm, for example, about 500 sccm. The purge step removes any excess ruthenium precursor and other contaminants within the process chamber. The purge step may be conducted for a time period within a range from about 0.1 seconds to about 8 seconds, preferably, from about 1 second to about 5 seconds, and more preferably, from about 2 seconds to about 4 seconds. The carrier gas, the purge gas and the process gas may contain nitrogen, hydrogen, ammonia, argon, neon, helium or combinations thereof. In a preferred embodiment, the carrier gas contains nitrogen.

Thereafter, the flow of the reagent gas may be maintained or adjusted before igniting a plasma. The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power was turned off. In one example, the reagent may be ammonia, nitrogen, hydrogen or a combination thereof to form an ammonia plasma, a nitrogen plasma, a hydrogen plasma or a combined plasma. The reactant plasma reacts with the adsorbed ruthenium precursor on the substrate to form a ruthenium material thereon. In one example, the reactant plasma is used as a reductant to form metallic ruthenium. However, a variety of reactants may be used to form ruthenium materials having a wide range of compositions. In one example, a boron-containing reactant compound (e.g., diborane) is used to form a ruthenium material containing boride. In another example, a silicon-containing reactant compound (e.g., silane) is used to form a ruthenium material containing silicide.

The process chamber was exposed to a second purge step to remove excess precursors or contaminants from the previous step. The flow rate of the reagent gas may be maintained or adjusted from the previous step during the purge step. An optional purge gas may be administered into the process chamber with a flow rate within a range from about 100 sccm to about 2,000 sccm, preferably, from about 200 sccm to about 1,000 sccm, and more preferably, from about 300 sccm to about 700 sccm, for example, about 500 sccm. The second purge step may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the ruthenium material is deposited on the substrate. The ruthenium material may be deposited with a thickness less than 1,000 Å, preferably less than 500 Å and more preferably from about 10 Å to about 100 Å, for example, about 30 Å. The processes as described herein may deposit a ruthenium material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the ruthenium materials.

In another embodiment, a ruthenium material may be formed during another PE-ALD process that provides sequentially exposing the substrate to pulses of a ruthenium precursor and an active reagent, such as a reagent plasma. The substrate may be exposed to a ruthenium precursor gas formed by passing a carrier gas through an ampoule containing a ruthenium precursor, as described herein. The ruthenium precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The substrate may be exposed to the deposition gas containing the ruthenium precursor and the reagent gas for a time period within a range from about 0.1 seconds to about 8 seconds, preferably, from about 1 second to about 5 seconds, and more preferably from about 2 seconds to about 4 seconds. The flow of the ruthenium precursor gas may be stopped once the ruthenium precursor is adsorbed on the substrate. The ruthenium precursor may be a discontinuous layer, continuous layer or even multiple layers.

Subsequently, the substrate and chamber are exposed to a purge step. A purge gas may be administered into the process chamber during the purge step. In one aspect, the purge gas is the reagent gas, such as ammonia, nitrogen or hydrogen. In another aspect, the purge gas may be a different gas than the reagent gas. For example, the reagent gas may be ammonia and the purge gas may be nitrogen, hydrogen or argon. The purge gas may have a flow rate within a range from about 100 sccm to about 2,000 sccm, preferably, from about 200 sccm to about 1,000 sccm, and more preferably, from about 300 sccm to about 700 sccm, for example, about 500 sccm. The purge step removes any excess ruthenium precursor and other contaminants within the process chamber. The purge step may be conducted for a time period within a range from about 0.1 seconds to about 8 seconds, preferably, from about 1 second to about 5 seconds, and more preferably, from about 2 seconds to about 4 seconds. A carrier gas, a purge gas and a process gas may contain nitrogen, hydrogen, ammonia, argon, neon, helium or combinations thereof.

The substrate and the adsorbed ruthenium precursor thereon may be exposed to the reagent gas during the next step of the ALD process. Optionally, a carrier gas may be administered at the same time as the reagent gas into the process chamber. The reagent gas may be ignited to form a plasma. The reagent gas usually has a flow rate within a range from about 100 sccm to about 3,000 sccm, preferably, from about 200 sccm to about 2,000 sccm, and more preferably, from about 500 sccm to about 1,500 sccm. In one example, ammonia is used as a reagent gas with a flow rate of about 1,500 sccm. The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power may be turned off. In one example, the reagent may be ammonia, nitrogen, hydrogen or combinations thereof, while the plasma may be an ammonia plasma, a nitrogen plasma, a hydrogen plasma or a combination thereof. The reactant plasma reacts with the adsorbed ruthenium precursor on the substrate to form a ruthenium material thereon. Preferably, the reactant plasma is used as a reductant to form metallic ruthenium. However, a variety of reactants may be used to form ruthenium materials having a wide range of compositions, as described herein.

The process chamber may be exposed to a second purge step to remove excess precursors or contaminants from the process chamber. The flow of the reagent gas may have been stopped at the end of the previous step and started during the purge step, if the reagent gas is used as a purge gas. Alternative, a purge gas that is different than the reagent gas may be administered into the process chamber. The reagent gas or purge gas may have a flow rate within a range from about 100 sccm to about 2,000 sccm, preferably, from about 200 sccm to about 1,000 sccm, and more preferably, from about 300 sccm to about 700 sccm, for example, about 500 sccm. The second purge step may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the ruthenium material is deposited on the substrate. The ruthenium material may be deposited with a thickness less than 1,000 Å, preferably less than 500 Å and more preferably from about 10 Å to about 100 Å, for example, about 30 Å. The processes as described herein may deposit a ruthenium material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the ruthenium materials.

Generally, in order to use a ruthenocene compound during an ALD process, a surface treatment step is required, unless the surface is terminated with a hydroxyl group, such as —OH, or an electron-rich surface, such as a metallic layer. On a barrier layer such as tantalum nitride, ruthenocene precursors do not deposit ruthenium materials via ALD processes without a pre-treatment step. Even with a pre-treatment step, such as the hydroxylation of the barrier surface, the randomly placed nucleation sites cause ruthenocene to form satellites or islands of ruthenium during the deposition process. Therefore, an ALD process using a ruthenocene precursor generally deposits a ruthenium material having an increased electrical resistance, probably due to the unevenness of the ruthenium material. Also, the deposition process may suffer a nucleation delay due to the ruthenocene precursor. Furthermore, a high adsorption temperature above 400° C. is usually required for ruthenocene precursors. Such a high temperatures may damage device structure within a sensitive low-k dielectric environment, for example, within a copper back end of line (BEOL) process. Hence, it is preferred to perform ALD processes at a temperature less than 400° C., preferably, less than 350° C. Further, ruthenium materials deposited from ruthenocene precursors used during an ALD process on dielectric surfaces tend to fail tape testing due to the low adhesion of the underlying layer. Therefore, in many embodiments, ruthenocene compounds, such as bis(ethylcyclopentadienyl) ruthenium, bis(cyclopentadienyl) ruthenium and bis(pentamethylcyclopentadienyl) ruthenium are less desirable ruthenium precursors.

Embodiments of the invention include improved methodologies overcoming disadvantages of the prior art, and preferred precursors and chemistries providing additional advantages over the prior art. A family of ruthenium precursors useful to form a ruthenium material during the deposition process described herein includes pyrrolyl ruthenium precursors. A further disclosure of ALD processes for depositing ruthenium materials is described in commonly assigned and co-pending U.S. Ser. No. 11/470,466, filed Sep. 6, 2006, and entitled "Atomic Layer Deposition Process for Ruthenium Materials," which is incorporated herein in its entirety by reference. The pyrrolyl ligand provides the pyrrolyl ruthenium precursor advantages over previous ruthenium precursors (e.g., ruthenocene and derivatives thereof) during an ALD process. The pyrrolyl ligand is more thermodynamically stable than many ligands, as well as forms a very volatile chemical precursor. A pyrrolyl ruthenium precursor contains ruthenium and at least one pyrrolyl ligand or at least one pyrrolyl derivative ligand. A pyrrolyl ruthenium precursor may have a pyrrolyl ligand, such as:

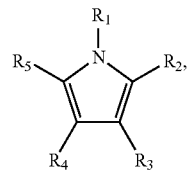

where $R_1$, $R_2$, $R_3$, $R_4$ and $R_5$ are each independently hydrogen, an alkyl group (e.g., methyl, ethyl, propyl, butyl, amyl or higher), an amine group, an alkoxy group, an alcohol group, an aryl group, another pyrrolyl group (e.g., 2,2'-bipyrrolyl), a pyrazole group, derivatives thereof or combinations thereof. The pyrrolyl ligand may have any two or more of $R_1$, $R_2$, $R_3$, $R_4$ and $R_5$ connected together by a chemical group. For example, $R_2$ and $R_3$ may be a portion of a ring structure such as an indolyl group or derivative thereof. A pyrrolyl ruthenium precursor as used herein refers to any chemical compound containing ruthenium and at least one pyrrolyl ligand or at least one derivative of a pyrrolyl ligand. In preferred examples, a pyrrolyl ruthenium precursor may include bis (tetramethylpyrrolyl) ruthenium, bis(2,5-dimethylpyrrolyl) ruthenium, bis(2,5-diethylpyrrolyl) ruthenium, bis(tetraethylpyrrolyl) ruthenium, pentadienyl tetramethylpyrrolyl ruthenium, pentadienyl 2,5-dimethylpyrrolyl ruthenium, pentadienyl tetraethylpyrrolyl ruthenium, pentadienyl 2,5-diethylpyrrolyl ruthenium, 1,3-dimethylpentadienyl pyrrolyl ruthenium, 1,3-diethylpentadienyl pyrrolyl ruthenium, methylcyclopentadienyl pyrrolyl ruthenium, ethylcyclopentadienyl pyrrolyl ruthenium, 2-methylpyrrolyl pyrrolyl ruthenium, 2-ethylpyrrolyl pyrrolyl ruthenium or a derivative thereof.

An important precursor characteristic is to have a favorable vapor pressure. Deposition precursors may have gas, liquid or solid states at ambient temperature and pressure. However, within the ALD chamber, precursors are usually volatilized as gas or plasma. Precursors are usually heated prior to delivery into the process chamber. Although many variables affect the deposition rate during an ALD process to form ruthenium material, the size of the ligand on a pyrrolyl ruthenium precursor is an important consideration in order to achieve a predetermined deposition rate. The size of the ligand does contribute to determining the specific temperature and pressure required to vaporize the pyrrolyl ruthenium precursor. Furthermore, a pyrrolyl ruthenium precursor has a particular ligand steric hindrance proportional to the size of the ligands. In general, larger ligands provide more steric hindrance. Therefore, less molecules of a precursor more bulky ligands may be adsorbed on a surface during the half reaction while exposing the substrate to the precursor than if the precursor contained less bulky ligands. The steric hindrance effect limits the amount of adsorbed precursors on the surface. Therefore, a monolayer of a pyrrolyl ruthenium precursor may be formed to contain a more molecularly concentrated by decreasing the steric hindrance of the ligand(s). The overall deposition rate is proportionally related to the amount of adsorbed precursor on the surface, since an increased deposition rate is usually achieved by having more of the precursor adsorbed to the surface. Ligands that contain smaller functional groups (e.g., hydrogen or methyl) generally provide less steric hindrance than ligands that contain larger functional groups (e.g., aryl). Also, the position on the ligand motif may affect the steric hindrance of the precursor. Generally, the inner positions, $R_2$ and $R_5$, have less affect than does the outer positions $R_3$ and $R_4$. For example, a pyrrolyl ruthenium precursor containing $R_2$ and $R_5$ equal to hydrogen groups and $R_3$ and $R_4$ equal to methyl groups has more steric hindrance than a pyrrolyl ruthenium precursor containing $R_2$ and $R_5$ equal to methyl groups and $R_3$ and $R_4$ equal to hydrogen groups.

A pyrrolyl ligand may be abbreviated by "py" and a pyrrolyl derivative ligand may be abbreviated by "R-py." Exemplary pyrrolyl ruthenium precursors useful to form a ruthenium material during the deposition process described herein include alkyl pyrrolyl ruthenium precursors (e.g., ($R_x$-py) Ru), bis(pyrrolyl) ruthenium precursors (e.g., (py)$_2$Ru) and dienyl pyrrolyl ruthenium precursors (e.g., (Cp)(py)Ru). Examples of alkyl pyrrolyl ruthenium precursors include methylpyrrolyl ruthenium, ethylpyrrolyl ruthenium, propylpyrrolyl ruthenium, dimethylpyrrolyl ruthenium, diethylpyrrolyl ruthenium, dipropylpyrrolyl ruthenium, trimethylpyrrolyl ruthenium, triethylpyrrolyl ruthenium, tetramethylpyrrolyl ruthenium, tetraethylpyrrolyl ruthenium or derivatives thereof. Examples of bis(pyrrolyl) ruthenium precursors include bis(pyrrolyl) ruthenium, bis(methylpyrrolyl) ruthenium, bis(ethylpyrrolyl) ruthenium, bis(propylpyrrolyl) ruthenium, bis(dimethylpyrrolyl) ruthenium, bis(diethylpyrrolyl) ruthenium, bis(dipropylpyrrolyl) ruthenium, bis (trimethylpyrrolyl) ruthenium, bis(triethylpyrrolyl) ruthenium, bis(tetramethylpyrrolyl) ruthenium, bis(tetraethylpyrrolyl) ruthenium, methylpyrrolyl pyrrolyl ruthenium, ethylpyrrolyl pyrrolyl ruthenium, propylpyrrolyl pyrrolyl ruthenium, dimethylpyrrolyl pyrrolyl ruthenium, diethylpyrrolyl pyrrolyl ruthenium, dipropylpyrrolyl pyrrolyl ruthenium, trimethylpyrrolyl pyrrolyl ruthenium, triethylpyrrolyl pyrrolyl ruthenium, tetramethylpyrrolyl pyrrolyl ruthenium, tetraethylpyrrolyl pyrrolyl ruthenium or derivatives thereof.

A dienyl pyrrolyl ruthenium precursor contains at least one dienyl ligand and at least one pyrrolyl ligand. The dienyl ligand may contain a carbon backbone with as little as four carbon atoms or as many as about ten carbon atoms, preferably, about five or six. The dienyl ligand may have a ring structure (e.g., cyclopentadienyl) or may be an open alkyl chain (e.g., pentadienyl). Also, dienyl ligand may contain no alkyl groups, one alkyl group or many alkyl groups.

In one embodiment, the dienyl pyrrolyl ruthenium precursor contains a pentadienyl ligand or an alkylpentadienyl ligand. Examples of pentadienyl pyrrolyl ruthenium precursors include pentadienyl pyrrolyl ruthenium, pentadienyl methylpyrrolyl ruthenium, pentadienyl ethylpyrrolyl ruthenium, pentadienyl propylpyrrolyl ruthenium, pentadienyl dimethylpyrrolyl ruthenium, pentadienyl diethylpyrrolyl ruthenium, pentadienyl dipropylpyrrolyl ruthenium, pentadienyl trimethylpyrrolyl ruthenium, pentadienyl triethylpyrrolyl ruthenium, pentadienyl tetramethylpyrrolyl ruthenium, pentadienyl tetraethylpyrrolyl ruthenium or derivatives thereof. Examples of alkylpentadienyl pyrrolyl ruthenium precursors include alkylpentadienyl pyrrolyl ruthenium, alkylpentadienyl methylpyrrolyl ruthenium, alkylpentadienyl ethylpyrrolyl ruthenium, alkylpentadienyl propylpyrrolyl ruthenium, alkylpentadienyl dimethylpyrrolyl ruthenium, alkylpentadienyl diethylpyrrolyl ruthenium, alkylpentadienyl dipropylpyrrolyl ruthenium, alkylpentadienyl trimethylpyrrolyl ruthenium, alkylpentadienyl triethylpyrrolyl ruthenium, alkylpentadienyl tetramethylpyrrolyl ruthenium, alkylpentadienyl tetraethylpyrrolyl ruthenium or derivatives thereof.

In another embodiment, the dienyl pyrrolyl ruthenium precursor contains a cyclopentadienyl ligand or an alkylcyclopentadienyl ligand. Examples of cyclopentadienyl pyrrolyl ruthenium precursors include cyclopentadienyl pyrrolyl ruthenium, cyclopentadienyl methylpyrrolyl ruthenium, cyclopentadienyl ethylpyrrolyl ruthenium, cyclopentadienyl propylpyrrolyl ruthenium, cyclopentadienyl dimethylpyrrolyl ruthenium, cyclopentadienyl diethylpyrrolyl ruthenium, cyclopentadienyl dipropylpyrrolyl ruthenium, cyclopentadienyl trimethylpyrrolyl ruthenium, cyclopentadienyl triethylpyrrolyl ruthenium, cyclopentadienyl tetramethylpyrrolyl ruthenium, cyclopentadienyl tetraethylpyrrolyl ruthenium or derivatives thereof. Examples of alkylcyclopentadienyl pyrrolyl ruthenium precursors include alkylcyclopentadienyl pyrrolyl ruthenium, alkylcyclopentadienyl methylpyrrolyl ruthenium, alkylcyclopentadienyl ethyl pyrrolyl ruthenium, alkylcyclopentadienyl propylpyrrolyl ruthenium, alkylcyclopentadienyl dimethylpyrrolyl ruthenium, alkylcyclopentadienyl diethylpyrrolyl ruthenium, alkylcyclopentadienyl dipropylpyrrolyl ruthenium, alkylcyclopentadienyl trimethylpyrrolyl ruthenium, alkylcyclopentadienyl triethylpyrrolyl ruthenium, alkylcyclopentadienyl tetramethylpyrrolyl ruthenium, alkylcyclopentadienyl tetraethylpyrrolyl ruthenium or derivatives thereof.

In another embodiment, a ruthenium precursor may not contain a pyrrolyl ligand or a pyrrolyl derivative ligand, but instead, contain at least one open chain dienyl ligand, such as $CH_2CRCHCRCH_2$, where R is independently an alkyl group or hydrogen. A ruthenium precursor may have two open-chain dienyl ligands, such as pentadienyl or heptadienyl. A bis(pentadienyl) ruthenium compound has a generic chemical formula $(CH_2CRCHCRCH_2)_2Ru$, where R is independently an alkyl group or hydrogen. Usually, R is independently hydrogen, methyl, ethyl, propyl or butyl. Therefore, ruthenium precursors may include bis(dialkylpentadienyl) ruthenium compounds, bis(alkylpentadienyl) ruthenium compounds, bis(pentadienyl) ruthenium compounds or combinations thereof. Examples of ruthenium precursors include bis(2,4-dimethylpentadienyl) ruthenium, bis(2,4-diethylpentadienyl) ruthenium, bis(2,4-diisopropylpentadienyl) ruthenium, bis(2,4-ditertbutylpentadienyl) ruthenium, bis(methylpentadienyl)ruthenium, bis(ethylpentadienyl) ruthenium, bis (isopropylpentadienyl) ruthenium, bis(tertbutylpentadienyl) ruthenium, derivatives thereof or combinations thereof. In some embodiments, other ruthenium precursors include tris (2,2,6,6-tetramethyl-3,5-heptanedionato) ruthenium, dicarbonyl pentadienyl ruthenium, ruthenium acetyl acetonate, 2,4-dimethylpentadienyl cyclopentadienyl ruthenium, bis(2, 2,6,6-tetramethyl-3,5-heptanedionato) (1,5-cyclooctadiene) ruthenium, 2,4-dimethylpentadienyl methylcyclopentadienyl ruthenium, 1,5-cyclooctadiene cyclopentadienyl ruthenium, 1,5-cyclooctadiene methylcyclopentadienyl ruthenium, 1,5-cyclooctadiene ethylcyclopentadienyl ruthenium, 2,4-dimethylpentadienyl ethylcyclopentadienyl ruthenium, 2,4-dimethylpentadienyl isopropylcyclopentadienyl ruthenium, bis(N,N-dimethyl 1,3-tetramethyl diiminato) 1,5-cyclooctadiene ruthenium, bis(N,N-dimethyl 1,3-dimethyl diiminato) 1,5-cyclooctadiene ruthenium, bis(allyl) 1,5-cyclooctadiene ruthenium, $\eta^6$-$C_6H_6$ 1,3-cyclohexadiene ruthenium, bis(1,1-dimethyl-2-aminoethoxylato) 1,5-cyclooctadiene ruthenium, bis(1,1-dimethyl-2-aminoethylaminato) 1,5-cyclooctadiene ruthenium, derivatives thereof, or combinations thereof.

The various ruthenium precursors containing a pyrrolyl ligand, an open chain dienyl ligand or a combination thereof may be used with at least one reagent to form a ruthenium material. The ruthenium precursor and the reagent may be sequentially introduced into the process chamber during a thermal ALD process or a PE-ALD process. A suitable reagent for forming a ruthenium material may be a reducing gas and include hydrogen (e.g., $H_2$ or atomic-H), atomic-N, ammonia ($NH_3$), hydrazine ($N_2H_4$), silane ($SiH_4$), disilane ($Si_2H_6$), trisilane ($Si_3H_8$), tetrasilane ($Si_4H_{10}$), dimethylsilane ($SiC_2H_8$), methyl silane ($SiCH_6$), ethylsilane ($SiC_2H_8$), chlorosilane ($ClSiH_3$), dichlorosilane ($Cl_2SiH_2$), hexachlorodisilane ($Si_2Cl_6$), borane ($BH_3$), diborane ($B_2H_6$), triborane, tetraborane, pentaborane, triethylborane ($Et_3B$), derivatives thereof, plasmas thereof, or combinations thereof.

In an alternative embodiment, the reagent gas may include oxygen-containing gases, such as oxygen (e.g., $O_2$), nitrous oxide ($N_2O$), nitric oxide (NO), nitrogen dioxide ($NO_2$), derivatives thereof or combinations thereof. Furthermore, the traditional reductants may be combined with the oxygen-containing reagents to form a reagent gas. Oxygen-containing gases that may be used during deposition processes to form ruthenium materials have traditionally been used in the chemical art as an oxidant. However, ligands on a metal-organic compound containing a noble metal (e.g., Ru) are usually more susceptible to the oxygen-containing reductants than the noble metal. Therefore, the ligand is generally oxidized from the metal center while the metal ion is reduced to form the elemental metal. In one embodiment, the reagent gas contains ambient oxygen from the air that may be dried over sieves to reduce ambient water. Further disclosure useful for processes described herein, including a process for depositing a ruthenium material by using an oxygen-containing gas, is further described in commonly assigned and co-pending U.S. Ser. No. 10/811,230, entitled "Ruthenium Layer Formation for Copper Film Deposition," filed Mar. 26, 2004, and published as US 2004-0241321, which is incorporated herein in its entirety by reference.

The time interval for the pulse of the ruthenium precursor is variable depending upon a number of factors such as, for example, the volume capacity of the process chamber employed, the vacuum system coupled thereto and the volatility/reactivity of the reactants used during the ALD process. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the ruthenium precursor provides a sufficient amount of precursor so that at least a monolayer of the ruthenium precursor is adsorbed on the substrate. Thereafter, excess ruthenium precursor remaining in the chamber may be removed from the process chamber by the constant carrier gas stream in combination with the vacuum system.

The time interval for each of the pulses of the ruthenium precursor and the reagent gas may have the same duration. That is, the duration of the pulse of the ruthenium precursor may be identical to the duration of the pulse of the reagent gas. For such an embodiment, a time interval ($T_1$) for the pulse of the ruthenium precursor is equal to a time interval ($T_2$) for the pulse of the reagent gas.

Alternatively, the time interval for each of the pulses of the ruthenium precursor and the reagent gas may have different durations. That is, the duration of the pulse of the ruthenium precursor may be shorter or longer than the duration of the pulse of the reagent gas. For such an embodiment, a time interval ($T_1$) for the pulse of the ruthenium precursor is different than the time interval ($T_2$) for the pulse of the reagent gas.

In addition, the periods of non-pulsing between each of the pulses of the ruthenium precursor and the reagent gas may have the same duration. That is, the duration of the period of non-pulsing between each pulse of the ruthenium precursor and each pulse of the reagent gas is identical. For such an embodiment, a time interval ($T_3$) of non-pulsing between the pulse of the ruthenium precursor and the pulse of the reagent gas is equal to a time interval ($T_4$) of non-pulsing between the pulse of the reagent gas and the pulse of the ruthenium precursor. During the time periods of non-pulsing only the constant carrier gas stream is provided to the process chamber.

Alternatively, the periods of non-pulsing between each of the pulses of the ruthenium precursor and the reagent gas may have different duration. That is, the duration of the period of non-pulsing between each pulse of the ruthenium precursor and each pulse of the reagent gas may be shorter or longer than the duration of the period of non-pulsing between each pulse of the reagent gas and the ruthenium precursor. For such an embodiment, a time interval ($T_3$) of non-pulsing between the pulse of the ruthenium precursor and the pulse of the reagent gas is different from a time interval ($T_4$) of non-pulsing between the pulse of the reagent gas and the pulse of ruthenium precursor. During the time periods of non-pulsing only the constant carrier gas stream is provided to the process chamber.

Additionally, the time intervals for each pulse of the ruthenium precursor, the reagent gas and the periods of non-pulsing therebetween for each deposition cycle may have the same duration. For such an embodiment, a time interval ($T_1$) for the ruthenium precursor, a time interval ($T_2$) for the reagent gas, a time interval ($T_3$) of non-pulsing between the pulse of the ruthenium precursor and the pulse of the reagent gas and a time interval ($T_4$) of non-pulsing between the pulse of the reagent gas and the pulse of the ruthenium precursor each have the same value for each deposition cycle. For example, in a first deposition cycle ($C_1$), a time interval ($T_1$) for the pulse of the ruthenium precursor has the same duration as the time interval ($T_1$) for the pulse of the ruthenium precursor in subsequent deposition cycles ($C_2 \ldots C_n$). Similarly, the duration of each pulse of the reagent gas and the periods of non-pulsing between the pulse of the ruthenium precursor and the reagent gas in the first deposition cycle ($C_1$) is the same as the duration of each pulse of the reagent gas and the periods of non-pulsing between the pulse of the ruthenium precursor and the reagent gas in subsequent deposition cycles ($C_2 \ldots C_n$), respectively.

Alternatively, the time intervals for at least one pulse of the ruthenium precursor, the reagent gas and the periods of non-pulsing therebetween for one or more of the deposition cycles of the ruthenium material deposition process may have different durations. For such an embodiment, one or more of the time intervals ($T_1$) for the pulses of the ruthenium precursor, the time intervals ($T_2$) for the pulses of the reagent gas, the time intervals ($T_3$) of non-pulsing between the pulse of the ruthenium precursor and the reagent gas and the time intervals ($T_4$) of non-pulsing between the pulses of the reagent gas and the ruthenium precursor may have different values for one or more deposition cycles of the cyclical deposition process. For example, in a first deposition cycle ($C_1$), the time interval ($T_1$) for the pulse of the ruthenium precursor may be longer or shorter than one or more time interval ($T_1$) for the pulse of the ruthenium precursor in subsequent deposition cycles ($C_2 \ldots C_n$). Similarly, the durations of the pulses of the reagent gas and the periods of non-pulsing between the pulse of the ruthenium precursor and the reagent gas in the first deposition cycle ($C_1$) may be the same or different than the duration of each pulse of the reagent gas and the periods of non-pulsing between the pulse of the ruthenium precursor and the reagent gas in subsequent deposition cycles ($C_2 \ldots C_n$).

In some embodiments, a constant flow of a carrier gas or a purge gas may be provided to the process chamber modulated by alternating periods of pulsing and non-pulsing where the periods of pulsing alternate between the ruthenium precursor and the reagent gas along with the carrier/purge gas stream, while the periods of non-pulsing include only the carrier/purge gas stream.

A PE-ALD process chamber (e.g., process chamber 50) may be used to form many materials including tantalum, tantalum nitride, titanium, titanium nitride, ruthenium, tungsten, tungsten nitride and other materials. In one embodiment, ruthenium material may be deposited on a barrier layer containing tantalum and/or tantalum nitride, which may be formed during an ALD process as described in commonly assigned U.S. Pat. No. 6,951,804, which is incorporated herein in its entirety by reference. Further disclosure of processes for depositing a tungsten material on a ruthenium material is further described in commonly assigned and co-pending U.S. Ser. No. 11/009,331, entitled "Ruthenium as an Underlayer for Tungsten Film Deposition," filed Dec. 10, 2004, and published as US 2006-0128150, which is incorporated herein in its entirety by reference.

In one example, a copper seed layer may be formed on the ruthenium material by a CVD process and thereafter, bulk copper is deposited to fill the interconnect by an ECP process. In another example, a copper seed layer may be formed on the ruthenium material by a PVD process and thereafter, bulk copper is deposited to fill the interconnect by an ECP process. In another example, a copper seed layer may be formed on the ruthenium material by an electroless process and thereafter, bulk copper is deposited to fill the interconnect by an ECP process. In another example, the ruthenium material serves as a seed layer to which a copper bulk fill is directly deposited by an ECP process or an electroless deposition process.

In another example, a tungsten seed layer may be formed on the ruthenium material by an ALD process and thereafter, bulk tungsten is deposited to fill the interconnect by a CVD process or a pulsed-CVD process. In another example, a tungsten seed layer may be formed on the ruthenium material by a PVD process and thereafter, bulk tungsten is deposited to fill the interconnect by a CVD process or a pulsed-CVD process. In another example, a tungsten seed layer may be formed on the ruthenium material by an ALD process and thereafter, bulk tungsten is deposited to fill the interconnect by an ECP process. In another example, the ruthenium material serves as a seed layer to which a tungsten bulk fill is directly deposited by a CVD process or a pulsed-CVD process.

Several integration sequence are conducted in order to form a ruthenium material within an interconnect. In one example, the subsequent steps follow: a) pre-clean of the substrate; b) deposition of a barrier layer (e.g., ALD of TaN); c) deposition of ruthenium by ALD; and d) deposition of seed copper by electroless, ECP or PVD followed by deposition of bulk copper by ECP. In another example, the subsequent steps follow: a) deposition of a barrier layer (e.g., ALD of TaN); b) punch through step; c) deposition of ruthenium by ALD; and d) deposition of seed copper by electroless, ECP or PVD followed by deposition of bulk copper by ECP. In another example, the subsequent steps follow: a) deposition of ruthenium by ALD; b) punch through step; c) deposition of ruthenium by ALD; and d) deposition of seed copper by electroless, ECP or PVD followed by deposition of bulk copper by electroless, ECP or PVD. In another example, the subsequent steps follow: a) deposition of ruthenium by ALD; b) punch through step; c) deposition of ruthenium by ALD; and d) deposition of copper by electroless or ECP. In another embodiment, the subsequent steps follow: a) pre-clean of the substrate; b) deposition of ruthenium by ALD; and c) deposition of seed copper by electroless, ECP or PVD followed by deposition of bulk copper by ECP. In another example, the subsequent steps follow: a) deposition of a barrier layer (e.g., ALD of TaN); b) deposition of ruthenium by ALD; c) punch through step; d) deposition of ruthenium by ALD; and e) deposition of seed copper by electroless, ECP or PVD followed by deposition of bulk copper by ECP. In another example, the subsequent steps follow: a) deposition of a barrier layer (e.g., ALD of TaN); b) punch through step; c) deposition of a barrier layer (e.g., ALD of TaN); d) deposition of ruthenium by ALD; and d) deposition of seed copper by electroless, ECP or PVD; and e) deposition of bulk copper by ECP. In one example, the subsequent steps follow: a) pre-clean of the substrate; b) deposition of a barrier layer (e.g., ALD of TaN); c) deposition of ruthenium by ALD; and d) deposition of copper bulk by electroless or ECP.

The pre-clean steps include methods to clean or purify the via, such as the removal of residue at the bottom of the via (e.g., carbon) or reduction of copper oxide to copper metal. Punch through steps include a method to remove material (e.g., barrier layer) from the bottom of the via to expose conductive layer, such as copper. Further disclosure of punch through steps is described in more detail in the commonly assigned, U.S. Pat. No. 6,498,091, which is incorporated herein in its entirety by reference. The punch through steps may be conducted within a process chamber, such as either a barrier chamber or a clean chamber. In embodiments of the invention, clean steps and punch through steps are applied to ruthenium barrier layers. Further disclosure of overall integrated methods are described in more detail in the commonly assigned, U.S. Pat. No. 7,049,226, which is incorporated herein in its entirety by reference.

The pyrrolyl ruthenium precursors and deposition chemistries utilized in the various embodiments provide further significant advantages. The layers formed by the present ruthenium methodologies and precursors, such as pyrrolyl ruthenium precursors, have high nucleation density and uniformity. This is believed to promote freedom from surface defects such as satellites or islands in the resulting ruthenium material, in contrast to layers deposited by prior art methods and where prior methods employ sole ruthenocene compounds.

The pyrrolyl ruthenium precursors used to form ruthenium materials provide little or no nucleation delay during the ALD process. Also, the ruthenium material deposited has a low carbon concentration and therefore a high electrical conductance.

Also, the pyrrolyl ruthenium precursor and the reagents are utilized in various embodiments during the ALD processes to deposit a ruthenium material on a barrier layer, especially a tantalum nitride barrier layer. Unlike other ALD processes that use ruthenocene, the present ruthenium methodologies and precursors are not limited with the need to pre-treat the barrier layer prior to the deposition of a ruthenium material. Excess process steps, such as pretreatment steps, are avoided by applying a pyrrolyl ruthenium precursor during an ALD process to reduce the overall throughput of the production line.

Further, ruthenium materials deposited with the present methodologies, especially when employing a pyrrolyl ruthenium precursor, have superior adhesion properties to barrier layers as well as dielectric materials. It is believe the superior adhesion at least in part is due to the higher degree of uniformity and nucleation density, whereby a more level surface and fewer surface defects results. Furthermore, ruthenocene compounds generally require a temperature above 400° C. in order to become adsorbed to a substrate surface needed during an ALD process. However, since the threshold of many low-k devices is around 400° C., ruthenocene compounds are not desirable ruthenium precursors for ALD processes.

The ruthenium materials formed from a pyrrolyl ruthenium precursor during the ALD processes as described herein generally have a sheet resistance of less than 2,000 Ω/sq, preferably, less than 1,000 Ω/sq, and more preferably, less than 500 Ω/sq. For example, a ruthenium material may have a sheet resistance within a range from about 10 Ω/sq to about 250 Ω/sq.

A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Unless otherwise noted, embodiments and examples described herein are preferably conducted on substrates with a 200 mm diameter or a 300 mm diameter, more preferably, a 300 mm diameter. Processes of the embodiments described herein deposit ruthenium materials on many substrates and surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal and/or bake the substrate surface.

"Atomic layer deposition" (ALD) or "cyclical deposition" as used herein refers to the sequential introduction of two or more reactive compounds to deposit a layer of material on a substrate surface. The two, three or more reactive compounds may alternatively be introduced into a reaction zone or process region of a process chamber. The reactive compounds may be in a state of gas, plasma, vapor, fluid or other state of matter useful for a vapor deposition process. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. Compound A and compound B react to form a deposited material. During each time delay a purge gas is introduced into the process chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film thickness of the deposited material is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In another embodiment, a first precursor containing compound A, a second precursor containing compound B and a third precursor containing compound C are each separately pulsed into the process chamber. Alternatively, a pulse of a first precursor may overlap in time with a pulse of a second precursor while a pulse of a third precursor does not overlap in time with either pulse of the first and second precursors. "Process gas" as used herein refers to a single gas, multiple gases, a gas containing a plasma, combinations of gas(es) and/or plasma(s). A process gas may contain at least one reactive compound for a vapor deposition process. The reactive compounds may be in a state of gas, plasma, vapor, fluid or other state of matter useful for a vapor deposition process. Also, a process may contain a purge gas or a carrier gas and not contain a reactive compound.

Experiments

The experiments in this section were conducted on substrates initially prepared by thermally growing a silicon dioxide layer with a thickness of 3,000 Å. Subsequently, a tantalum nitride layer was deposited by an ALD process with a thickness of 10 Å. A full description of the deposition techniques are further discussed in commonly assigned U.S. Pat. No. 6,951,804, which is incorporated herein in its entirety by reference. The tantalum nitride film is a dielectric with a sheet resistance greater than about 20,000 Ω/sq.

The ALD experiments were completed in an ALD chamber, as described above, available from Applied Materials, Inc., located in Santa Clara, Calif. The chamber spacing (distance between the wafer and the top of chamber body) was 230 mils (5.84 mm).

Experiment 1: $(DMPD)_2Ru$ with constant flow of $NH_3$ and intermediate plasma—The ruthenium precursor used during this experiment was bis(2,4-dimethylpentadienyl) ruthenium ($(DMPD)_2Ru$). During the experiment, the pressure within the process chamber was maintained at about 2 Torr and the substrate was heated to about 300° C. An ALD cycle included the following steps. A ruthenium precursor gas was formed by passing a nitrogen carrier gas with a flow rate of about 500 sccm through an ampoule of $(DMPD)_2Ru$ heated at a temperature of about 80° C. The substrate was exposed to the ruthenium precursor gas with a flow rate of about 500 sccm and ammonia gas with a flow rate of about 1,500 sccm for about 3 seconds. The flow of the ruthenium precursor gas was stopped while the flow of the ammonia gas was maintained during a purge step. The purge step was conducted for about 2 seconds. Subsequently, a plasma was ignited to form an ammonia plasma from the ammonia gas while maintaining the flow rate. The RF generator, having the power output set to about 125 watts at 13.56 MHz, produced the plasma for about 4 seconds during the plasma step. Thereafter, the plasma power was turned off and the chamber was exposed to a second purge step of the ammonia gas with a constant flow rate for about 2 seconds. The deposition process was stopped after the repetition of about 140 ALD cycles. A layer of ruthenium material was deposited on the substrate with a thickness of about 5 Å. The data from the experiment was analyzed to determine no existence of a nucleation delay and the average deposition rate was about 0.22 Å/cycle.

Experiment 2: (MeCp)(EtCp)Ru with constant flow of $NH_3$ and intermediate plasma—The ruthenium precursor used during this experiment was methylcyclopentadienyl ethylcyclopentadienyl ruthenium ((MeCp)(EtCp)Ru). During the experiment, the pressure within the process chamber was maintained at about 2 Torr and the substrate was heated to about 300° C. An ALD cycle included the following steps. A ruthenium precursor gas was formed by passing a nitrogen carrier gas with a flow rate of about 500 sccm through an ampoule of (MeCp)(EtCp)Ru heated at a temperature of about 80° C. The substrate was exposed to the ruthenium precursor gas with a flow rate of about 500 sccm and ammonia gas with a flow rate of about 1,500 sccm for about 3 seconds. The flow of the ruthenium precursor gas was stopped while the flow of the ammonia gas was maintained during a purge step. The purge step was conducted for about 2 seconds. Subsequently, a plasma was ignited to form an ammonia plasma from the ammonia gas while maintaining the flow rate. The RF generator, having the power output set to about 125 watts at 13.56 MHz, produced the plasma for about 4 seconds during the plasma step. Thereafter, the plasma power was turned off and the chamber was exposed to a second purge step of the ammonia gas with a constant flow rate for about 2 seconds. The deposition process was stopped after the repetition of about 140 ALD cycles. A layer of ruthenium material was deposited on the substrate with a thickness of about 6 Å. The data from the experiment was analyzed to determine the existence of a nucleation delay.

Experiment 3: (MeCp)(Py)Ru with constant flow of $NH_3$ and intermediate plasma—The ruthenium precursor used during this experiment was methylcyclopentadienyl pyrrolyl ruthenium ((MeCp)(Py)Ru). During the experiment, the pressure within the process chamber was maintained at about 2 Torr and the substrate was heated to about 300° C. An ALD cycle included the following steps. A ruthenium precursor gas was formed by passing a nitrogen carrier gas with a flow rate of about 500 sccm through an ampoule of (MeCp)(Py)Ru heated at a temperature of about 80° C. The substrate was exposed to the ruthenium precursor gas with a flow rate of about 500 sccm and ammonia gas with a flow rate of about 1,500 sccm for about 3 seconds. The flow of the ruthenium precursor gas was stopped while the flow of the ammonia gas was maintained during a purge step. The purge step was conducted for about 2 seconds. Subsequently, a plasma was ignited to form an ammonia plasma from the ammonia gas while maintaining the flow rate. The RF generator, having the power output set to about 300 watts at 13.56 MHz, produced the plasma for about 4 seconds during the plasma step. Thereafter, the plasma power was turned off and the chamber was exposed to a second purge step of the ammonia gas with a constant flow rate for about 2 seconds. The deposition process was stopped after the repetition of about 140 ALD cycles. A layer of ruthenium material was deposited on the substrate with a thickness of about 49 Å. The data from the experiment was analyzed to determine no existence of a nucleation delay and the average deposition rate was about 0.35 Å/cycle.

Experiment 4: (MeCp)(Py)Ru with constant flow of $N_2$ and intermediate plasma—During the experiment, the pressure within the process chamber was maintained at about 4 Torr and the substrate was heated to about 350° C. An ALD cycle included the following steps. A ruthenium precursor gas was formed by passing a nitrogen carrier gas with a flow rate of about 500 sccm through an ampoule of (MeCp)(Py)Ru heated at a temperature of about 80° C. The substrate was exposed to the ruthenium precursor gas with a flow rate of about 500 sccm and nitrogen gas with a flow rate of about 1,500 sccm for about 3 seconds. The flow of the ruthenium precursor gas was stopped while the flow of the nitrogen gas was maintained during a purge step. The purge step was conducted for about 2 seconds. Subsequently, a plasma was ignited to form a nitrogen plasma from the nitrogen gas while maintaining the flow rate. The RF generator, having the power output set to about 500 watts at 13.56 MHz, produced the plasma for about 4 seconds during the plasma step. Thereafter, the plasma power was turned off and the chamber was exposed to a second purge step of the nitrogen gas with a constant flow rate for about 2 seconds. The deposition process was stopped after the repetition of about 140 ALD cycles. A layer of ruthenium material was deposited on the substrate with a thickness of about 46 Å. The data from the experiment was analyzed to determine no existence of a nucleation delay and the average deposition rate was about 0.33 Å/cycle.

Experiment 5: (MeCp)(Py)Ru with constant flow of $H_2$ and intermediate plasma—During the experiment, the pressure within the process chamber was maintained at about 4 Torr and the substrate was heated to about 350° C. An ALD cycle included the following steps. A ruthenium precursor gas was formed by passing a nitrogen carrier gas with a flow rate of about 500 sccm through an ampoule of (MeCp)(Py)Ru heated at a temperature of about 80° C. The substrate was exposed to the ruthenium precursor gas with a flow rate of about 500 sccm and hydrogen gas with a flow rate of about 1,500 sccm for about 3 seconds. The flow of the ruthenium precursor gas was stopped while the flow of the hydrogen gas was maintained during a purge step. The purge step was conducted for about 2 seconds. Subsequently, a plasma was ignited to form a hydrogen plasma from the hydrogen gas while maintaining the flow rate. The RF generator, having the power output set to about 500 watts at 13.56 MHz, produced the plasma for about 4 seconds during the plasma step. Thereafter, the plasma power was turned off and the chamber was exposed to a second purge step of the hydrogen gas with a constant flow rate for about 2 seconds. The deposition process was stopped after the repetition of about 140 ALD cycles. A layer of ruthenium material was deposited on the substrate with a thickness of about 45 Å. The data from the experiment was analyzed to determine no existence of a nucleation delay and the average deposition rate was about 0.32 Å/cycle.

Experiment 6: (MeCp)(Py)Ru with intermediate $NH_3$ plasma—During the experiment, the pressure within the process chamber was maintained at about 2 Torr and the substrate was heated to about 300° C. An ALD cycle included the following steps. A ruthenium precursor gas was formed by passing a nitrogen carrier gas with a flow rate of about 500 sccm through an ampoule of (MeCp)(Py)Ru heated at a temperature of about 80° C. The substrate was exposed to the ruthenium precursor gas with a flow rate of about 500 sccm for about 3 seconds. The flow of the ruthenium precursor gas was stopped and a nitrogen purge gas with a flow rate of about 500 sccm was administered into the chamber during a purge step. The purge step was conducted for about 2 seconds. Thereafter, an ammonia gas with a flow rate of about 1,500 sccm was administered into the chamber after stopping the flow of the nitrogen gas. Subsequently, a plasma was ignited to form an ammonia plasma from the ammonia gas while maintaining the flow rate. The RF generator, having the power output set to about 300 watts at 13.56 MHz, produced the plasma for about 4 seconds during the plasma step. Thereafter, the flow of the ammonia gas and the plasma power were turned off. The chamber was exposed to a second purge step of nitrogen gas with a flow rate of about 500 sccm for about 2 seconds. The deposition process was stopped after the repetition of about 150 ALD cycles. A layer of ruthenium material was deposited on the substrate with a thickness of about 51 Å. The data from the experiment was analyzed to determine no existence of a nucleation delay and the average deposition rate was about 0.34 Å/cycle.

Experiment 7: (MeCp)(Py)Ru with intermediate N$_2$ plasma—During the experiment, the pressure within the process chamber was maintained at about 4 Torr and the substrate was heated to about 350° C. An ALD cycle included the following steps. A ruthenium precursor gas was formed by passing a nitrogen carrier gas with a flow rate of about 500 sccm through an ampoule of (MeCp)(Py)Ru heated at a temperature of about 80° C. The substrate was exposed to the ruthenium precursor gas with a flow rate of about 500 sccm for about 3 seconds. The flow of the ruthenium precursor gas was stopped and a nitrogen purge gas with a flow rate of about 500 sccm was administered into the chamber during a purge step. The purge step was conducted for about 2 seconds. Subsequently, a plasma was ignited to form a nitrogen plasma from the nitrogen gas while maintaining the flow rate. The RF generator, having the power output set to about 500 watts at 13.56 MHz, produced the plasma for about 4 seconds during the plasma step. Thereafter, the flow of the nitrogen gas and the plasma power were turned off. The chamber was exposed to a second purge step of nitrogen gas with a flow rate of about 500 sccm for about 2 seconds. The deposition process was stopped after the repetition of about 150 ALD cycles. A layer of ruthenium material was deposited on the substrate with a thickness of about 50 Å. The data from the experiment was analyzed to determine no existence of a nucleation delay and the average deposition rate was about 0.33 Å/cycle.

Experiment 8: (MeCp)(Py)Ru with intermediate H$_2$ plasma—During the experiment, the pressure within the process chamber was maintained at about 4 Torr and the substrate was heated to about 350° C. An ALD cycle included the following steps. A ruthenium precursor gas was formed by passing a nitrogen carrier gas with a flow rate of about 500 sccm through an ampoule of (MeCp)(Py)Ru heated at a temperature of about 80° C. The substrate was exposed to the ruthenium precursor gas with a flow rate of about 500 sccm for about 3 seconds. The flow of the ruthenium precursor gas was stopped and a nitrogen purge gas with a flow rate of about 500 sccm was administered into the chamber during a purge step. The purge step was conducted for about 2 seconds. Thereafter, a hydrogen gas with a flow rate of about 1,500 sccm was administered into the chamber after stopping the flow of the nitrogen gas. Subsequently, a plasma was ignited to form a hydrogen plasma from the hydrogen gas while maintaining the flow rate. The RF generator, having the power output set to about 500 watts at 13.56 MHz, produced the plasma for about 4 seconds during the plasma step. Thereafter, the flow of the hydrogen gas and the plasma power were turned off. The chamber was exposed to a second purge step of nitrogen gas with a flow rate of about 500 sccm for about 2 seconds. The deposition process was stopped after the repetition of about 150 ALD cycles. A layer of ruthenium material was deposited on the substrate with a thickness of about 48 Å. The data from the experiment was analyzed to determine no existence of a nucleation delay and the average deposition rate was about 0.32 Å/cycle.

Other ALD Process

Embodiments of the invention provide methods for depositing a variety of metal-containing materials (e.g., tantalum or tungsten containing materials) on a substrate by a thermal ALD process or a PE-ALD process by utilizing process chamber 50 or lid assembly 100. In one example, tantalum nitride is deposited by sequentially exposing a substrate to a tantalum precursor and a plasma during a PE-ALD process. In another example, tungsten nitride is deposited by sequentially exposing a substrate to a tungsten precursor and a plasma during a PE-ALD process. In other examples, metallic tantalum or metallic tungsten is deposited by sequentially exposing a substrate to a tantalum precursor or a tungsten precursor and a plasma during a PE-ALD process.

Tantalum precursors useful during vapor deposition processes as described herein include pentakis(dimethylamido) tantalum (PDMAT or Ta(NMe$_2$)$_5$), pentakis(ethylmethylamido) tantalum (PEMAT or Ta[N(Et)Me]$_5$), pentakis(diethylamido) tantalum (PDEAT or Ta(NEt$_2$)$_5$,), ethylimido-tris(dimethylamido) tantalum ((EtN)Ta(NMe$_2$)$_3$), ethylimido-tris(diethylamido) tantalum ((EtN)Ta(NEt$_2$)$_3$), ethylimido-tris(ethylmethylamido) tantalum ((EtN)Ta[N(Et)Me]$_3$), tertiarybutylimido-tris(dimethylamido) tantalum (TBTDMT or ($^t$BuN)Ta(NMe$_2$)$_3$), tertiarybutylimido-tris(diethylamido) tantalum (TBTDET or ($^t$BuN)Ta(NEt$_2$)$_3$), tertiarybutylimido-tris(ethylmethylamido) tantalum (TBTEAT or ($^t$BuN)Ta[N(Et)Me]$_3$), tertiaryamylimido-tris(dimethylamido) tantalum (TAIMATA or ($^t$AmylN)Ta(NMe$_2$)$_3$, wherein $^t$Amyl is the tertiaryamyl group (C$_5$H$_{11}$— or CH$_3$CH$_2$C(CH$_3$)$_2$—), tertiaryamylimido-tris(diethylamido) tantalum (TAIEATA or ($^t$AmylN)Ta(NEt$_2$)$_3$, tertiaryamylimido-tris(ethylmethylamido) tantalum (TAIMATA or ($^t$AmylN)Ta([N(Et)Me]$_3$), tantalum halides (e.g., TaF$_5$ or TaCl$_5$), derivatives thereof, or combinations thereof.

Tungsten precursors that may be useful during the vapor deposition processes as described herein include bis(tertiarybutylimido) bis(tertiarybutylamido) tungsten (($^t$BuN)$_2$W(N(H)$^t$Bu)$_2$), bis(tertiarybutylimido) bis(dimethylamido) tungsten (($^t$BuN)$_2$W(NMe$_2$)$_2$), bis(tertiarybutylimido) bis(diethylamido) tungsten (($^t$BuN)$_2$W(NEt$_2$)$_2$), bis(tertiarybutylimido) bis(ethylmethylamido) tungsten (($^t$BuN)$_2$ W(NEtMe)$_2$), tungsten hexafluoride, derivatives thereof, or combinations thereof.

Nitrogen precursors that may be useful for forming a metal-containing material during the vapor deposition processes as described herein include ammonia (NH$_3$), hydrazine (N$_2$H$_4$), methylhydrazine (Me(H)NNH$_2$), dimethyl hydrazine (Me$_2$NNH$_2$ or Me(H)NN(H)Me), tertiarybutylhydrazine ($^t$Bu(H)NNH$_2$), phenylhydrazine (C$_6$H$_5$(H)NNH$_2$), a nitrogen plasma source (e.g., N, N$_2$, N$_2$/H$_2$, NH$_3$, or a N$_2$H$_4$ plasma), 2,2'-azotertbutane ($^t$BuNN$^t$Bu), an azide source, such as ethyl azide (EtN$_3$), trimethylsilyl azide (Me$_3$SiN$_3$), derivatives thereof, plasmas thereof, or combinations thereof.

A suitable reagent for forming a metal-containing material may be a reducing gas and include hydrogen (e.g., H$_2$ or atomic-H), atomic-N, ammonia (NH$_3$), hydrazine (N$_2$H$_4$), silane (SiH$_4$), disilane (Si$_2$H$_6$), trisilane (Si$_3$H$_8$), tetrasilane (Si$_4$H$_{10}$), dimethylsilane (SiC$_2$H$_8$), methyl silane (SiCH$_6$), ethylsilane (SiC$_2$H$_8$), chlorosilane (ClSiH$_3$), dichlorosilane (Cl$_2$SiH$_2$), hexachlorodisilane (Si$_2$Cl$_6$), borane (BH$_3$), diborane (B$_2$H$_6$), triborane, tetraborane, pentaborane, triethylborane (Et$_3$B), derivatives thereof, plasmas thereof, or combinations thereof.

A carrier gas, a purge gas and a process gas may contain nitrogen, hydrogen, ammonia, argon, neon, helium, or combinations thereof. A plasma may be ignited containing any of these gases. Preferably, a plasma precursor gas that may be useful for forming a metal-containing material during the vapor deposition processes as described herein include nitrogen, hydrogen, ammonia, argon or combinations thereof. In one example, a plasma contains nitrogen and hydrogen. In another example, a plasma contains nitrogen and ammonia. In another example, a plasma contains ammonia and hydrogen.

Metal-containing materials that may be formed during thermal ALD or PE-ALD processes as described herein include tantalum, tantalum nitride, tungsten, tungsten nitride, titanium, titanium nitride, alloys thereof, derivatives thereof or combinations thereof. In one embodiment, a metal-containing material may be formed during a PE-ALD process containing a constant flow of a reagent gas while providing sequential pulses of a metal precursor and a plasma. In another embodiment, a metal-containing material may be formed during another PE-ALD process that provides sequential pulses of a metal precursor and a reagent plasma. In both of these embodiments, the reagent is generally ionized during the process. Also, the PE-ALD process provides that the plasma may be generated external from the process chamber, such as by a remote plasma generator (RPS) system, or preferably, the plasma may be generated in situ a plasma capable ALD process chamber. During PE-ALD processes, a plasma may be generated from a microwave (MW) frequency generator or a radio frequency (RF) generator. For example, a plasma may be ignited within process chamber 50 or with lid assembly 100. In a preferred example, an in situ plasma is generated by a RF generator. In another embodiment, a metal-containing material may be formed during a thermal ALD process that provides sequential pulses of a metal precursor and a reagent.

The ALD process provides that the process chamber may be pressurized at a pressure within a range from about 0.1 Torr to about 80 Torr, preferably from about 0.5 Torr to about 10 Torr, and more preferably, from about 1 to about 5. Also, the chamber or the substrate may be heated to a temperature of less than about 500° C., preferably within a range from about 100° C. to about 450° C., and more preferably, from about 150° C. to about 400° C., for example, about 300° C. During PE-ALD processes, a plasma is ignited within the process chamber for an in situ plasma process, or alternative, may be formed by an external source, such as a remote plasma generator (RPS) system. A plasma may be generated a MW generator, but preferably by a RF generator. For example, a plasma may be ignited within process chamber 50 or with lid assembly 100. The RF generator may be set at a frequency within a range from about 100 KHz to about 1.6 MHz. In one example, a RF generator, with a frequency of 13.56 MHz, may be set to have a power output within a range from about 100 watts to about 1,000 watts, preferably, from about 250 watts to about 600 watts, and more preferably, from about 300 watts to about 500 watts. In one example, a RF generator, with a frequency of 400 KHz, may be set to have a power output within a range from about 200 watts to about 2,000 watts, preferably, from about 500 watts to about 1,500 watts. A surface of substrate may be exposed to a plasma having a power per surface area value within a range from about 0.01 watts/cm$^2$ to about 10.0 watts/cm$^2$, preferably, from about 0.05 watts/cm$^2$ to about 6.0 watts/cm$^2$.

The substrate may be for example, a silicon substrate having an interconnect pattern defined in one or more dielectric material layers formed thereon. In example, the substrate contains a barrier layer thereon, while in another example, the substrate contains a dielectric surface. The process chamber conditions such as, the temperature and pressure, are adjusted to enhance the adsorption of the process gases on the substrate so as to facilitate the reaction of the pyrrolyl metal precursors and the reagent gas.

In one embodiment, the substrate may be exposed to a reagent gas throughout the whole ALD cycle. The substrate may be exposed to a metal precursor gas formed by passing a carrier gas (e.g., nitrogen or argon) through an ampoule of a metal precursor. The ampoule may be heated depending on the metal precursor used during the process. In one example, an ampoule containing (MeCp)(Py)Ru may be heated to a temperature within a range from about 60° C. to about 100° C., such as 80° C. The metal precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The metal precursor gas and the reagent gas may be combined to form a deposition gas. A reagent gas usually has a flow rate within a range from about 100 sccm to about 3,000 sccm, preferably, from about 200 sccm to about 2,000 sccm, and more preferably, from about 500 sccm to about 1,500 sccm. In one example, ammonia is used as a reagent gas with a flow rate of about 1,500 sccm. The substrate may be exposed to the metal precursor gas or the deposition gas containing the metal precursor and the reagent gas for a time period within a range from about 0.1 seconds to about 8 seconds, preferably, from about 1 second to about 5 seconds, and more preferably, from about 2 seconds to about 4 seconds. The flow of the metal precursor gas may be stopped once the metal precursor is adsorbed on the substrate. The metal precursor may be a discontinuous layer, continuous layer or even multiple layers.

The substrate and chamber may be exposed to a purge step after stopping the flow of the metal precursor gas. The flow rate of the reagent gas may be maintained or adjusted from the previous step during the purge step. Preferably, the flow of the reagent gas is maintained from the previous step. Optionally, a purge gas may be administered into the process chamber with a flow rate within a range from about 100 sccm to about 2,000 sccm, preferably, from about 200 sccm to about 1,000 sccm, and more preferably, from about 300 sccm to about 700 sccm, for example, about 500 sccm. The purge step removes any excess metal precursor and other contaminants within the process chamber. The purge step may be conducted for a time period within a range from about 0.1 seconds to about 8 seconds, preferably, from about 1 second to about 5 seconds, and more preferably, from about 2 seconds to about 4 seconds. The carrier gas, the purge gas and the process gas may contain nitrogen, hydrogen, ammonia, argon, neon, helium, or combinations thereof. In a preferred embodiment, the carrier gas contains nitrogen.

Thereafter, the flow of the reagent gas may be maintained or adjusted before igniting a plasma. The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power was turned off. In one example, the reagent may be ammonia, nitrogen, hydrogen or a combination thereof to form an ammonia plasma, a nitrogen plasma, a hydrogen plasma or a combined plasma. The reactant plasma reacts with the adsorbed metal precursor on the substrate to form a metal-containing material thereon. In one example, the reactant plasma is used as a reductant to form metallic ruthenium, tantalum, tungsten, titanium or alloys thereof. However, a variety of reactants may be used to form metal-containing materials having a wide range of compositions. In one example, a boron-containing reactant compound (e.g., diborane) is used to form a metal-containing material containing boride. In another example, a silicon-containing reactant compound (e.g., silane) is used to form a metal-containing material containing silicide.

The process chamber was exposed to a second purge step to remove excess precursors or contaminants from the previous step. The flow rate of the reagent gas may be maintained or adjusted from the previous step during the purge step. An optional purge gas may be administered into the process chamber with a flow rate within a range from about 100 sccm to about 2,000 sccm, preferably, from about 200 sccm to about 1,000 sccm, and more preferably, from about 300 sccm to about 700 sccm, for example, about 500 sccm. The second purge step may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the metal-containing material is deposited on the substrate. The metal-containing material may be deposited with a thickness less than 1,000 Å, preferably less than 500 Å and more preferably from about 10 Å to about 100 Å, for example, about 30 Å. The processes as described herein may deposit a metal-containing material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the metal-containing materials.

In another embodiment, a metal-containing material may be formed during another PE-ALD process that provides sequentially exposing the substrate to pulses of a metal precursor and an active reagent, such as a reagent plasma. The substrate may be exposed to a metal precursor gas formed by passing a carrier gas through an ampoule containing a metal precursor, as described herein. The metal precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The substrate may be exposed to the deposition gas containing the metal precursor and the reagent gas for a time period within a range from about 0.1 seconds to about 8 seconds, preferably, from about 1 second to about 5 seconds, and more preferably from about 2 seconds to about 4 seconds. The flow of the metal precursor gas may be stopped once the metal precursor is adsorbed on the substrate. The metal precursor may be a discontinuous layer, continuous layer or even multiple layers.

Subsequently, the substrate and chamber are exposed to a purge step. A purge gas may be administered into the process chamber during the purge step. In one aspect, the purge gas is the reagent gas, such as ammonia, nitrogen or hydrogen. In another aspect, the purge gas may be a different gas than the reagent gas. For example, the reagent gas may be ammonia and the purge gas may be nitrogen, hydrogen or argon. The purge gas may have a flow rate within a range from about 100 sccm to about 2,000 sccm, preferably, from about 200 sccm to about 1,000 sccm, and more preferably, from about 300 sccm to about 700 sccm, for example, about 500 sccm. The purge step removes any excess metal precursor and other contaminants within the process chamber. The purge step may be conducted for a time period within a range from about 0.1 seconds to about 8 seconds, preferably, from about 1 second to about 5 seconds, and more preferably, from about 2 seconds to about 4 seconds. A carrier gas, a purge gas and a process gas may contain nitrogen, hydrogen, ammonia, argon, neon, helium or combinations thereof.

The substrate and the adsorbed metal precursor thereon may be exposed to the reagent gas during the next step of the ALD process. Optionally, a carrier gas may be administered at the same time as the reagent gas into the process chamber. The reagent gas may be ignited to form a plasma. The reagent gas usually has a flow rate within a range from about 100 sccm to about 3,000 sccm, preferably, from about 200 sccm to about 2,000 sccm, and more preferably, from about 500 sccm to about 1,500 sccm. In one example, ammonia is used as a reagent gas with a flow rate of about 1,500 sccm. The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power may be turned off. In one example, the reagent may be ammonia, nitrogen, hydrogen or combinations thereof, while the plasma may be an ammonia plasma, a nitrogen plasma, a hydrogen plasma or a combination thereof. The reactant plasma reacts with the adsorbed metal precursor on the substrate to form a metal-containing material thereon. Preferably, the reactant plasma is used as a reductant to form metallic ruthenium, tantalum, tungsten, titanium or alloys thereof. However, a variety of reactants may be used to form metal-containing materials having a wide range of compositions, as described herein.

The process chamber may be exposed to a second purge step to remove excess precursors or contaminants from the process chamber. The flow of the reagent gas may have been stopped at the end of the previous step and started during the purge step, if the reagent gas is used as a purge gas. Alternative, a purge gas that is different than the reagent gas may be administered into the process chamber. The reagent gas or purge gas may have a flow rate within a range from about 100 sccm to about 2,000 sccm, preferably, from about 200 sccm to about 1,000 sccm, and more preferably, from about 300 sccm to about 700 sccm, for example, about 500 sccm. The second purge step may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the metal-containing material is deposited on the substrate. The metal-containing material may be deposited with a thickness less than 1,000 Å, preferably less than 500 Å and more preferably from about 10 Å to about 100 Å, for example, about 30 Å. The processes as described herein may deposit a metal-containing material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the metal-containing materials.

The time interval for the pulse of the metal precursor is variable depending upon a number of factors such as, for example, the volume capacity of the process chamber employed, the vacuum system coupled thereto and the volatility/reactivity of the reactants used during the ALD process. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the metal precursor provides a sufficient amount of precursor so that at least a monolayer of the metal precursor is adsorbed on the substrate. Thereafter, excess metal precursor remaining in the chamber may be removed from the process chamber by the constant carrier gas stream in combination with the vacuum system.

The time interval for each of the pulses of the metal precursor and the reagent gas may have the same duration. That is, the duration of the pulse of the metal precursor may be identical to the duration of the pulse of the reagent gas. For such an embodiment, a time interval ($T_1$) for the pulse of the metal precursor is equal to a time interval ($T_2$) for the pulse of the reagent gas.

Alternatively, the time interval for each of the pulses of the metal precursor and the reagent gas may have different durations. That is, the duration of the pulse of the metal precursor may be shorter or longer than the duration of the pulse of the reagent gas. For such an embodiment, a time interval ($T_1$) for the pulse of the metal precursor is different than the time interval ($T_2$) for the pulse of the reagent gas.

In addition, the periods of non-pulsing between each of the pulses of the metal precursor and the reagent gas may have the same duration. That is, the duration of the period of non-pulsing between each pulse of the metal precursor and each pulse of the reagent gas is identical. For such an embodiment, a time interval ($T_3$) of non-pulsing between the pulse of the metal precursor and the pulse of the reagent gas is equal to a time interval ($T_4$) of non-pulsing between the pulse of the reagent gas and the pulse of the metal precursor. During the time periods of non-pulsing only the constant carrier gas stream is provided to the process chamber.

Alternatively, the periods of non-pulsing between each of the pulses of the metal precursor and the reagent gas may have different duration. That is, the duration of the period of non-pulsing between each pulse of the metal precursor and each pulse of the reagent gas may be shorter or longer than the duration of the period of non-pulsing between each pulse of the reagent gas and the metal precursor. For such an embodiment, a time interval ($T_3$) of non-pulsing between the pulse of the metal precursor and the pulse of the reagent gas is different from a time interval ($T_4$) of non-pulsing between the pulse of the reagent gas and the pulse of metal precursor. During the time periods of non-pulsing only the constant carrier gas stream is provided to the process chamber.

Additionally, the time intervals for each pulse of the metal precursor, the reagent gas and the periods of non-pulsing therebetween for each deposition cycle may have the same duration. For such an embodiment, a time interval ($T_1$) for the metal precursor, a time interval ($T_2$) for the reagent gas, a time interval ($T_3$) of non-pulsing between the pulse of the metal precursor and the pulse of the reagent gas and a time interval ($T_4$) of non-pulsing between the pulse of the reagent gas and the pulse of the metal precursor each have the same value for each deposition cycle. For example, in a first deposition cycle ($C_1$), a time interval ($T_1$) for the pulse of the metal precursor has the same duration as the time interval ($T_1$) for the pulse of the metal precursor in subsequent deposition cycles ($C_2 \ldots C_n$). Similarly, the duration of each pulse of the reagent gas and the periods of non-pulsing between the pulse of the metal precursor and the reagent gas in the first deposition cycle ($C_1$) is the same as the duration of each pulse of the reagent gas and the periods of non-pulsing between the pulse of the metal precursor and the reagent gas in subsequent deposition cycles ($C_2 \ldots C_n$), respectively.

Alternatively, the time intervals for at least one pulse of the metal precursor, the reagent gas and the periods of non-pulsing therebetween for one or more of the deposition cycles of the metal-containing material deposition process may have different durations. For such an embodiment, one or more of the time intervals ($T_1$) for the pulses of the metal precursor, the time intervals ($T_2$) for the pulses of the reagent gas, the time intervals ($T_3$) of non-pulsing between the pulse of the metal precursor and the reagent gas and the time intervals ($T_4$) of non-pulsing between the pulses of the reagent gas and the metal precursor may have different values for one or more deposition cycles of the cyclical deposition process. For example, in a first deposition cycle ($C_1$), the time interval ($T_1$) for the pulse of the metal precursor may be longer or shorter than one or more time interval ($T_1$) for the pulse of the metal precursor in subsequent deposition cycles ($C_2 \ldots C_n$). Similarly, the durations of the pulses of the reagent gas and the periods of non-pulsing between the pulse of the metal precursor and the reagent gas in the first deposition cycle ($C_1$) may be the same or different than the duration of each pulse of the reagent gas and the periods of non-pulsing between the pulse of the metal precursor and the reagent gas in subsequent deposition cycles ($C_2 \ldots C_n$).

In some embodiments, a constant flow of a carrier gas or a purge gas may be provided to the process chamber modulated by alternating periods of pulsing and non-pulsing where the periods of pulsing alternate between the metal precursor and the reagent gas along with the carrier/purge gas stream, while the periods of non-pulsing include only the carrier/purge gas stream.

While foregoing is directed to the preferred embodiment of the invention, other and further embodiments of the invention may be devised without departing from the basic scope thereof, and the scope thereof is determined by the claims that follow.

The invention claimed is:

1. A lid assembly for conducting a vapor deposition process within a process chamber, comprising:

a plasma screen having an upper surface with an inner region and an outer region, and an outer trough formed in the upper surface, the outer trough encompassing an inner region; and an insulation cap positioned above the upper surface of the plasma screen and having a first channel configured to flow a first process gas therethrough and a second channel configured to flow a second process gas, the plasma screen and the insulation cap are coupled together to form an annular gas channel therebetween, the annular gas channel extending between a portion of the outer trough and a groove formed in a lower surface of the insulation cap and encompassing the inner region, and the second channel extending through the insulation cap to the groove within the lower surface of the insulation cap;

wherein a first plurality of openings extend through the inner region of the plasma screen and direct the first process gas from above the upper surface of the plasma screen to below a lower surface of the plasma screen; and wherein a second plurality of openings extend radially outward from the annular gas channel to horizontally flow the second process gas from the annular gas channel, and the second plurality of openings are defined by the lower surface of the insulation cap and a plurality of radially extending slots traverse the upper surface of the plasma screen in the outer region of the plasma screen.

2. The lid assembly of claim 1, wherein the plurality of radially extending slots is parallel or substantially parallel to the lower surface.

3. The lid assembly of claim 2, wherein the plurality of radially extending slots is perpendicular or substantially perpendicular to a plurality of holes within the inner region of the plasma screen.

4. The lid assembly of claim 1, wherein each slot of the plurality of radially extending slots has a width within a range from about 0.20 mm to about 0.80 mm.

5. The lid assembly of claim 4, wherein the plurality of radially extending slots comprises about 10 slots or more.

6. The lid assembly of claim 5, wherein the plurality of radially extending slots comprises about 36 slots or more.

* * * * *